(12) United States Patent
Burgener et al.

(10) Patent No.: US 10,790,796 B2
(45) Date of Patent: *Sep. 29, 2020

(54) METHOD, SYSTEM, AND APPARATUS FOR RESONATOR CIRCUITS AND MODULATING RESONATORS

(71) Applicant: pSemi Corporation, San Diego, CA (US)

(72) Inventors: Mark L. Burgener, San Diego, CA (US); James S. Cable, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,409

(22) Filed: Jun. 26, 2019

(65) Prior Publication Data

US 2019/0393853 A1 Dec. 26, 2019

Related U.S. Application Data

(60) Continuation of application No. 15/607,388, filed on May 26, 2017, now Pat. No. 10,355,663, which is a
(Continued)

(51) Int. Cl.
*H03H 9/54* (2006.01)
*H01P 1/10* (2006.01)
(Continued)

(52) U.S. Cl.
CPC ............ *H03H 9/0009* (2013.01); *H01Q 1/50* (2013.01); *H03H 7/38* (2013.01); *H03H 7/40* (2013.01);
(Continued)

(58) Field of Classification Search
CPC .. H03H 9/54; H03H 9/64; H03H 9/70; H03H 9/72; H01P 1/10
See application file for complete search history.

(56) References Cited

U.S. PATENT DOCUMENTS 4,246,554 A 1/1981 Swanson et al.
5,216,392 A 6/1993 Fraser et al.
(Continued)

FOREIGN PATENT DOCUMENTS

EP 2922202 9/2015
EP 2922203 9/2015
(Continued)

OTHER PUBLICATIONS

Takaoka, Dean O., Office Action received from the USPTO dated Apr. 24, 2018 for U.S. Appl. No. 15/607,388, 12 pgs.
(Continued)

*Primary Examiner* — Dean O Takaoka
(74) *Attorney, Agent, or Firm* — Jaquez Land Greenhaus LLP; Alessandro Steinfl, Esq.

(57) ABSTRACT

Embodiments of resonator circuits and modulating resonators and are described generally herein. One or more acoustic wave resonators may be coupled in series or parallel to generate tunable filters. One or more acoustic wave resonances may be modulated by one or more capacitors or tunable capacitors. One or more acoustic wave modules may also be switchable in a filter. Other embodiments may be described and claimed.

10 Claims, 68 Drawing Sheets

Related U.S. Application Data continuation of application No. 15/046,363, filed on Feb. 17, 2016, now Pat. No. 9,698,752, which is a division of application No. 14/214,119, filed on Mar. 14, 2014, now Pat. No. 9,300,038, which is a continuation-in-part of application No. 13/316,243, filed on Dec. 9, 2011, now Pat. No. 9,041,484.

(60) Provisional application No. 61/801,699, filed on Mar. 15, 2013, provisional application No. 61/422,009, filed on Dec. 10, 2010, provisional application No. 61/438,204, filed on Jan. 31, 2011, provisional application No. 61/497,819, filed on Jun. 16, 2011, provisional application No. 61/521,590, filed on Aug. 9, 2011, provisional application No. 61/542,783, filed on Oct. 3, 2011, provisional application No. 61/565,413, filed on Nov. 30, 2011.

(51) Int. Cl.
*H03H 9/00* (2006.01)
*H01Q 1/50* (2006.01)
*H03H 7/38* (2006.01)
*H03H 7/48* (2006.01)
*H03H 9/64* (2006.01)
*H03H 9/70* (2006.01)
*H03H 9/72* (2006.01)
*H03H 7/40* (2006.01)
*H03H 9/02* (2006.01)

(52) U.S. Cl.
CPC ............ *H03H 7/48* (2013.01); *H03H 9/0014* (2013.01); *H03H 9/542* (2013.01); *H03H 9/547* (2013.01); *H03H 9/6403* (2013.01); *H03H 9/6483* (2013.01); *H03H 9/6489* (2013.01); *H03H 9/706* (2013.01); *H03H 9/725* (2013.01); *H03H 2009/02204* (2013.01); *H03H 2210/015* (2013.01); *H03H 2210/025* (2013.01); *H03H 2210/036* (2013.01); *H03H 2210/04* (2013.01); *H03H 2240/00* (2013.01); *H03H 2250/00* (2013.01); *H03J 2200/10* (2013.01)

(56) References Cited

U.S. PATENT DOCUMENTS

| | | | |
|---|---|---|---|
| 6,018,281 A | 1/2000 | Yutaka et al. | |
| 6,204,737 B1 | 3/2001 | Ella | |
| 6,653,913 B2 | 11/2003 | Klee et al. | |
| 7,135,940 B2 | 11/2006 | Kawakubo et al. | |
| 7,319,371 B2 | 1/2008 | Ten Dolle et al. | |
| 7,372,346 B2 | 5/2008 | Tilmans et al. | |
| 7,459,990 B2 | 12/2008 | Wunnicke et al. | |
| 7,492,242 B2 | 2/2009 | Carpentier | |
| 7,825,715 B1 | 11/2010 | Greenberg | |
| 8,026,776 B2 | 9/2011 | Ueda et al. | |
| 8,310,321 B2 | 11/2012 | Kadota | |
| 8,552,818 B2 | 10/2013 | Kadota et al. | |
| 9,041,484 B2 * | 5/2015 | Burgener ............... | H03H 9/542 333/101 |
| 9,300,038 B2 | 3/2016 | Burgener et al. | |
| 9,660,611 B2 | 5/2017 | Burgener et al. | |
| 9,698,752 B2 | 7/2017 | Burgener et al. | |
| 10,355,663 B2 | 7/2019 | Burgener et al. | |
| 2002/0093394 A1 | 7/2002 | Tikka et al. | |
| 2004/0130411 A1 | 7/2004 | Beaudin et al. | |
| 2004/0212448 A1 | 10/2004 | Kolsrud | |
| 2004/0227578 A1 | 11/2004 | Hamalainen | |
| 2005/0093652 A1 | 5/2005 | Ma et al. | |
| 2005/0206464 A1 | 9/2005 | McCorquodale et al. | |
| 2005/0212612 A1 | 9/2005 | Kawakubo et al. | |
| 2005/0280476 A1 | 12/2005 | Abe et al. | |
| 2007/0205849 A1 | 9/2007 | Otis | |
| 2007/0296513 A1 | 12/2007 | Ruile et al. | |
| 2009/0039981 A1 | 2/2009 | Ito et al. | |
| 2009/0201104 A1 | 8/2009 | Ueda et al. | |
| 2010/0283555 A1 | 11/2010 | Tanaka et al. | |
| 2010/0291946 A1 | 11/2010 | Yamakawa et al. | |
| 2011/0199168 A1 | 8/2011 | Kadota | |
| 2012/0112850 A1 | 5/2012 | Kim et al. | |
| 2012/0313731 A1 | 12/2012 | Burgener et al. | |
| 2014/0340173 A1 | 11/2014 | Burgener et al. | |
| 2015/0333401 A1 | 11/2015 | Maruthamuthu et al. | |
| 2016/0020750 A1 | 1/2016 | Burgener et al. | |
| 2016/0065165 A1 | 3/2016 | Kadota | |
| 2016/0094199 A1 | 3/2016 | David et al. | |
| 2016/0149556 A1 | 5/2016 | Kando | |
| 2016/0173057 A1 | 6/2016 | Burgener et al. | |
| 2018/0006628 A1 | 1/2018 | Burgener et al. | |
| 2018/0123563 A1 | 5/2018 | Burgener et al. | |

FOREIGN PATENT DOCUMENTS

| | | |
|---|---|---|
| EP | 2922204 | 9/2015 |
| EP | 2649728 | 10/2015 |
| EP | 2843835 | 7/2016 |
| EP | 2843834 | 10/2016 |
| GB | 1510755 | 5/1978 |
| JP | 2000-77972 | 3/2000 |
| JP | 2009130831 | 6/2009 |
| JP | 6000969 | 9/2016 |
| WO | 2010058570 | 5/2010 |
| WO | 2012079038 | 1/2012 |
| WO | 2015128003 | 9/2015 |

OTHER PUBLICATIONS

Takaoka, Dean O., Office Action received from the USPTO dated Oct. 4, 2018 for U.S. Appl. No. 15/607,388, 11 pgs.

Takaoka, Dean O., Notice of Allowance received from the USPTO dated Feb. 21, 2019 for U.S. Appl. No. 15/607,388, 12 pgs.

PSEMI Corporation, Response filed in the USPTO dated Dec. 31, 2018 for U.S. Appl. No. 15/607,388, 9 pgs.

PSEMI Corporation, Response filed in the USPTO dated Jun. 28, 2018 for U.S. Appl. No. 15/607,388, 10 pgs.

PSEMI Corporation, Amendment After Allowance filed in the USPTO dated May 21, 2019 for U.S. Appl. No. 15/607,388, 8 pgs.

Takaoka, Dean O., Office Action received from the USPTO dated Oct. 5, 2016 for U.S. Appl. No. 15/046,363, 15 pgs.

Takaoka, Dean O., Notice of Allowance received from the USPTO dated May 10, 2017 for U.S. Appl. No. 15/046,363, 16 pgs.

Burgener, et al., Response filed in the Uspto dated Dec. 2, 2016 for U.S. Appl. No. 15/046,363, 7 pgs.

Itoh, Tadashige, et al., English Translation of Office Action received from the JPO dated Dec. 5, 2017 for appln. No. 2016-169006, 6 pgs.

Maget, Judith, Communication pursuant to Article 94(3) EPC received from the EPO dated Sep. 26, 2018 for appln. No. 15001027.0, 6 pgs.

Maget, Judith, Communication pursuant to Article 94(3) EPC received from the EPO dated Sep. 26, 2018 for appln. No. 15001028.8, 7 pgs.

Maget, Judith, Communication pursuant to Article 94(3) EPC received from the EPO dated Sep. 27, 2018 for appln. No. 15001026.2, 6 pgs.

Hashimoto, Kazushi, English translation of Office Action received from the JPO dated Jan. 5, 2016 for appln. No. 2013-543393, 3 pgs.

Neiller, Andrea, Communication under Rule 71(3) EPC received from the EPO dated Feb. 5, 2016 for appln. No. 14003071.9, 226 pgs.

Naumann, Olaf, Communication under Rule 71(3) received from the EPO dated Feb. 9, 2016 for appln. No. 14003070.1, 226 pgs.

Takaoka, Dean O., Notice of Allowance received from the USPTO dated Feb. 11, 2016 for U.S. Appl. No. 14/214,119, 11 pgs.

Burgener, et al., Comments on Examiner's Statement of Reasons for Allowance filed in the USPTO dated Feb. 15, 2016 for U.S. Appl. No. 14/214,119, 4 pgs.

(56) References Cited

OTHER PUBLICATIONS

Peregrine Semiconductor Corporation, Response filed in the EPO dated Mar. 11, 2016 for appln. No. 14003070.1, 8 pgs.
Peregrine Semiconductor Corporation, Response filed in the EPO dated Mar. 14, 2016 for appln. No. 15001027.0, 16 pgs.
Peregrine Semiconductor Corporation, Response filed in the EPO dated Mar. 14, 2016 for appln. No. 15001028.8, 14 pgs.
Peregrine Semiconductor Corporation, Response filed in the EPO dated Mar. 14, 2016 for appln. No. 15001026.2, 13 pgs.
Peregrine Semiconductor Corporation, English translation of Response filed in the JPO dated Apr. 4, 2016 for appln. No. 2013-543393, 22 pgs.
Naumann, Olaf, Communication under Rule 71(3) received from the EPO dated Apr. 7, 2016 for appln. No. 14003070.1, 226 pgs.
Takaoka, Dean O., Office Action received from the USPTO dated Jan. 23, 2015 for U.S. Appl. No. 14/214,119, 26 pgs.
Takaoka, Dean O., Final Office Action received from the USPTO dated Jun. 5, 2015 for U.S. Appl. No. 14/214,119, 21 pgs.
Takaoka, Dean O., Notice of Allowance received from the USPTO dated Sep. 18, 2015 for U.S. Appl. No. 14/214,119, 19 pgs.
Takaoka, Dean O., Response to Rule 312 Communication received from the USPTO dated Oct. 19, 2015 for U.S. Appl. No. 14/214,119, 2 pgs.
Burgener, et al., Amendment filed in the USPTO dated Mar. 19, 2015 for U.S. Appl. No. 14/214,119, 14 pgs.
Burgener, et al., Amendment After Final Office Action filed in the USPTO dated Sep. 4, 2015 for U.S. Appl. No. 14/214,119, 9 pgs.
Burgener, et al., Amendment Responsive to Notice to File Corrected Application Papers filed in the USPTO dated Oct. 9, 2015 for U.S. Appl. No. 14/214,119, 3 pgs.
Takaoka, Dean O., Office Action received from the USPTO dated Jul. 14, 2016 for U.S. Appl. No. 14/720,613, 51 pgs.
Burgener, et al., Response filed in the USPTO dated Oct. 13, 2016 for U.S. Appl. No. 14/720,613, 19 pgs.
Takaoka, Dean O., Notice of Allowance received from the USPTO dated Mar. 2, 2017 for U.S. Appl. No. 14/720,613, 15 pgs.
Takaoka, Dean O., Notice to File Corrected Application Papers received from the USPTO dated Oct. 7, 2015 for U.S. Appl. No. 14/214,119, 3 pgs.
Maget, J., Decision to grant a European patent pursuant to Article 97(1) EPC (to publish on Oct. 14, 2015 as Patent No. 2649728) received from the EPO dated Sep. 17, 2015 for appln. No. 11802617.8, 3 pgs.
Michl, Amela, Communication under Rule 71(3) EPC received from the EP dated Apr. 29, 2015 for appln. No. 11802617.8, 120 pgs.
European Patent Office, Communication pursuant to Rule 69 EPC received from the EPO dated May 6, 2015 for appln. No. 14003070.1, 2 pgs.
Maget, Judith, Communication pursuant to Article 94(3) EPC received from the EPO dated Feb. 23, 2015 for appln. No. 11802617.8, 9 pgs.
Zhou, Jiafeng, "Chapter 6 Microwave Filters", Microwave and Millimeter Wave Technologies from Photonic Bandgap Devices to Antenna and Applications, Mar. 2010, pp. 133-158.
Peregrine Semiconductor Corporation, Response filed in the EPO dated Oct. 22, 2015 for appln. No. 14003070.1, 112 pages.
Peregrine Semiconductor Corporation, Response filed in the EPO dated Sep. 3, 2014 for appln. No. 11802617.8, 66 pgs.
Peregrine Semiconductor Corporation, Response filed in the EPO dated Sep. 4, 2015 for appln. No. 14003071.9, 109 pgs.
Maget, Judith, Extended Search Report received from the EPO dated Jun. 22, 2015 for appln. No. 15001028.8, 13 pgs.
Maget, Judith, Extended Search Report received from the EPO dated Jun. 22, 2015 for appl. No. 15001026.2, 9 pgs.
Maget, Judith, Extended Search Report received from the EPO dated Jun. 19, 2015 for appln. No. 15001027.0, 17 pgs.
Peregrine Semiconductor Corporation, Response filed in the EPO on May 8, 2015 for appln. No. 15001027.0, 7 pgs.
Peregrine Semiconductor Corporation, Response filed in the EPO on May 8, 2015 for appln. No. 15001028.8, 5 pgs.
Peregrine Semiconductor Corporation, Response filed in the EPO on May 8, 2015 for appln. No. 15001026.2, 7 pgs.
Maget, Judith, Extended Search Report received from the EPO dated Feb. 3, 2015 for appln. No. 14003071.9, 5 pgs.
Maget, Judith, Extended Search Report received from the EPO dated Mar. 26, 2015 for appln. No. 14003070.1, 7 pgs.
Peregrine Semiconductor Corporation, Response filed in the EPO dated Mar. 19, 2015 for appln. No. 11802617.8, 5 pgs.
Takaoka, Dean O., Notice of Allowance received from the USPTO dated Jan. 21, 2015 for U.S. Appl. No. 13/316,243, 15 pgs.
Takaoka, Dean O., Office Action received from the USPTO dated Apr. 2, 2014 for appln. No. 13/316,243, 67 pgs.
Burgener, et al., Response filed in the USPTO dated Jul. 2, 2014 for U.S. Appl. No. 13/316,243, 42 pgs.
Peregrine Semiconductor Cororation, Response filed in the EPO dated Jan. 17, 2014 for related appln. No. 11 802 617.8, 27 pgs.
Maget, Judith, Communication pursuant to Article 94(3) EPC dated 6/26/14 for related appln. No. 11802617.8, 3 pgs.
Maget, Judith, Extended Search Report received from the EPO dated Mar. 24, 2015 for appln. No. 14003071.9, 5 pgs.
Gaur, Claudia, International Search Report received from the EPO dated Aug. 13, 2012 for related appln. No. PCT/US2011/064266, 23 pgs.
Maget, Judith, Written Opinion of the International Search Authority received from the EPO dated Aug. 13, 2012 for related appln. No. PCT/US2011/064266, 42 pgs.
Komatsu, et al, "Tunable Radio-Frequency Filters Using Acoustic Wave Resonators and Variable Capacitors", Japanese Journal of Applied Physics, vol. 49, Jul. 1, 2010, 4 pgs.
Razafimandimby, Stephane, "A Novel Architecture of a Tunable Bandpass BAW-filter for a WCDMA Transceiver", Analog Integrated Circuits and Signal Processing, vol. 49, No. 3, Sep. 14, 2006, 11 pgs.
Aliouane, et al., "RF-MEMS Switchable Inductors for Tunable Bandwidth BAW Filters", 2010 International Conference on Design & Technology of Integrated Systems in Nanoscale Era, Mar. 23, 2010, 6 pgs.
Hikata, et al., "Investigation of Attenuation Increase at Lower-Side Frequency Bands for Highly-Integrated SAW Modules", IEE Electronics Letters, vol. 42, No. 25, Dec. 7, 2006, pp. 1488-1489.
Komatsu, et al., "Design of Narrow Bandwidth Ladder-Type Filters with Sharp Transition Bands Using Mutually Connected Resonator Elements", IEEE Ultrasonics Symposium, Nov. 2, 2008, pp. 1576-1579.
Flatscher, et al., "A Buld Acoustic Wave (BAW) Based Transceiver for an In-Tire-Pressure Monitoring Sensor Node", IEEE Journal of Solid-State Circuits, vol. 45, No. 1, Jan. 2010.
Petit, et al., "Temperature Compensated BAW Resonator and its Integrated Thermistor for a 2.5GHz Electrical Thermally Compensated Oscillator" IEEE Radio Frequency Integrated Circuits Symposium, Jun. 2009, pp. 339-342.
Rai, et al. "A Digitally Compensated 1.5 GHz CMOS/FBAR Frequency Reference", IEEE Transaction on Ultrasonics Ferroelectrics and Frquency Control, vol. 57, No. 3, Mar. 2010, pp. 552-561.
Penunuri, et al., "A Tunable SAW Duplexer", IEEE Ultrasonics Symposium, vol. 1, Oct. 2000, pp. 361-366.
Nishihara, et al., "BAW/SAW/IPD Hybrid Type Duplexer with Rx Balanced Output for WCDMA Band I", IEEE Microwave Symposium Digest, Jun. 2008, pp. 831-834.
Menendez, et al, "Closed-Form Expression for the Design of Ladder-Type FBAR Filters", IEEE Microwave and Wireless Components Letters, vol. 16, No. 12, Dec. 2006.
European Patent Office, Communication pursuant to Rules 161(1) and 162 EPC received from the EPO dated Aug. 2, 2013 for related appln. No. 11802617.8-1810, 2 pgs.
Ghilini, Marie, Invitation to Pay Additional Fees, and, Where Applicable, Protest Fee and Partial Search Report received from the European Patent Office dated Apr. 16, 2012 for related appln. No. PCT/US2011/064266, 13 pgs.

(56) References Cited

OTHER PUBLICATIONS

Kim, J.J., et al. "Wideband CMOS Voltage-Controlled Oscillator using Tunable Inductors", Electronics Letters, vol. 46, No. 20, Sep. 30, 2010, 2 pgs.
Brown, Elliott R., "RF-MEMS Switches for Reconfigurable Integrated Circuits", IEEE Transactions on Microwave Theory and Techniques, vol. 46, No. 11, Nov. 1998, pp. 1868-1880.
Shing, T.K., et al., "The Analysis of the Influence of the Auxiliary Components on FBAR Response", Nanotech, Jan. 2003, vol. 1, XP008054889, pp. 348-351.
Hikita, M., et al., "Design Methodology and Synthesis Techniques for Ladder-Type Saw Resonator Coupled Filters", Ultrasonics Symposium, Oct. 1993, 10 pgs.
Bauer, Thomas, et al., "SAW Band Rejection Filters for Mobile Digital Television", International Ultrasonics Symposium Proceedings, Nov. 2008, pp. 288-291.
Mourot, L, et al., "Band Reject Filter in BAW Technology", Proceedings of the 38th European Microwave Conference, Oct. 2008, Amsterdam, pp. 349-352.
Response to Written Opinion filed in the EPO dated Mar. 11, 2013 for related appln. No. PCT/US2011/064266, 49 pgs.
Ghilini, Marie, International Preliminary Report on Patentability received from the EPO dated Mar. 18, 2013 for related appln. No. PCT/US2011/064266, 63 pgs.
Xiaoming, et al., "A Modular SAW Filter Design Approach for Multiband Filtering", IEEE International Symposium 2011, Oct. 18-20, 2011, 4 pgs.
Kadota, et al., "Tunable Filters Using Ultrawide-Band Surface Acoustic Wave Resonator Composed of Grooved Cu Electrode on LiNb03", Japanese Journal of Applied Physics, vol. 49, 2010, pp. 07HD26-1-07HD26-4.
Surface Acoustic Wave Devices in Telecommunications: Modelling and Simulation by Ken-Ya Hashimoto, published by Springer on Jul. 31, 2000, ISBN-10: 354067232X and ISBN-13: 978-3540672326, pp. 123-125 and 176-181.
Peregrine Semiconductor Corporation, Demand filed in the EPO dated Nov. 13, 2012 for related appln. No. PCT/US2011/064266, 68 pgs.
Camps, Ester, Notification Concerning Informal Communications with the Applicant received from the EPO dated Feb. 20, 2013 for related appln. No. PCT/US2011/064266, 3 pgs.
Maget, Judith, Written Opinion of the International Preliminary Examining Authority received from the EPO dated Feb. 21, 2013 for related appln. No. PCT/US2011/064266, 36 pgs.
Peregrine Semiconductor Corporation, Remarks filed in the EPO dated Jan. 31, 2013 or related appln. No. PCT/US2011/064266, 9 pgs.
Maget, Judith, Invitation to Restrict or Pay Additional Fees, and, Where Applicable, Protest Fee received from the EPO dated Dec. 21, 2012 or related appln. No. PCT/US2011/064266, 9 pgs.
Michl, Amela, Communication under Rule 71(3) EPC received from the EPO dated Apr. 7, 2016 for appln. No. 14003070.1, 226 pgs.

* cited by examiner

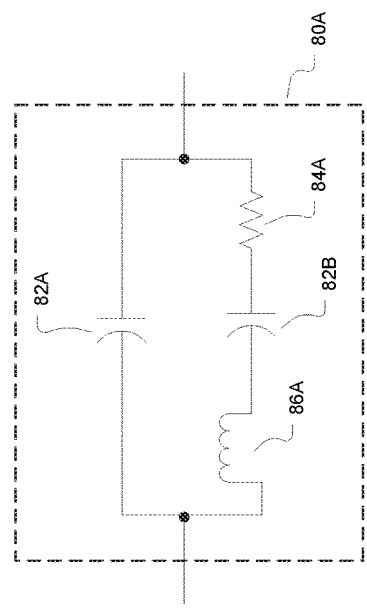
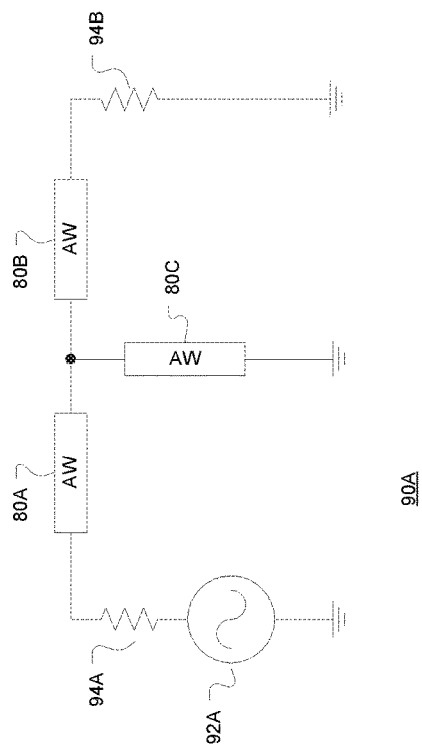
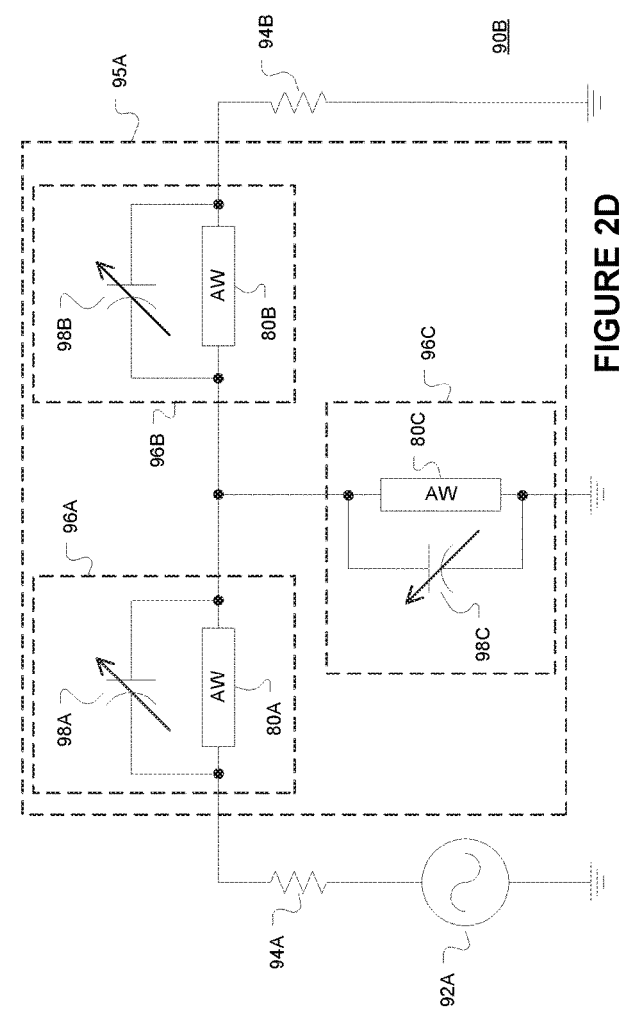

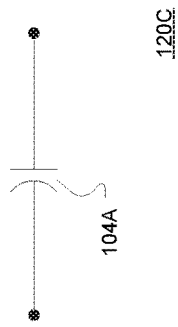
FIGURE 3C
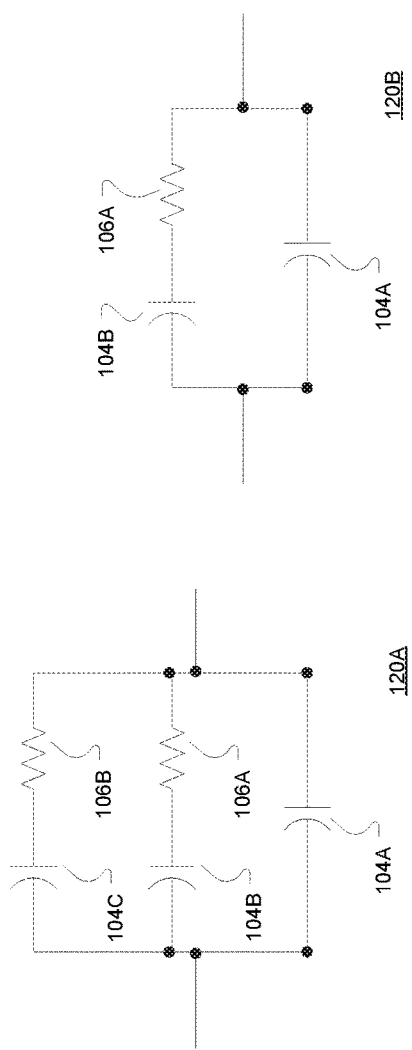
FIGURE 3B
FIGURE 3A
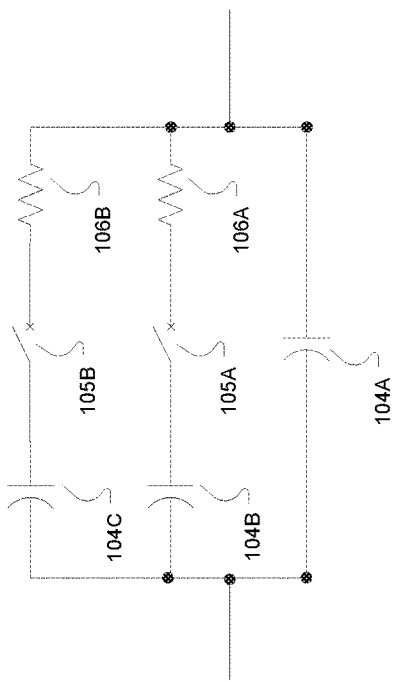
FIGURE 3D

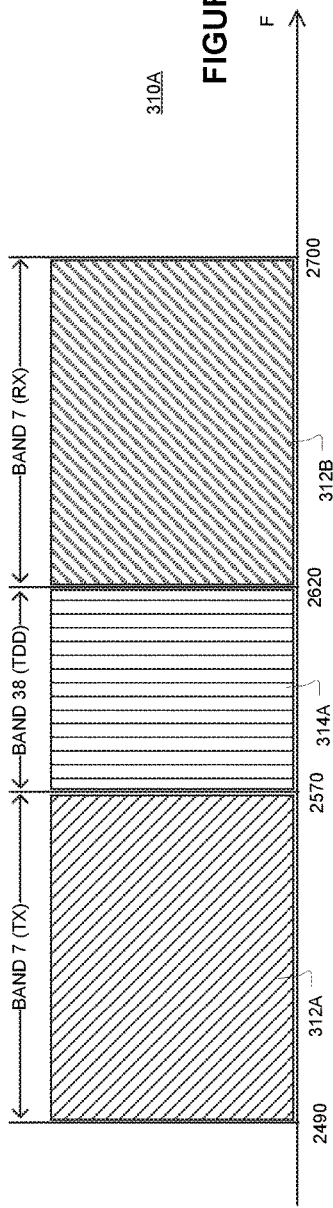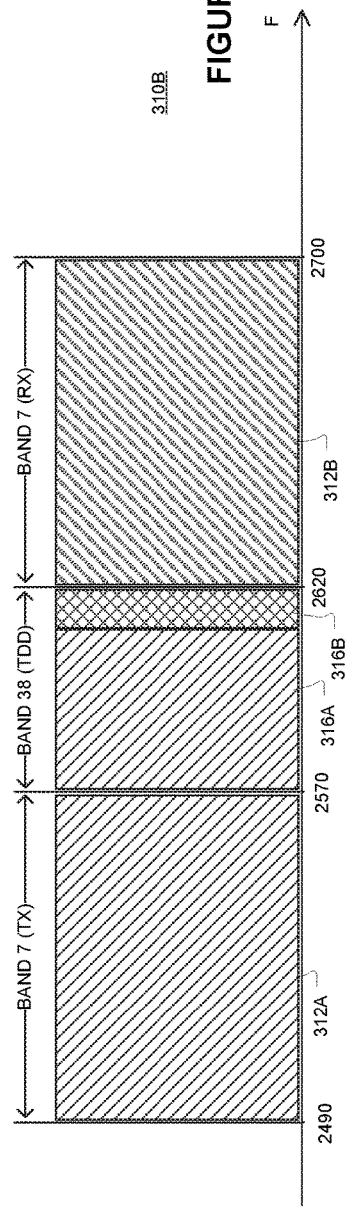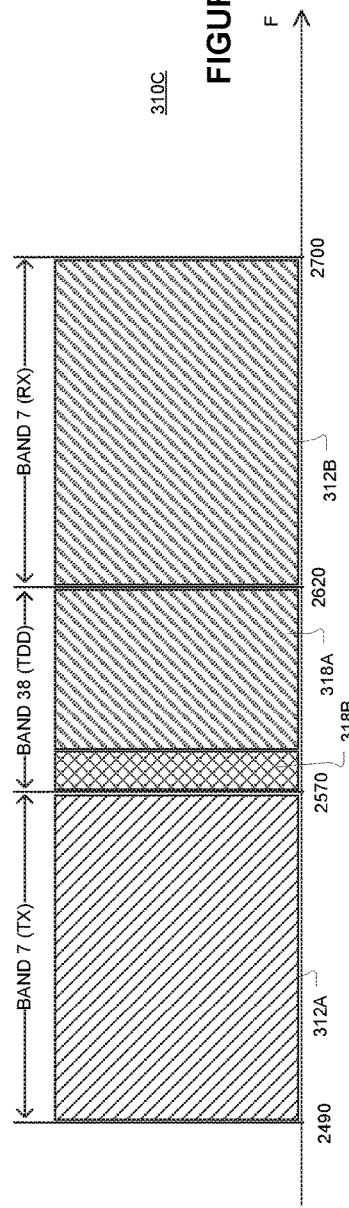

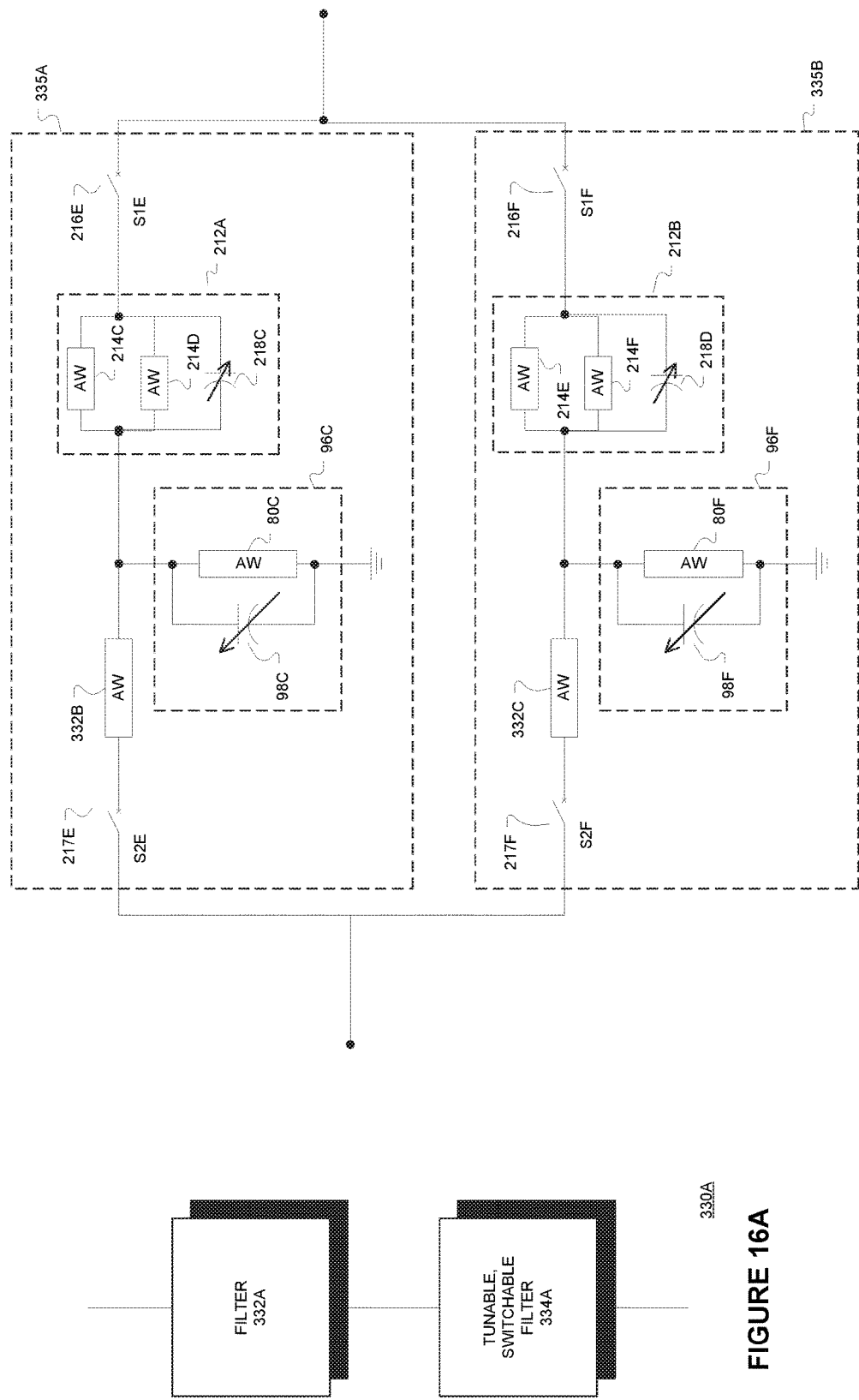

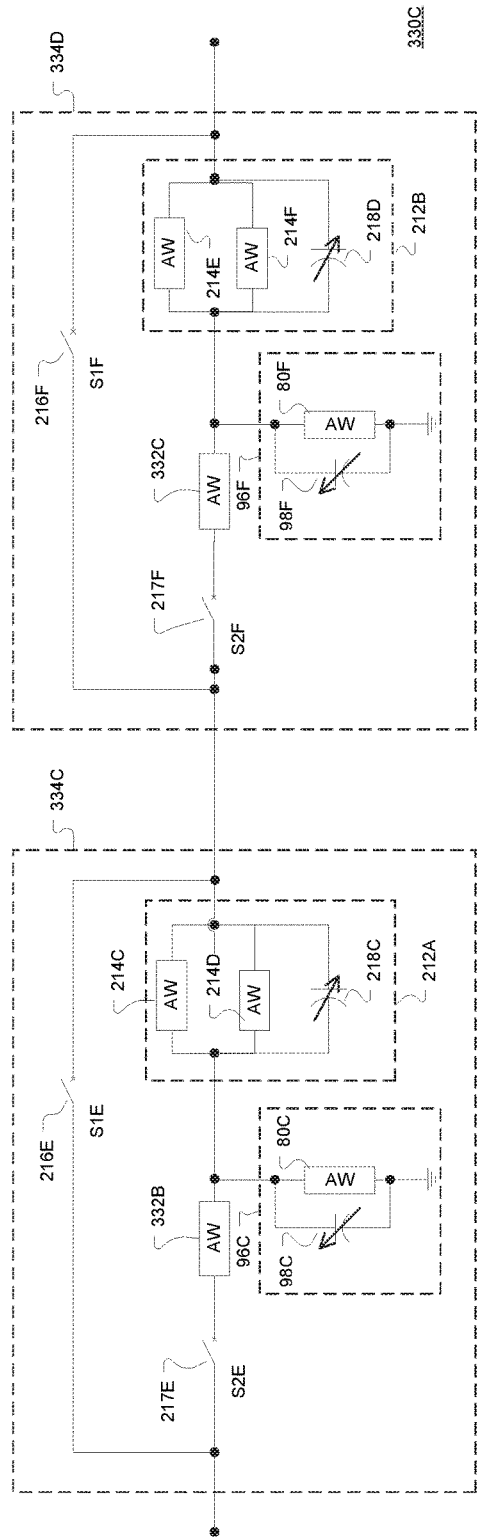
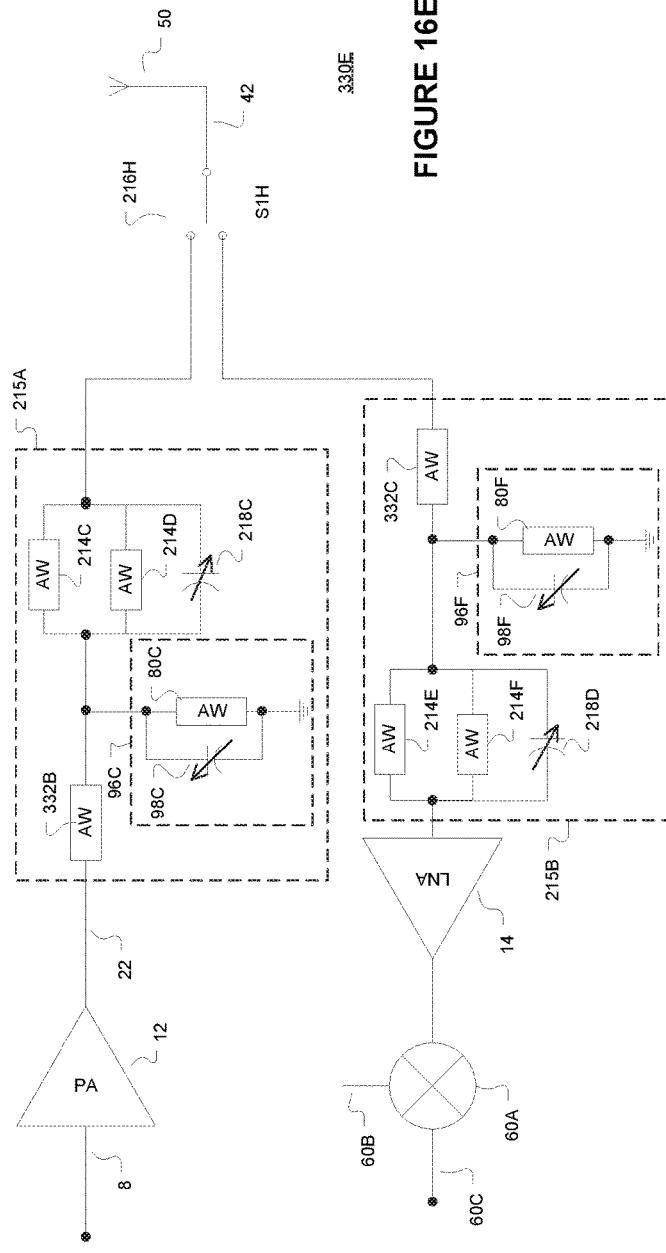
FIGURE 16C
FIGURE 16E

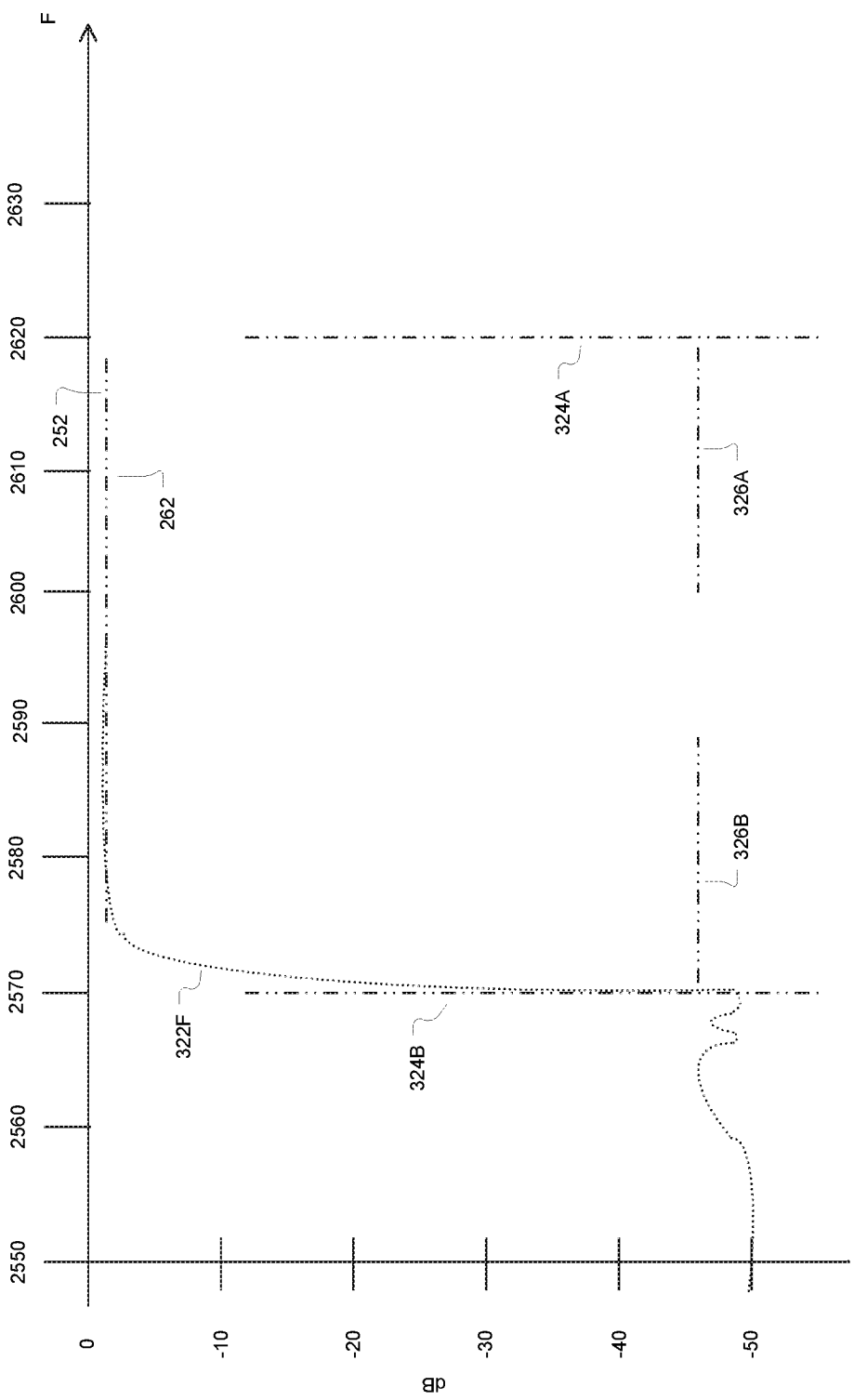

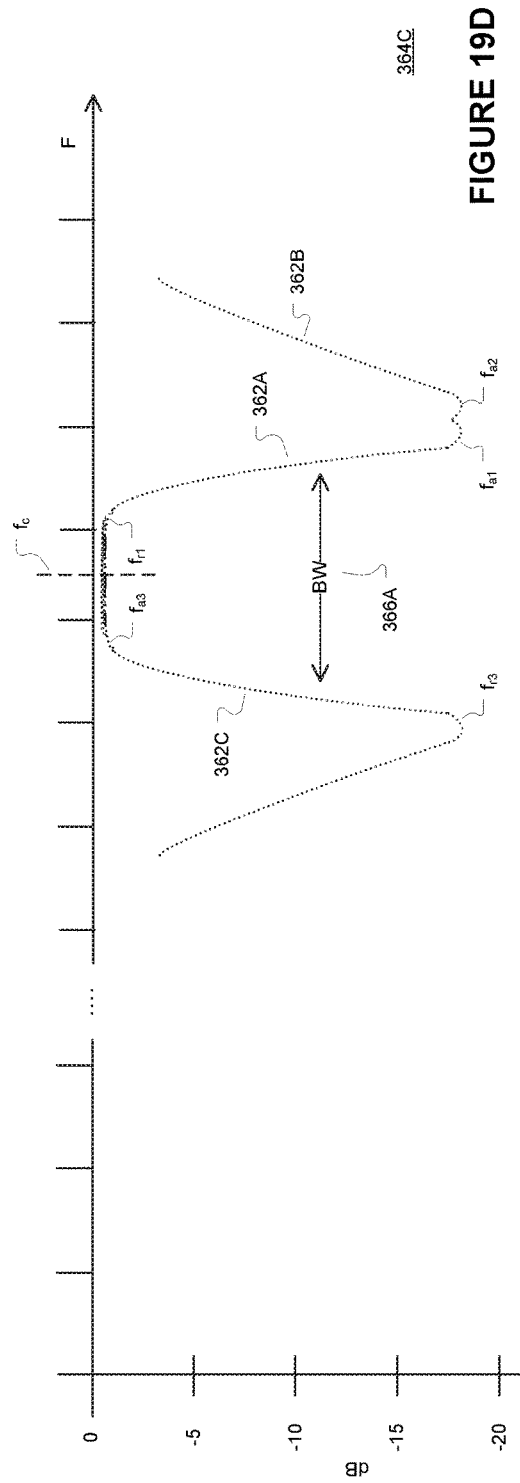
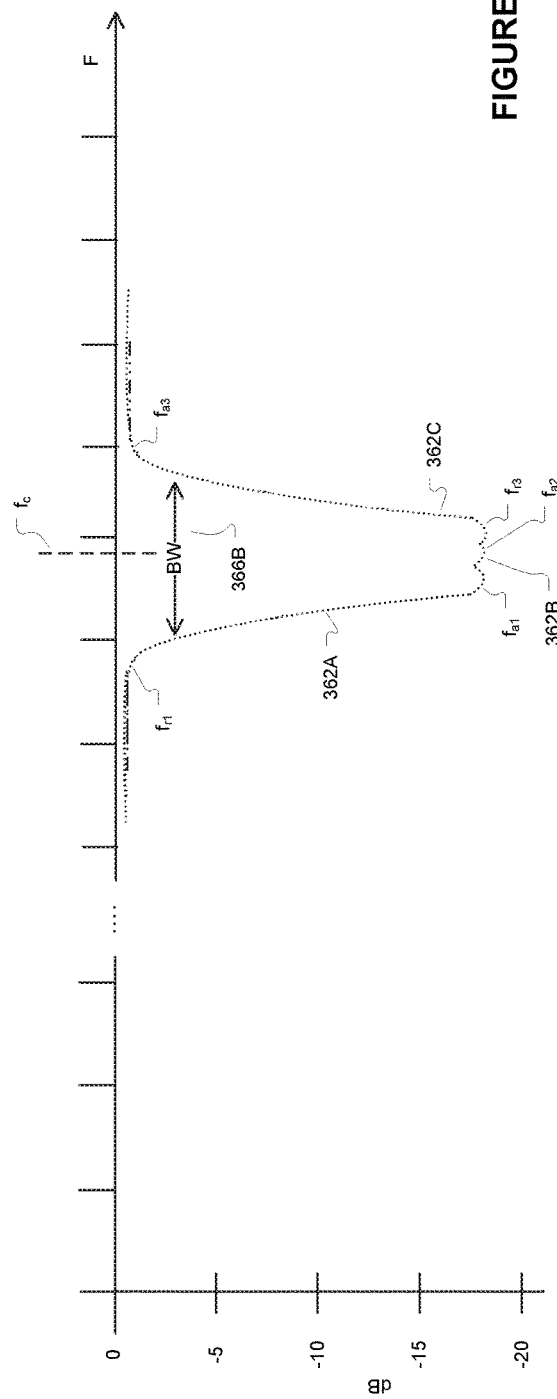

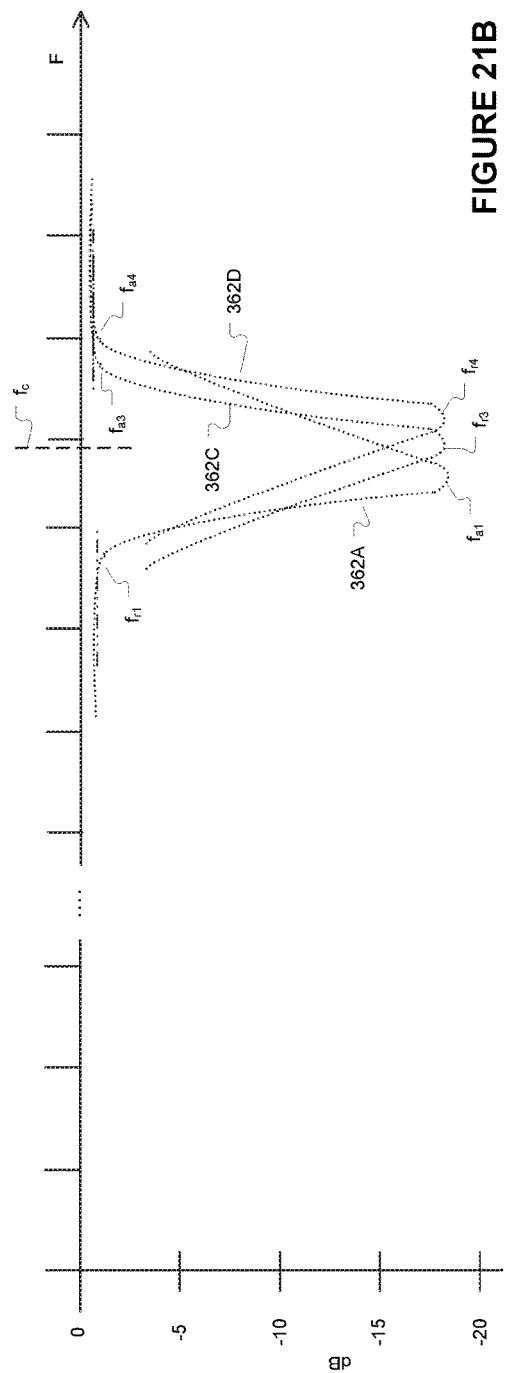
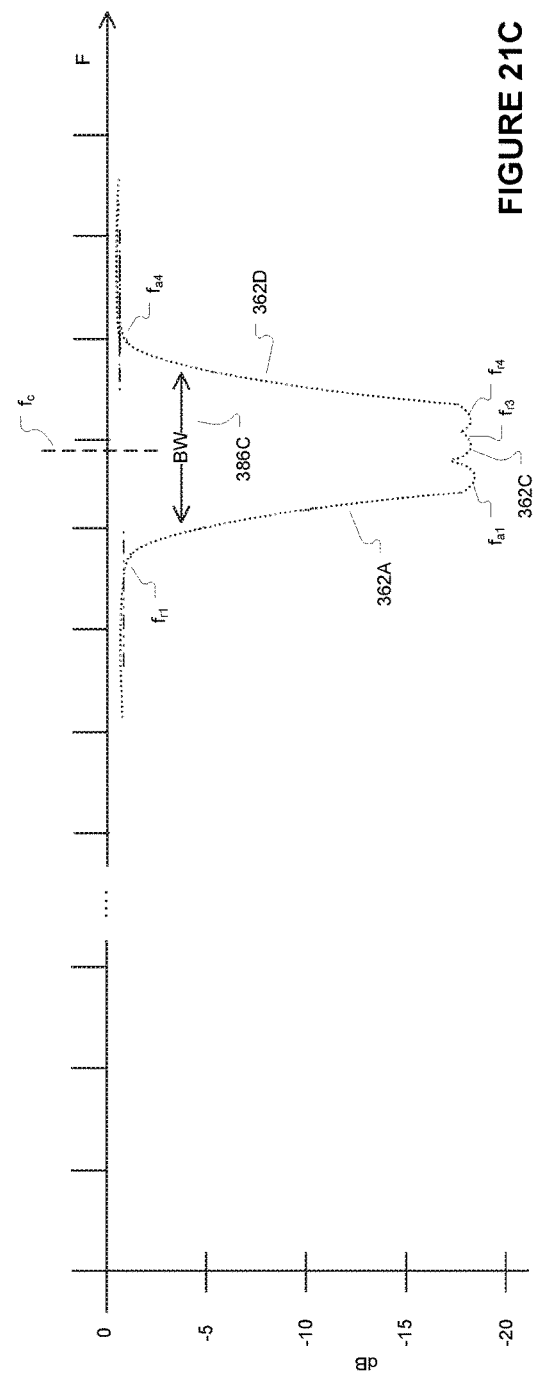

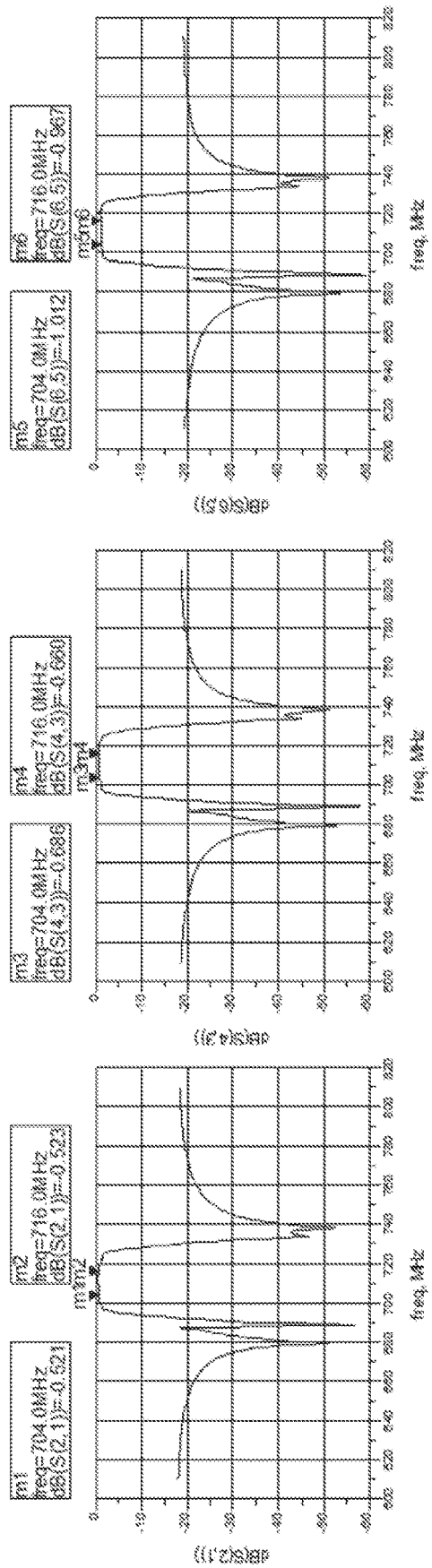
FIGURE 26A  456A
FIGURE 26B  456B
FIGURE 26C  456C
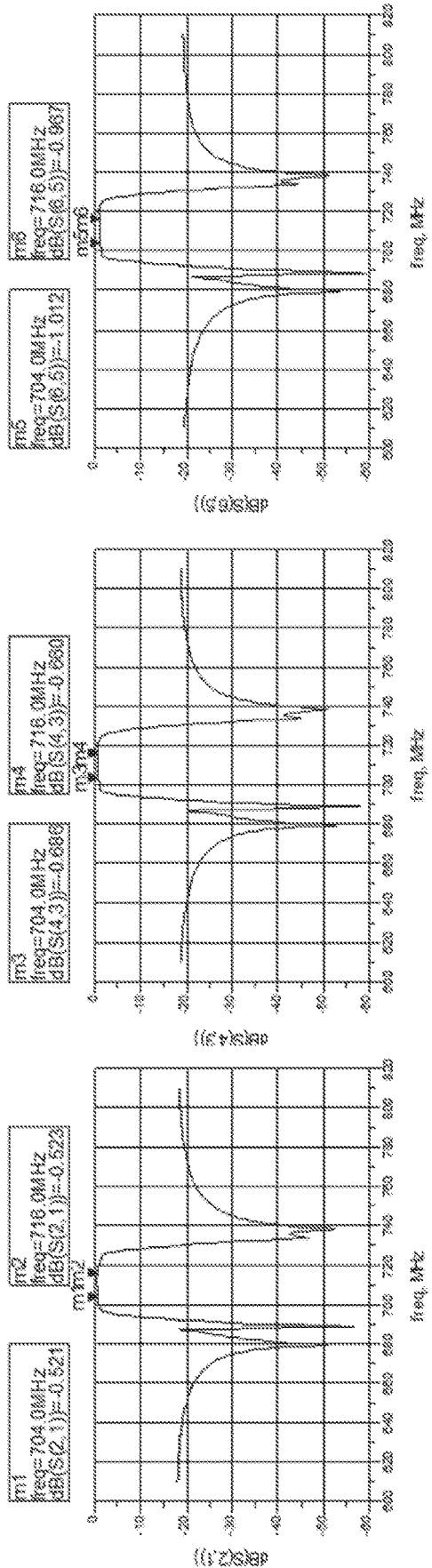
FIGURE 27A  458A
FIGURE 27B  458B
FIGURE 27C  458C

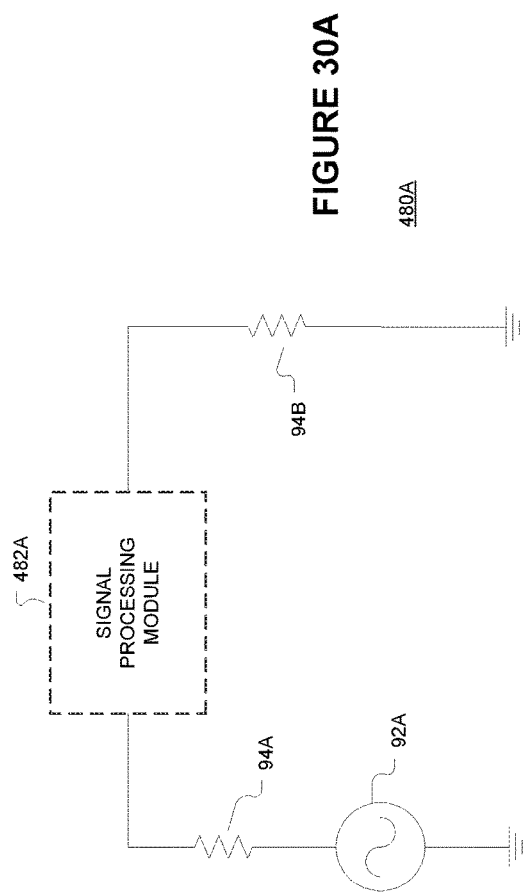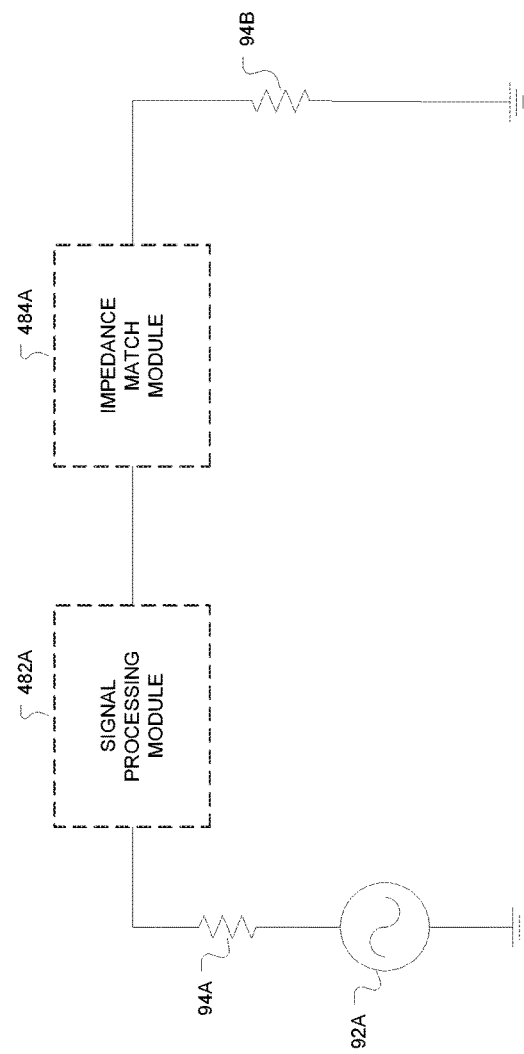

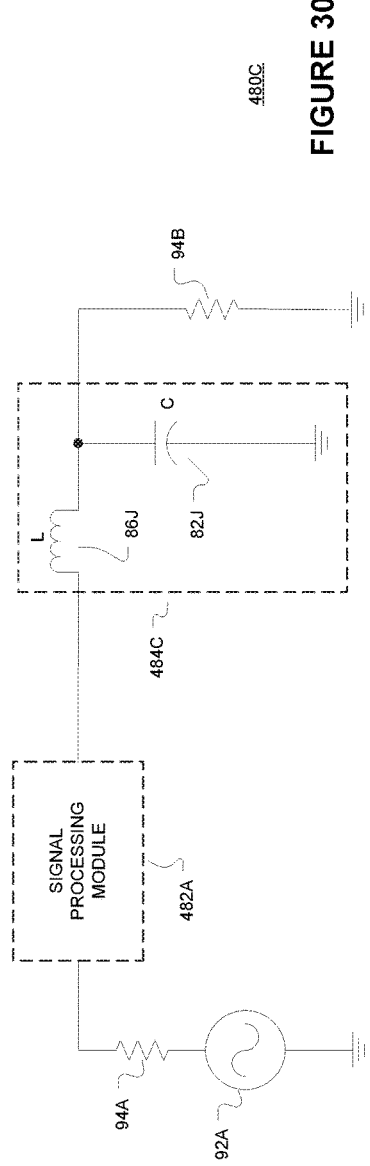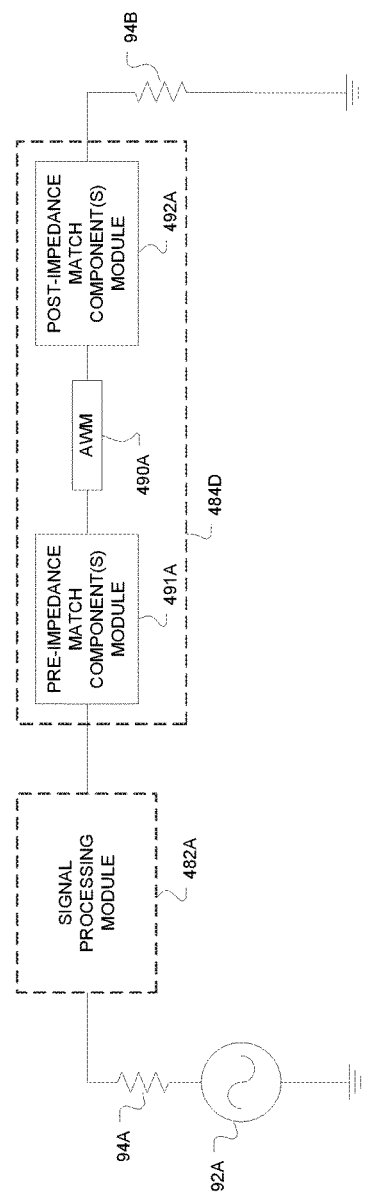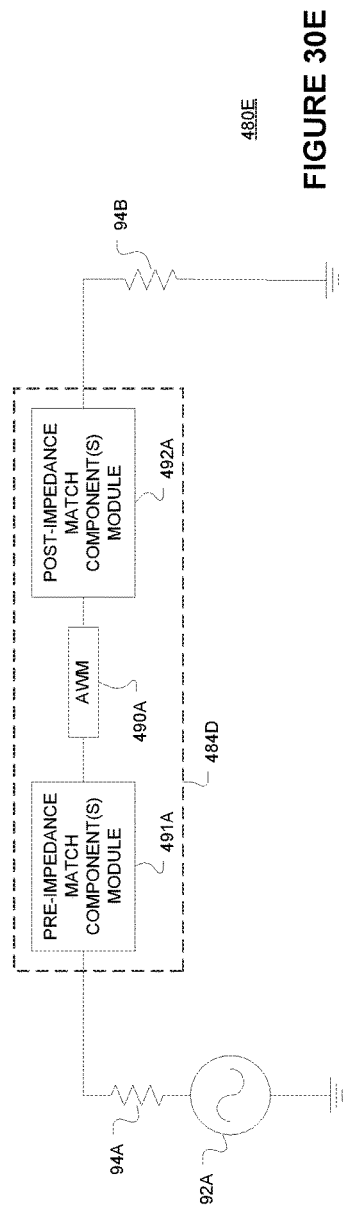
FIGURE 30C
FIGURE 30D
FIGURE 30E

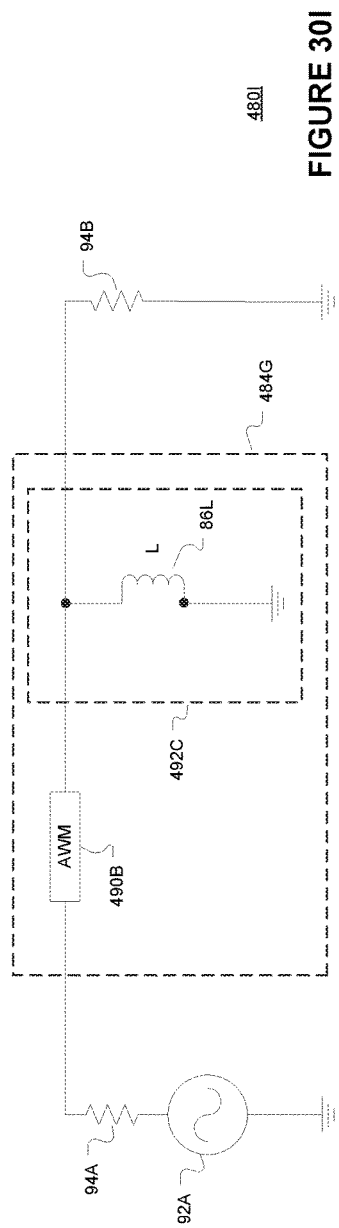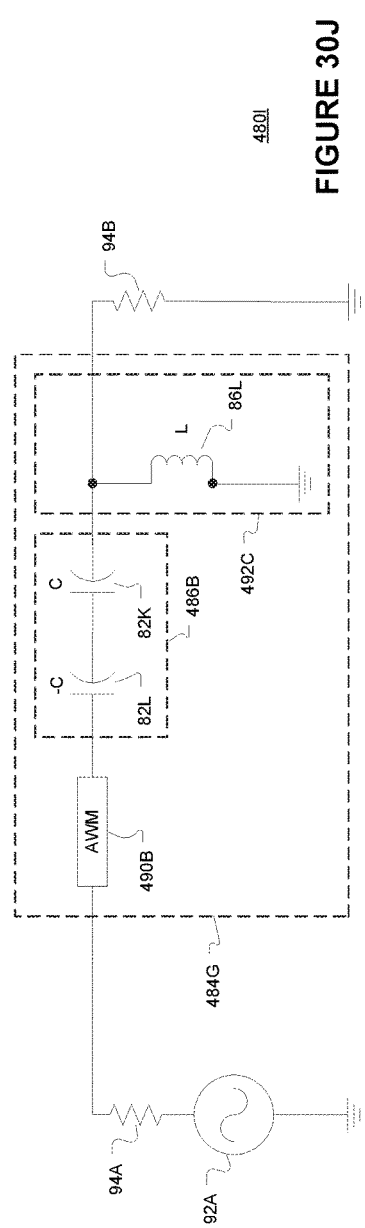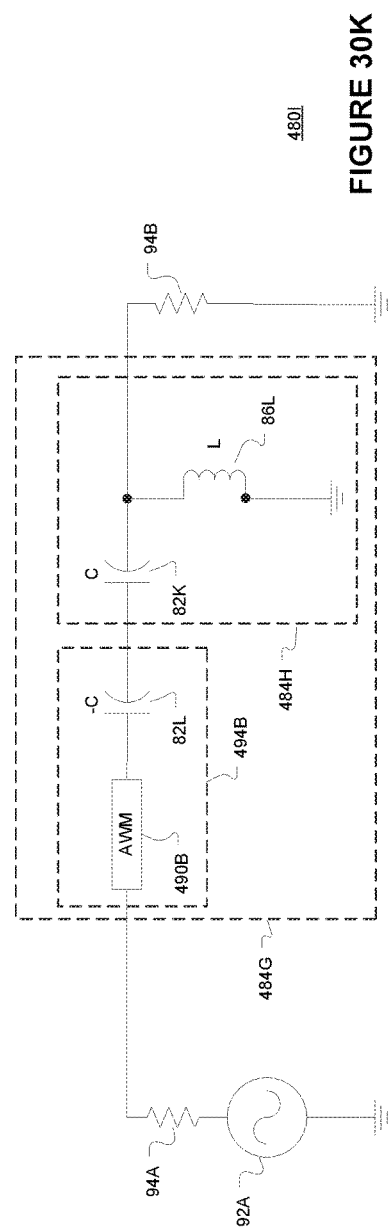

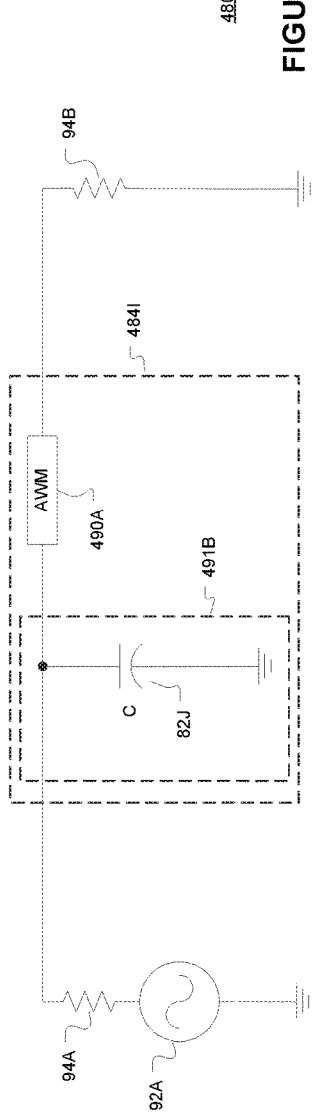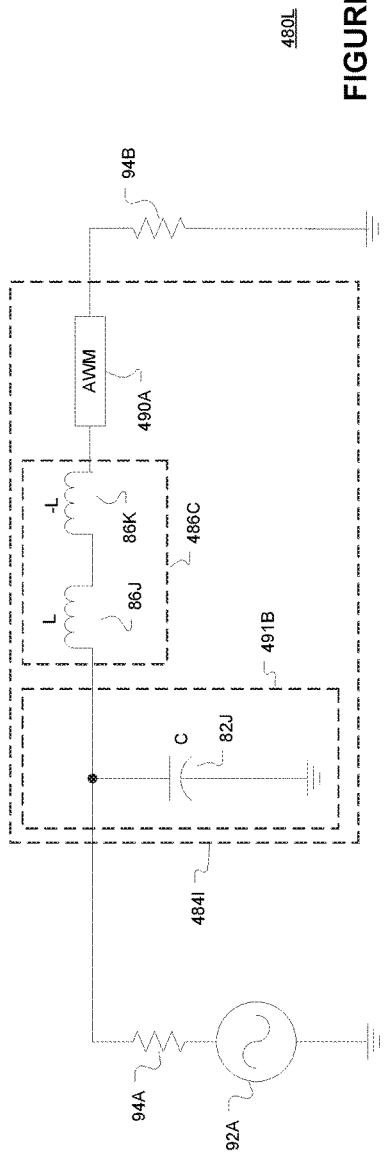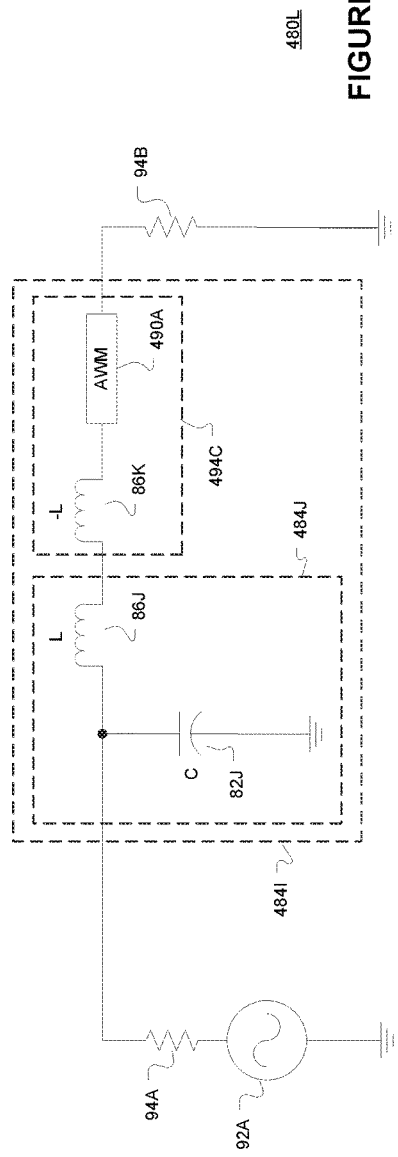

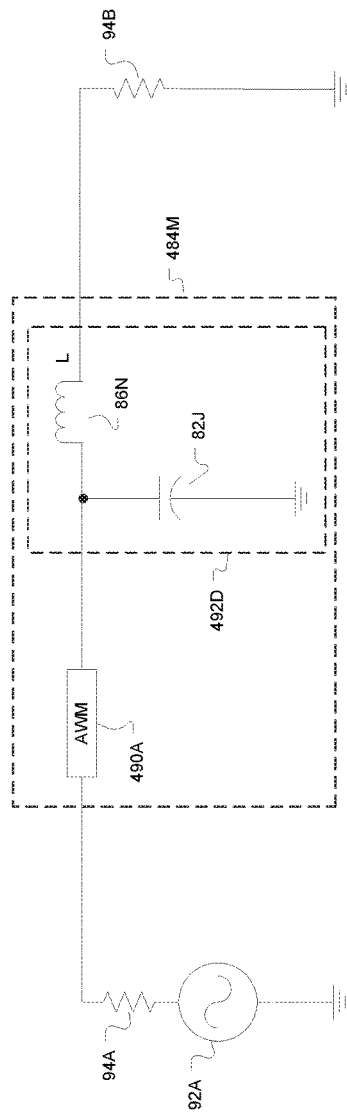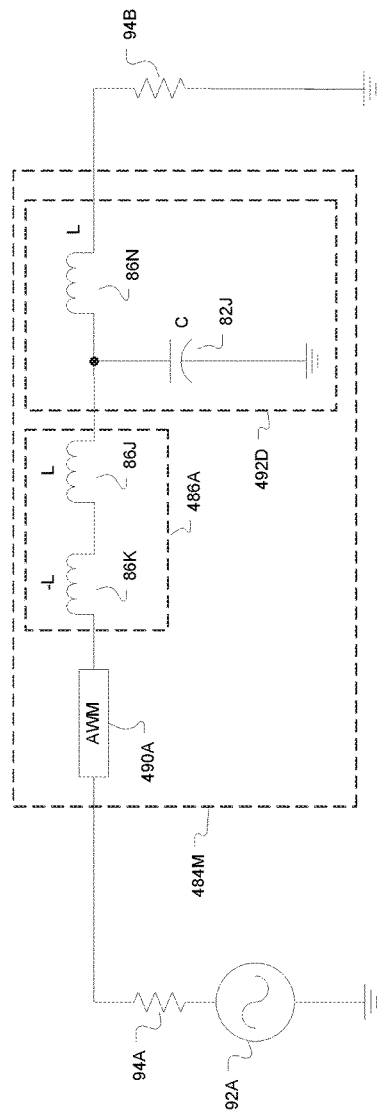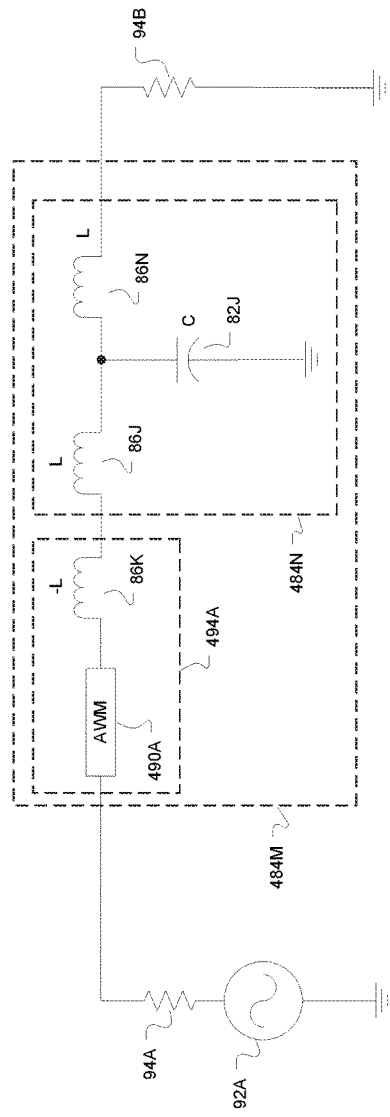

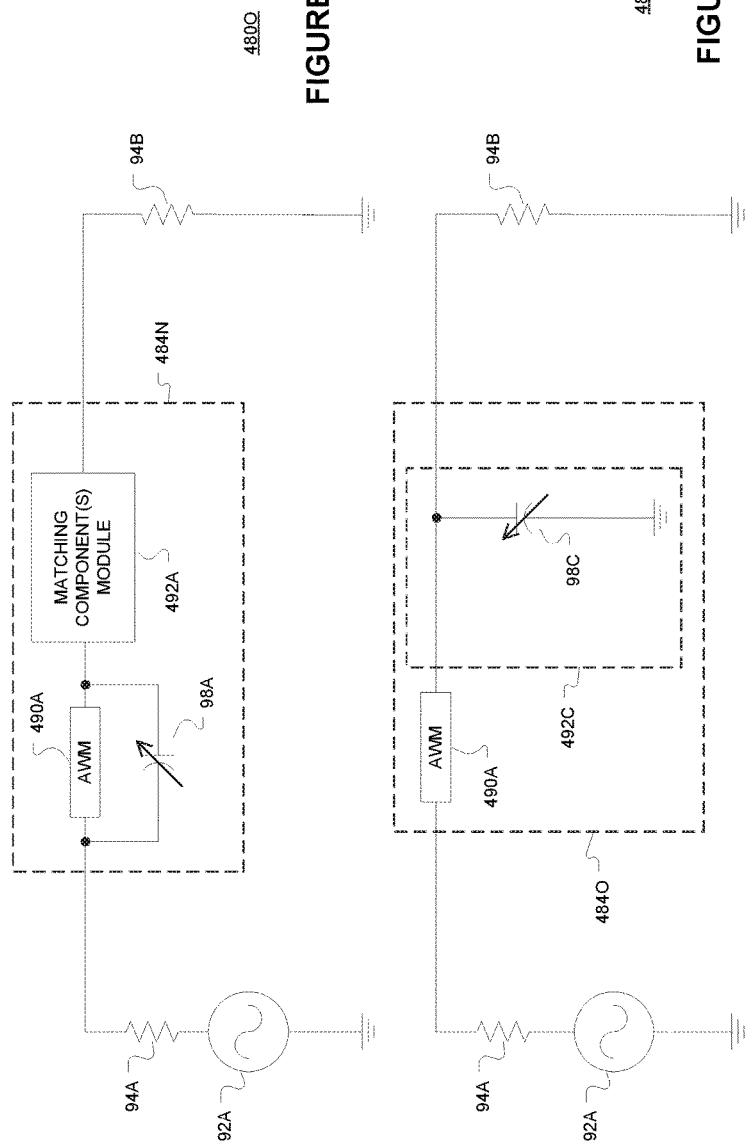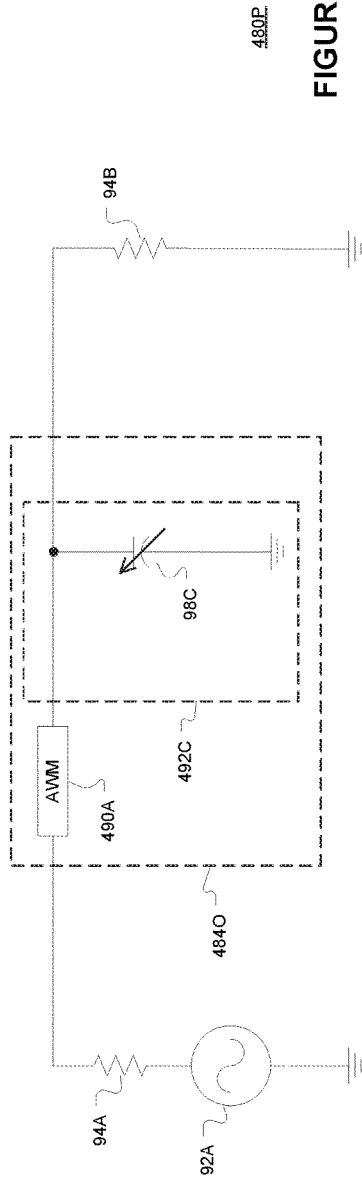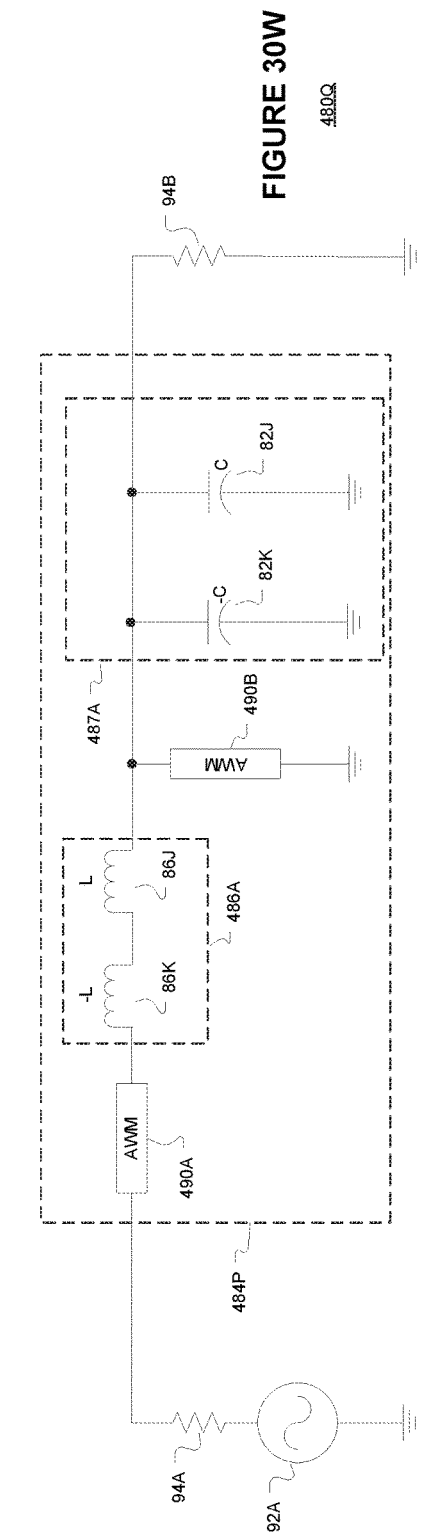
FIGURE 30U
FIGURE 30V
FIGURE 30W

METHOD, SYSTEM, AND APPARATUS FOR RESONATOR CIRCUITS AND MODULATING RESONATORS

CROSS REFERENCE TO RELATED APPLICATIONS—CLAIMS OF PRIORITY

This application is a continuation of co-pending U.S. application Ser. No. 15/607,388 filed May 26, 2017, entitled "METHOD, SYSTEM, AND APPARATUS FOR RESONATOR CIRCUITS AND MODULATING RESONATORS"; and application Ser. No. 15/607,388 is a continuation of U.S. application Ser. No. 15/046,363 filed Feb. 17, 2016, entitled "METHOD, SYSTEM, AND APPARATUS FOR RESONATOR CIRCUITS AND MODULATING RESONATORS", now U.S. Pat. No. 9,698,752 issued Jul. 4, 2017; and application Ser. No. 15/046,363 is a divisional of U.S. application Ser. No. 14/214,119 filed Mar. 14, 2014, entitled "METHOD, SYSTEM, AND APPARATUS FOR RESONATOR CIRCUITS AND MODULATING RESONATORS", now U.S. Pat. No. 9,300,038 issued Mar. 29, 2016; and application Ser. No. 14/214,119 claims priority under 35 USC 119 to U.S. provisional application No. 61/801,699 filed Mar. 15, 2013, entitled "METHOD, SYSTEM, AND APPARATUS FOR RESONATOR CIRCUITS AND MODULATING RESONATORS", and application Ser. No. 14/214,119 is a Continuation-in-part (CIP) of commonly assigned and co-pending U.S. Utility application Ser. No. 13/316,243 filed Dec. 9, 2011, now U.S. Pat. No. 9,041,484 issued on May 26, 2015, and entitled "METHOD, SYSTEM, AND APPARATUS FOR RESONATOR CIRCUITS AND MODULATING RESONATORS", which application Ser. No. 13/316,243 claims priority under 35 USC 119 to the following U.S. provisional patent applications: provisional application No. 61/422,009 filed Dec. 10, 2010 and entitled "METHOD, SYSTEM, AND APPARATUS FOR RESONATOR CIRCUITS AND MODULATING RESONATORS", U.S. provisional application No. 61/438,204 filed Jan. 31, 2011, entitled "METHOD, SYSTEM, AND APPARATUS FOR RESONATOR CIRCUITS AND MODULATING RESONATORS" (attorney docket number PER-060-PROV-2), U.S. provisional application No. 61/497,819 filed Jun. 16, 2011, entitled "METHOD, SYSTEM, AND APPARATUS FOR RESONATOR CIRCUITS AND MODULATING RESONATORS", U.S. provisional application No. 61/521,590 filed Aug. 9, 2011, entitled "METHOD, SYSTEM, AND APPARATUS FOR RESONATOR CIRCUITS AND MODULATING RESONATORS", U.S. provisional application No. 61/542,783 filed Oct. 3, 2011, entitled "METHOD, SYSTEM, AND APPARATUS FOR RESONATOR CIRCUITS AND MODULATING RESONATORS", and U.S. provisional application No. 61/565,413 filed Nov. 30, 2011, entitled "METHOD, SYSTEM, AND APPARATUS FOR RESONATOR CIRCUITS AND MODULATING RESONATORS"; and the contents of each application and patent cited above are hereby incorporated herein by reference as if set forth in full.

TECHNICAL FIELD

Various embodiments described herein relate generally to resonator circuits and modulating resonators, including systems, apparatus, and methods employing resonators.

BACKGROUND INFORMATION

It may be desirable to modulate one or more resonators including shifting its resonate and anti-resonate points and provide resonator circuits, the present invention provides such modulation and circuits.

BRIEF DESCRIPTION OF THE DRAWINGS

FIG. 2A is a block diagram of an electrical signal filter module including resonators according to various embodiments.

FIG. 2B is a block diagram of a filter module including electrical elements representing the characteristics of a resonator according to various embodiments.

FIGS. 2C and 2I are block diagrams of modulated or tunable resonator modules according to various embodiments.

FIGS. 2D-H and 2J are block diagrams of tunable filter modules including tunable or modulated resonators according to various embodiments.

FIG. 3A-3C are diagrams of capacitor modules that may be coupled to AW according to various embodiments.

FIG. 3D is a diagram of a tunable capacitor module that may be coupled to AW according to various embodiments.

FIG. 15A is a simplified diagram of an RF channel configuration according to various embodiments.

FIG. 15B is a simplified diagram of an RF channel configuration with a channel in a first mode according to various embodiments.

FIG. 15C is a simplified diagram of an RF channel configuration with a channel in a second mode according to various embodiments.

FIG. 16A is a simplified block diagram of a filtering architecture according to various embodiments.

FIG. 16B is a block diagram of a filter architecture including switchable, modulated or tunable resonator modules and a resonator module according to various embodiments.

FIG. 16C is a block diagram of another filter architecture including switchable, modulated or tunable resonator modules and a resonator module according to various embodiments.

FIG. 16E is a simplified block diagram of signal transceiver architecture according to various embodiments.

FIG. 17F is a diagram of a filter frequency response of a filter architecture including a switchable, modulated or tunable resonator module in a second mode and a resonator module according to various embodiments.

FIG. 19D is a diagram of combined filter frequency responses of the electrical signal filter module including resonators of FIG. 19A in the first, pass-band filter mode according to various embodiments.

FIG. 19E is a diagram of combined filter frequency responses of the electrical signal filter module including resonators of FIG. 19A in a second, notch filter mode according to various embodiments.

FIG. 21B is a diagram of filter frequency responses of the electrical signal filter module including resonators of FIG. 21A in a notch filter mode according to various embodiments.

FIG. 21C is a diagram of combined filter frequency responses of the electrical signal filter module including resonators of FIG. 21A in the notch filter mode according to various embodiments.

FIG. 26A to 27C are diagrams of filter frequency responses of a signal filter architecture according to various embodiments.

FIG. 30A is a simplified block diagram of a signal filter architecture according to various embodiments.

FIG. 30B is a simplified block diagram of an impedance matched ("IM") signal filter architecture according to various embodiments.

FIG. 30C is a simplified block diagram of an impedance matched ("IMM") signal filter architecture including an IM module according to various embodiments.

FIG. 30D is a simplified block diagram of IM signal filter architecture including an IMM, the IMM including an acoustic wave module (AWM) according to various embodiments.

FIG. 30E is a simplified block diagram of IM architecture including an acoustic wave module (AWM) and matching components module (MCM) according to various embodiments.

FIG. 30I is a simplified block diagram of IM architecture including an acoustic wave module (AWM) and matching components module (MCM) according to various embodiments.

FIG. 30J is a simplified block diagram of IM architecture including an acoustic wave module (AWM) and matching components module (MCM) showing effective components according to various embodiments.

FIG. 30K is a simplified block diagram of IM architecture including an acoustic wave module (AWM) and matching components module (MCM) showing redistributed effective components according to various embodiments.

FIG. 30L is a simplified block diagram of IM architecture including an acoustic wave module (AWM) and matching components module (MCM) according to various embodiments.

FIG. 30M is a simplified block diagram of IM architecture including an acoustic wave module (AWM) and matching components module (MCM) showing effective components according to various embodiments.

FIG. 30N is a simplified block diagram of IM architecture including an acoustic wave module (AWM) and matching components module (MCM) showing redistributed effective components according to various embodiments.

FIG. 30R is a simplified block diagram of IM architecture including an acoustic wave module (AWM) and matching components module (MCM) according to various embodiments.

FIG. 30S is a simplified block diagram of IM architecture including an acoustic wave module (AWM) and matching components module (MCM) showing effective components according to various embodiments.

FIG. 30T is a simplified block diagram of IM architecture including an acoustic wave module (AWM) and matching components module (MCM) showing redistributed effective components according to various embodiments.

FIG. 30U is a simplified block diagram of IM signal filter architecture including an IMM, the IMM including an acoustic wave module (AWM) coupled to an adjustable capacitor according to various embodiments.

FIG. 30V is a simplified block diagram of IM architecture including an acoustic wave module (AWM) and matching components module (MCM) according to various embodiments.

FIG. 30W is a simplified block diagram of IM architecture including acoustic wave modules (AWM) acting as a matching components module (MCM) according to various embodiments.

DETAILED DESCRIPTION

Figure 1A:
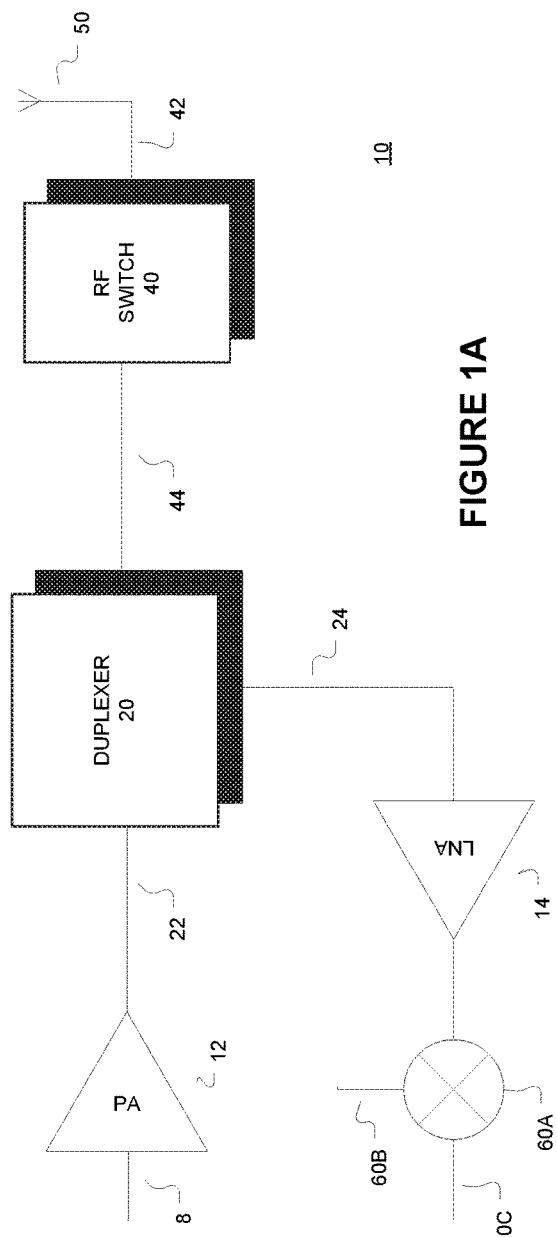
FIG. 1A is a simplified block diagram of duplex signal transceiver architecture according to various embodiments.

FIG. 1A is a simplified block diagram of duplex signal transceiver architecture 10 according to various embodiments. As shown in FIG. 1A, architecture 10 includes a power amplifier module (PA) 12, signal duplexer module 20, radio frequency (RF) switch module 40, low noise amplifier (LNA) module 14, mixer module 60A, and RF signal antenna 50. In operation a signal 8 to be transmitted on the antenna 50 may be amplified via the PA module 12, filtered by the duplexer module 20, and coupled to the antenna 50 via the RF switch module 40. In a duplex signal architecture a received signal on the antenna 50 may be simultaneously processed the duplexer module 20. The resultant receive signal 24 may be amplified by the LNA module 14 and down-mixed to a baseband signal 60C via the mixer module 60A and a reference frequency signal 60B.

Figure 1B:
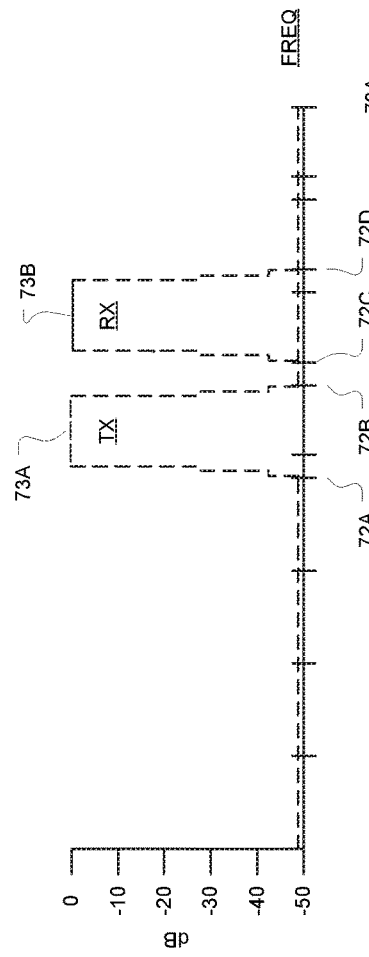
FIG. 1B is a simplified diagram of an RF channel configuration according to various embodiments.
Figure 1C:
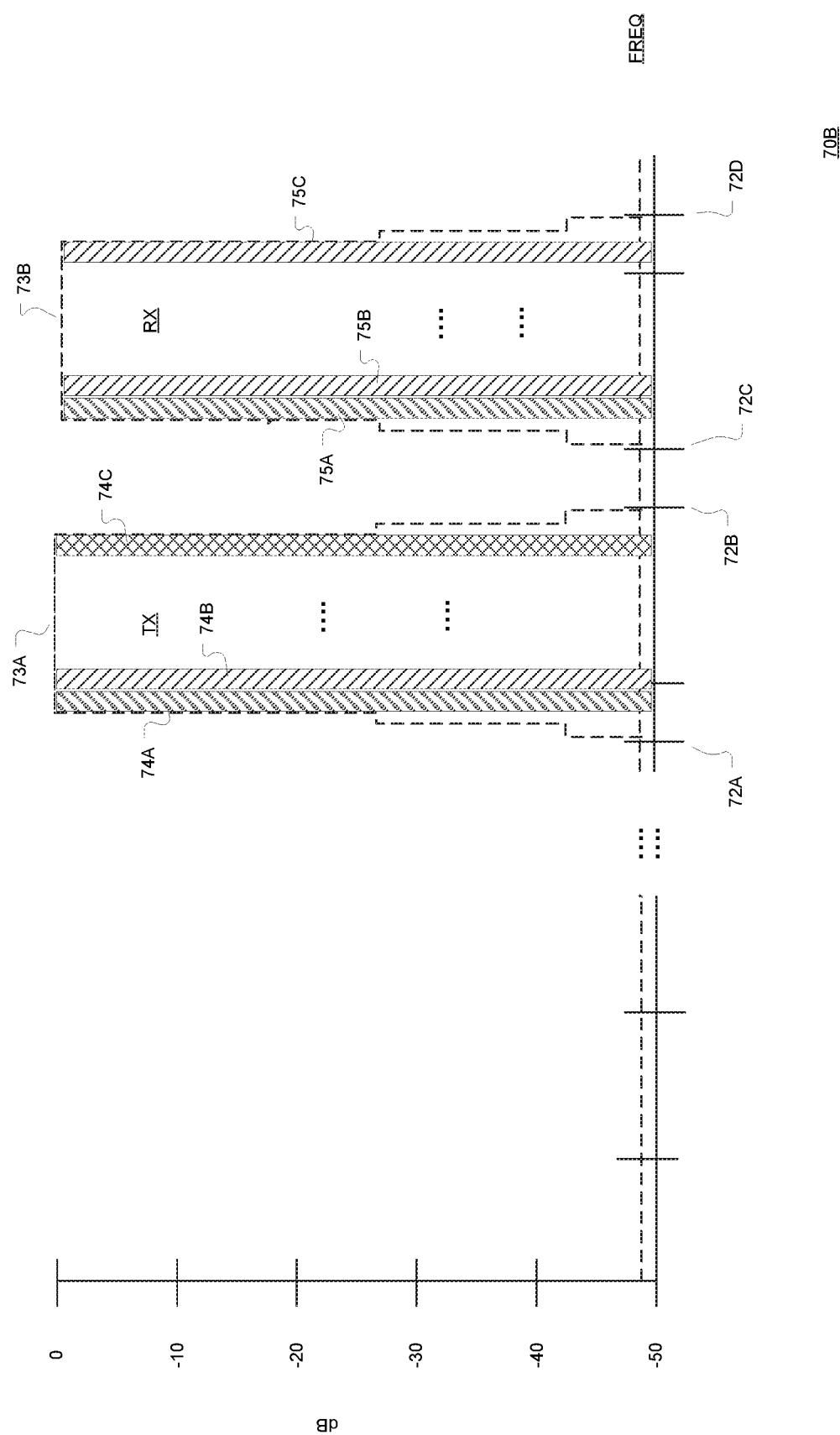
FIG. 1C is a simplified, partial diagram of a section of the RF channel configuration shown in FIG. 1B.

FIG. 1B is a simplified diagram of an RF channel configuration 70A according to various embodiments. As shown in FIG. 1B, a transmit (TX) band 73A and a receive (RX)

band 73B may be located in close frequency proximity. The TX band may have a width defined by 72A, 72B (start and end of the TX band), the RX band may have a width defined by 72C, 72D (start and end of the RX band), and the frequency separation between the bands may be the difference between 72C and 72B (start of the RX band and end of the TX band). The TX band 73A and the RX band 73B may include a plurality of sub-bands or units 74A, 74B, 74C and 75A, 75B, and 75C as shown in FIGS. 1C to 1G.

At the antenna 50 the TX band signal energy 73A may be greater than the RX band signal energy as shown in FIGS. 1B to 1G. Such a differential in signal energy may saturate the LNA module 14 and occlude the RX signal 24 in duplexed signal architecture 10. The duplexer module 20 may include one or more filters (shown in FIG. 2F) to limit interference of TX and RX signals in the TX and RX bands 73A, 73B. The combined TX and RX signal 42 may be communicated according to one or more communication protocol or standards including Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), and other radio communication standards or protocols. Such standards or protocols may provide minimum signal separation or interference mitigation requirements for communication of signals on the respective networks via an antenna 50.

The PA module 12 may also introduce noise or interface due to its fall off in power about the TX band to be amplified. The excess PA power may interfere with the LNA module 14 operation. A blocker signal near the TX, RX bands 73A, 73B or between same present on the antenna 50 (may be due to other signals in the communication network) may also interfere with the LNA module 14 operation and cause loss in the RX signal 24.

Duplex systems or architecture 10 may employ filter modules including duplexer modules. The duplexer modules may include known filter elements such as resistors, capacitors, inductors, digital signal processors (DSPs), and resonators. Configurations of these components may form filter modules to attempt to meet or exceed adjacent channel or band interface requirements according to one or more communication protocols or standards. In an embodiment, the channel configuration 70A may be used for a CDMA band five (V) signals where the TX band 73A extends from 824 to 849 MHz (72A, 72B) and the RX band 73B extends from 869 to 894 MHz (72C, 72D). In this configuration, The TX band 73A and RX band 73B are 25 MHz in width and separated by 20 MHz (72C minus 72B). As shown in FIGS. 1C to 1G, the TX band 73A may include a plurality of sub-bands 74A, 74B, 74C and the RX band 73B may including a plurality of sub-bands 75A, 75B, 75C. In an embodiment, the sub-bands may be about 1.5 MHz wide (CDMA) and 5 MHz wide (W-CDMA).

Figure 1D:
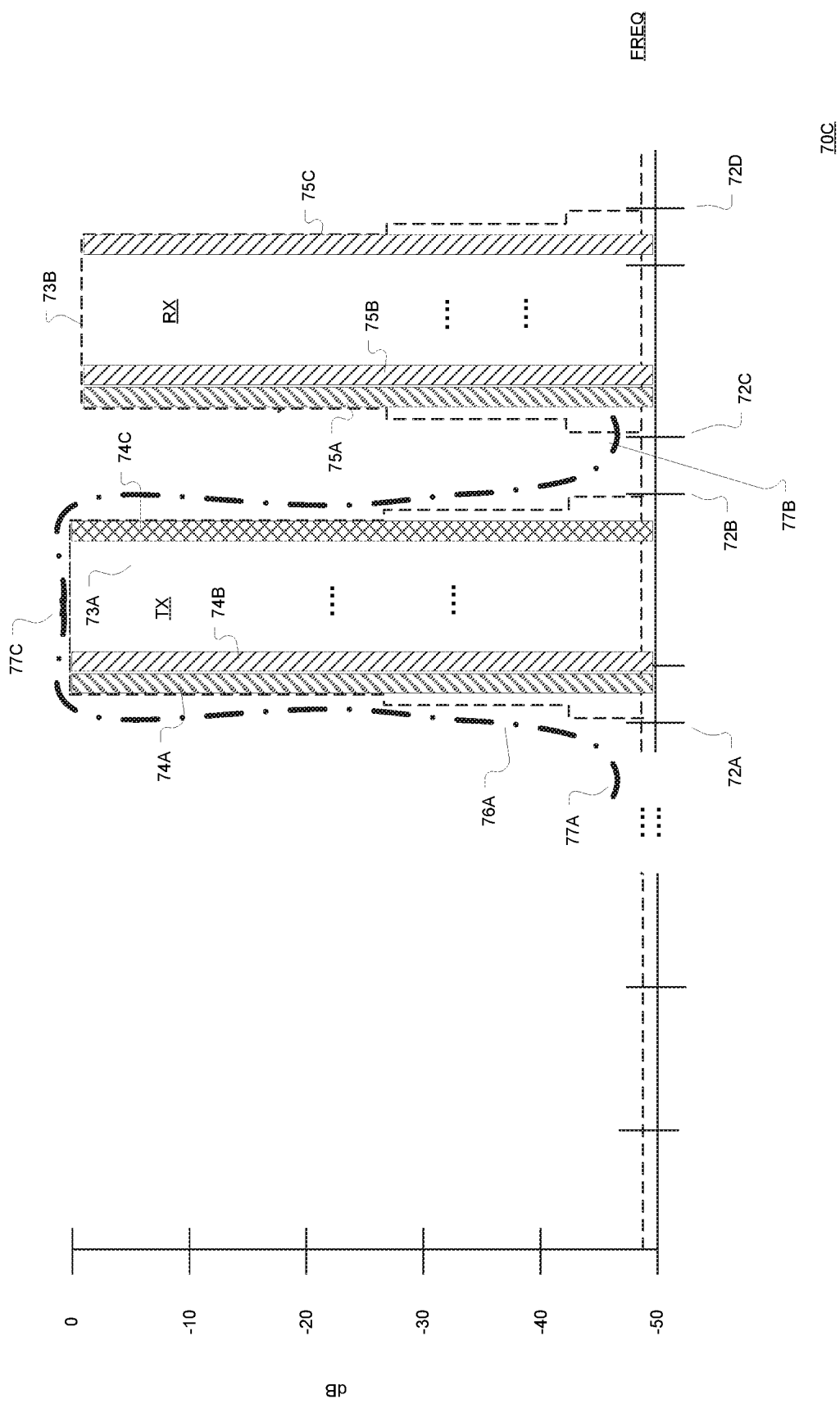
FIG. 1D is a simplified, partial diagram of a section of the RF channel configuration shown in FIG. 1B with a filter characteristic applied to a first band according to various embodiments.
Figure 1E:
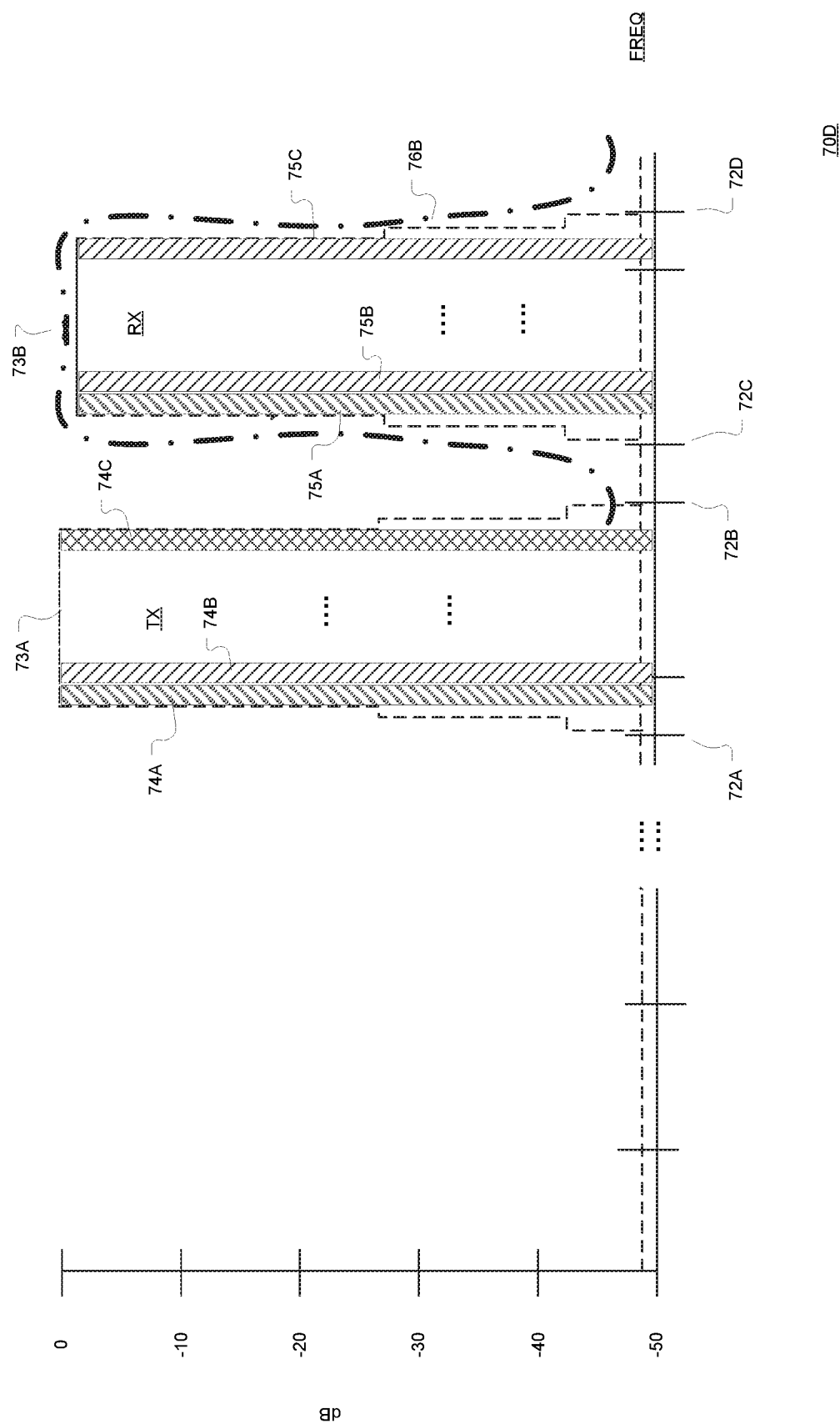
FIG. 1E is a simplified, partial diagram of a section of the RF channel configuration shown in FIG. 1B with a filter characteristic applied to a second band according to various embodiments.

In order to limit interface between adjacent bands, a filter module having a frequency characteristic 76A as shown in FIG. 1D may be applied to the TX band 73A. Similarly, a filter module having a frequency characteristic 76B as shown in FIG. 1E may be applied to the RX band 73B. As shown in FIGS. 1D and 1E the filter characteristics 76A, 76B ideally have a large dB rollout on either side of the communicated band (pass-band). The capacitors, inductors, and resistors required for such filter characteristics may be large and consume significant real estate when constructed on a dielectric wafer as known to those of skill in the art. One or more resonators may be employed to attempt to achieve a TX or RX signal 42 filter characteristic 76A, 76B.

Resonators may include surface acoustic wave (SAW) and bulk acoustic wave (BAW) devices. Such devices may be used in filters, oscillators and transformers and commonly cause the transduction of acoustic waves. In SAW and BAW, electrical energy is transduced to mechanical energy and back to electrical energy via piezoelectric materials. The piezoelectric materials may include quartz, lithium niobate, lithium tantalate, and lanthanum gallium silicate. One or more transverse fingers of conductive elements may be placed in the piezoelectric materials to convert electrical energy to mechanical energy and back to electrical energy. The SAW or resonator may include one or more one or more interdigital transducers (IDTs) (transverse fingers of electrical conductive elements) for such energy conversions or transductions. A resonator construction and material requirements may be more complex and expensive for electrical signals having high frequency content such as signals transmitted according to one or more RF communication protocols or standards.

Figure 1F:
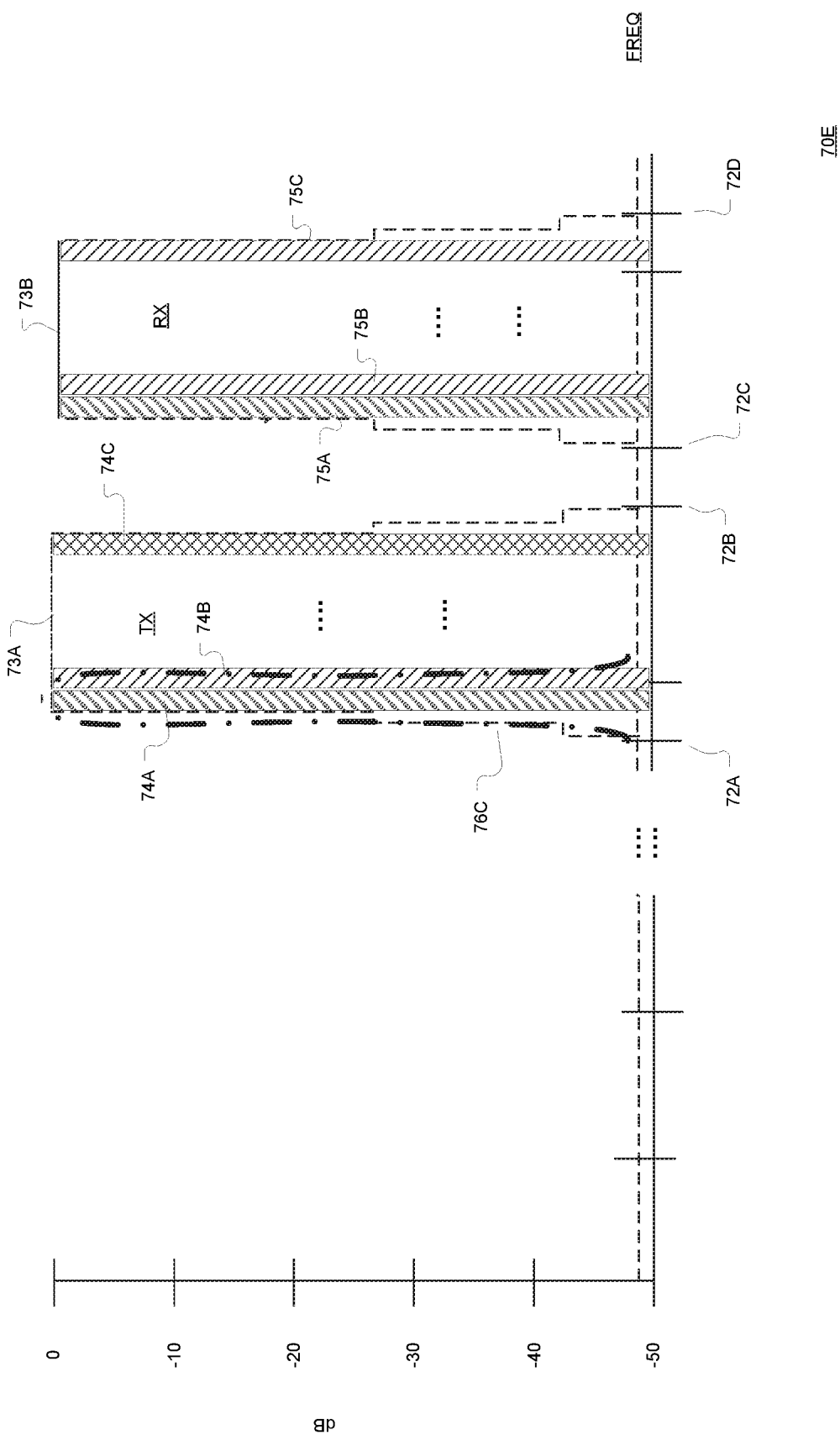
FIG. 1F is a simplified, partial diagram of a section of the RF channel configuration shown in FIG. 1B with a filter characteristic applied to a subunit or band of a first band according to various embodiments.
Figure 1G:
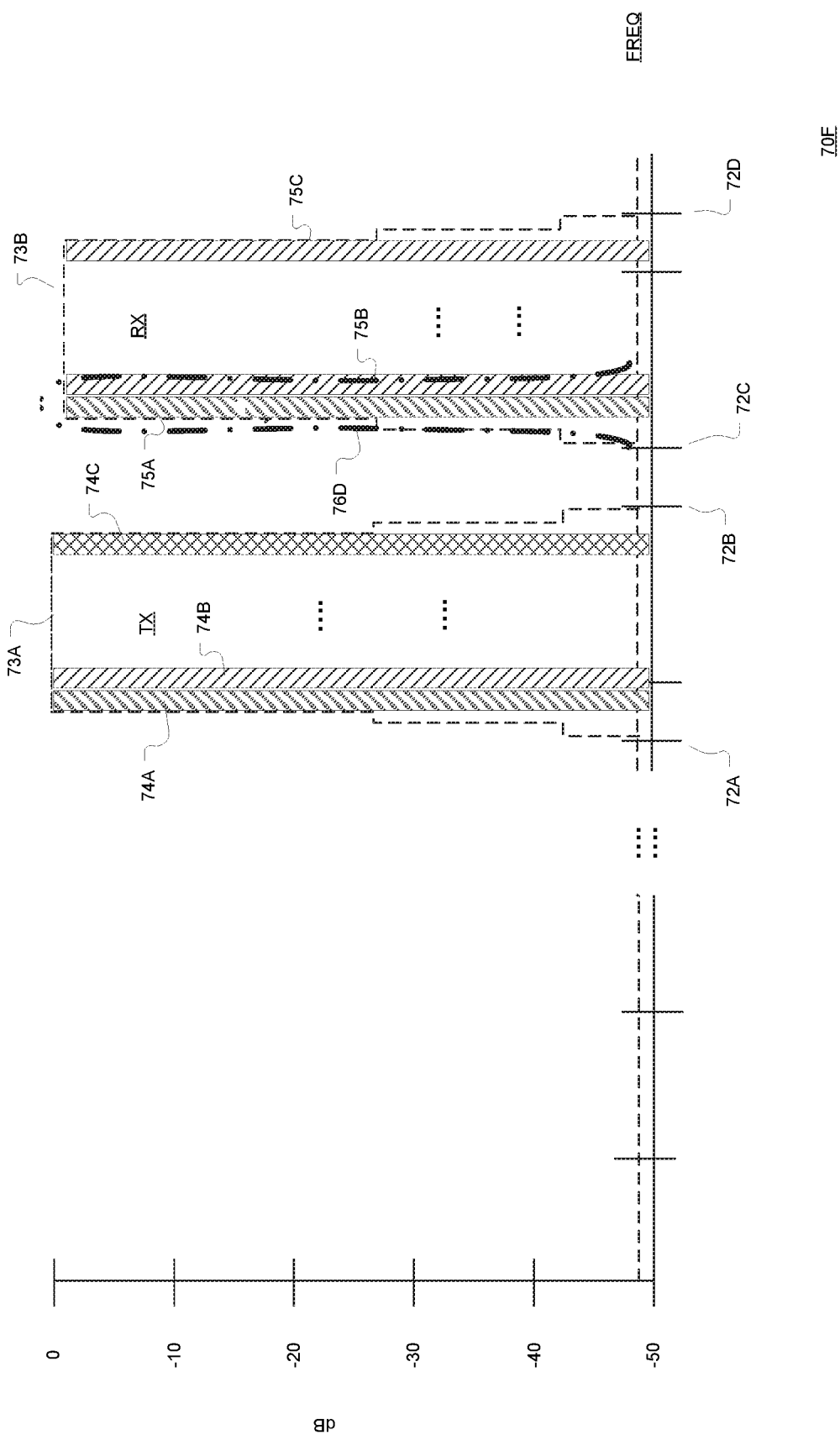
FIG. 1G is a simplified, partial diagram of a section of the RF channel configuration shown in FIG. 1B with a filter characteristic applied to a subunit or band of a second band according to various embodiments.

It may be desirable for a filter or duplexer module 20 to generate frequency characteristics 76C, 76D specific to one or more sub-unit or bands of a TX or RX band 73A, 73B such as shown in FIGS. 1F, 1G. Such duplexer modules 20 or filter modules may significantly suppress interface between TX and RX bands 73A, 73B and may be required for some communication protocols. In order to filter one or more sub-units 74A, 74B, 74C, 75A, 75B, 75C of a band 73A, 73B or different bands selectively (such as band I to V in a CDMA system), separate filters modules or duplexers may be required.

FIG. 2A is a block diagram of an electrical signal filter module 90A including resonators according to various embodiments. The module 90A includes three resonators 80A, 80B, and 80C, resistors 94A, 94B, and a signal generator 92A. In an embodiment, the signal generator 92A may represent a TX signal to be communicated via an antenna 50, the resistor 94A may represent the load of the TX signal, and the resistor 94B may represent the load of an antenna 50. In an embodiment, the resonators 80A, 80B, 80C form a T-shape between the signal to be transmitted and the antenna (source load 94A and antenna load 94B). The resonators 80A, 80B, 80C may be SAW devices. A resonator 80A, 80B, 80C commonly has a fixed resonate frequency and anti-resonate frequency similar to a pass band and stop band of a common inductor-capacitor type filter.

An acoustic wave resonator 80A, 80B, 80C may be represented by corresponding electrical components according to various embodiments such as shown in FIG. 2B. As shown in FIG. 2B, a resonator 80A may be represented by a first capacitor 82A in parallel with a series coupling of an inductor 86A, a second capacitor 82B, and a resistor 84A where the capacitors 82A, 82B may have a capacitance of Co, Cm, respectively, inductor 86A may have an inductance of Lm and the resistor 84A may have a resistance of Rm in an embodiment. Modeling of resonators or SAW devices via electrical components is described in the reference entitled "Surface Acoustic Wave Devices in Telecommunications: Modeling and Simulation" by Ken-Ya Hashimoto, published by Springer on Jul. 31, 2000, ISBN-10: 354067232X and ISBN-13: 978-3540672326.

The Cm and Lm may be related to the elasticity and inertia of an AW device 80A, 80B, 80C. Co may represent the effective capacitance of the transverse electric fingers in the piezoelectric material of the AW 80A, 80B, 80C. Rm may represent the heat generated by mechanical motion in the AW 80A, 80B, 80C (the effective quality or Q limiter of the AW). Using the values Co, Cm, Lm, and Rm for first capacitor 82A, inductor 86A, second capacitor 82B, and resistor 84A, the resonance $w_r$ and the anti-resonance $w_a$ of an acoustic wave (AW) device 80A may be defined by the following equations:

$$w_r \equiv \frac{1}{\sqrt{L_m C_m}} \text{ and } w_a \equiv \frac{1}{\sqrt{L_m C_m C_o / (C_m + C_o)}}.$$

Using these equations AW 80C may form a short path and the resultant filter formed by the AW 80A, AW 80B, and AW 80C may have a pass band about the $w_r$ of 80A, 80B and $w_a$ of 80C (77C as shown in FIG. 1D), a first notch before the pass band at $w_r$ of 80C (77A in FIG. 1D), and a second notch after the pass band at $w_a$ of 80A, 80B (77B in FIG. 1D). These resonators AW 80A, 80B, 80C resonate and anti-resonate values $w_r$ and $w_a$ are fixed as a function of the physical characteristics of the AW 80A, 80B, 80C.

It may be desirable to shift the $w_r$ and $w_a$ of AW 80A, 80B, 80C to shift the pass-band or stop-bands to tune to specific sub-bands 74A, 74B, 74C, 75A, 75B, 75C or different TX or RX bands 73A, 73B. It is also noted that the $w_r$ and $w_a$ of AW 80A, 80B, 80C may vary as a function of the temperature of the AW, respectively. In such an embodiment it may be desired to correct for temperature variations accordingly. It is also noted that the $w_r$ and $w_a$ of AW 80A, 80B, 80C may vary due to manufacturing variances, respectively. In such an embodiment it may be desirable to correct for manufacturing variances accordingly. In an embodiment various capacitors 98A may be coupled in parallel or serially with a AW 80A, 80B, 80C to be able to shift, tune, or modulate the $w_r$ or $w_a$ of the AW 80A, 80B, 80C and accordingly its pass-band and stop-band(s).

Figure 2E:
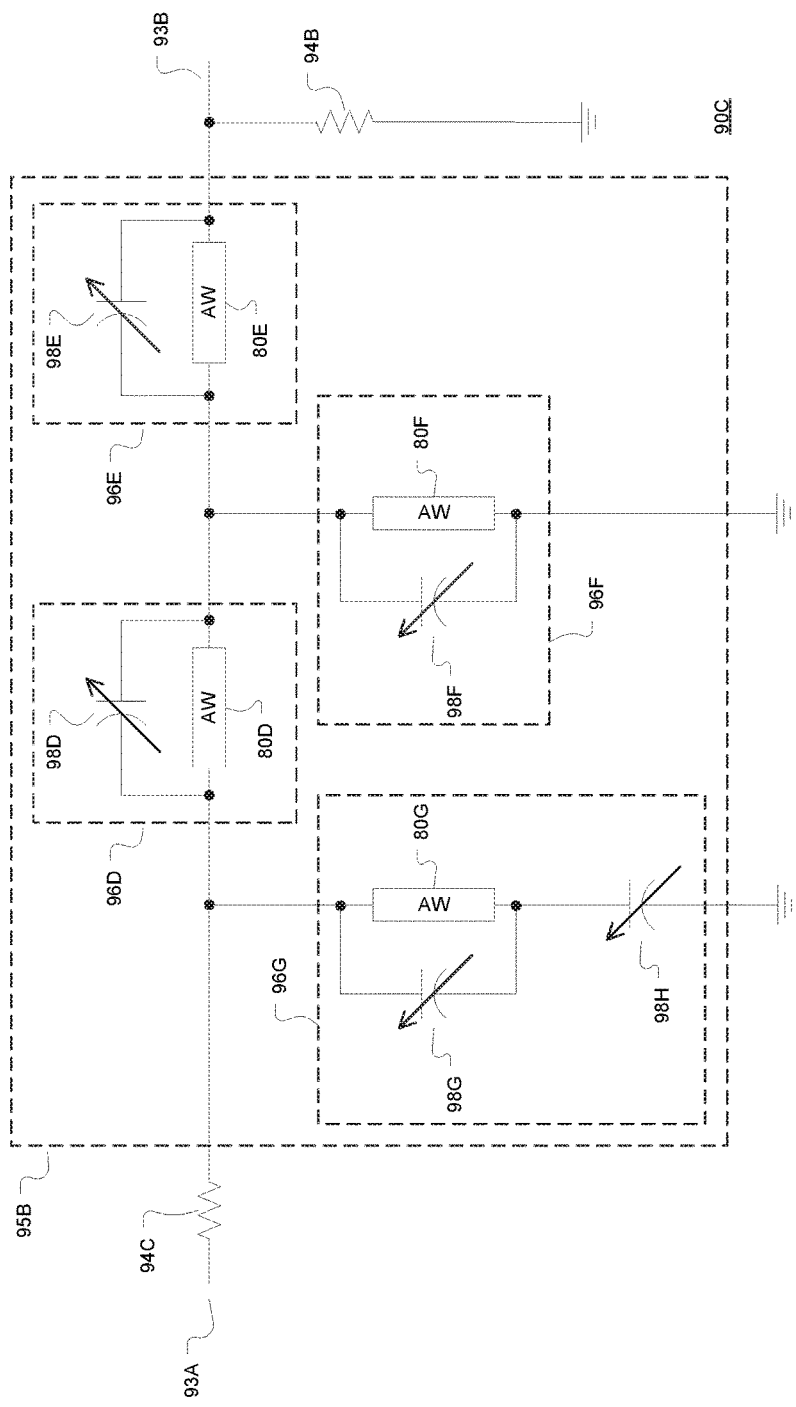
Figure 2I:
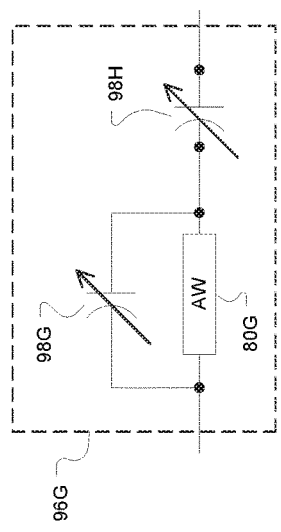

FIGS. 2C and 2I are block diagrams of modulated or tunable resonator modules 96A, 96G according to various embodiments. The module 96A shown in FIG. 2C may include a variable capacitor 98A in parallel with an AW 80A. Based on the above equations, the anti-resonate $w_a$ may be modulated by the variable capacitor 98A having a capacitance $C_v$ (effective Co of an AW may be Co+$C_v$ for module 96A). The module 96G shown in FIG. 2I may include a variable capacitor 98G in parallel with an AW 80G and a variable capacitor 98H in series with the AW 80G. Based on the above equations, the anti-resonate $w_a$ may be modulated by the variable capacitor 98G having a capacitance $C_{v1}$ and the variable capacitor 98H having a capacitance $C_{v2}$. Similarly, the resonate $w_r$ may be modulated by the variable capacitor 98H having the capacitance $C_{v2}$.

FIG. 2D is a block diagram of an electrical signal filter module 90B including tunable or modulated resonator modules 96A, 96B, 96C according to various embodiments. The module 90B is similar to module 90A shown in FIG. 2A in that it includes three resonators 80A, 80B, and 80C in a similar T-configuration where the resonators 80A, 80B, 80C have a fixed resonate frequency and anti-resonate frequency similar to a pass band and stop band of a common inductor-capacitor type filter where the anti-resonate frequency for each resonator 80A, 80B, 80C is modulated or tuned by a variable capacitor 98A, 98B, 98C.

As noted above AW 80C may form a short path and the resultant filter formed by the AW 80A, AW 80B, and AW 80C may have a pass band about the $w_r$ of 80A, 80B and $w_a$ of 80C (77C as shown in FIG. 1D), a first notch before the pass band at $w_r$ of 80C (77A in FIG. 1D), and a second notch after the pass band at $w_a$ of 80A, 80B (77B in FIG. 1D). By varying the capacitors 98A, 98B, 98C, the pass band 77C and second notch 77B shown in FIG. 1D may be varied.

FIGS. 2E-H are block diagrams of tunable filter modules including tunable or modulated resonators or AW that may be employed for various operations including filtering an RX band 73B or sub-band 75A, 75B, 75C in an embodiment. As shown in FIG. 2E the tunable filter module 90C may include tunable resonate or AW modules 96D, 96E, 96F, and 96G, resistor 94C, and resistor 94B. Similar to above, resistor 94B may represent the antenna 50 load and resistor 94C may represent a signal (RX or TX) load. In an embodiment, the module 90C may include two tunable shorts 96G and 96F and two tunable pass AW modules 96D, 96E in series. Module 90C is similar to module 90A (T-configuration) with the addition of a second short 96G that includes a capacitor 98G designed to effect the anti-resonate frequency and a second tunable capacitor 98H in series with the AW 80G to further effect the resonate frequency of the AW 80G.

Figure 2F:
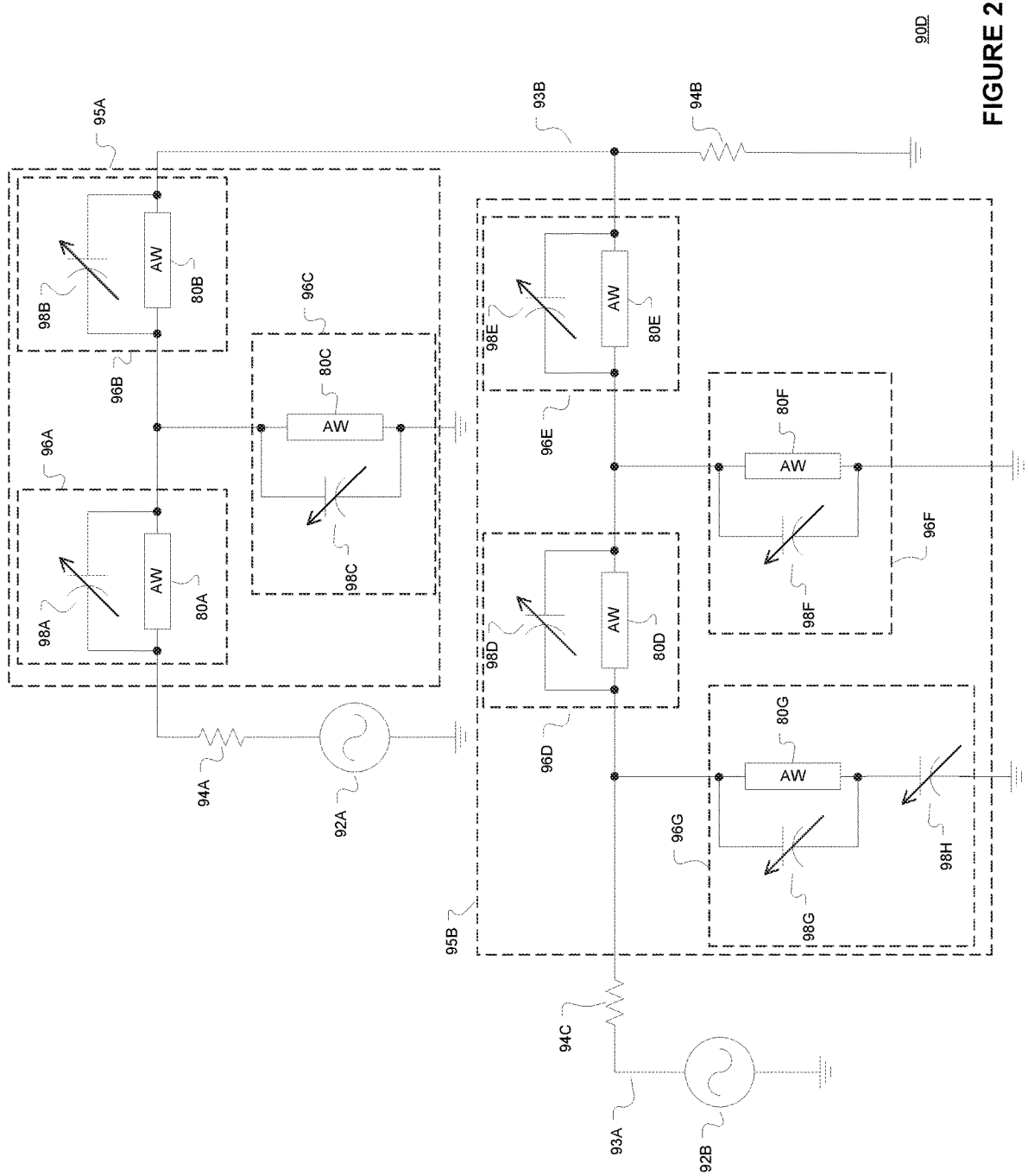

FIG. 2F is a block diagram of an electrical signal filter module 90D including a first tunable filter module 95A and a second tunable filter module 95B according to various embodiments. The module 90D includes a first filter module 95B, a second filter module 95B, a first signal source 92A and a resistor load 94A, a second signal source 92B and resistor load 94C, and antenna load resistor 94B. Module 95A is similar to module 90B and module 95B is similar to module 90C where module 95A is a T-configuration module and module 95B is a modified T-configuration with a second short (with a series tunable capacitor 98H). In an embodiment, the module 90D may be employed as a tunable duplexer 20 in FIG. 1A.

Figure 2G:
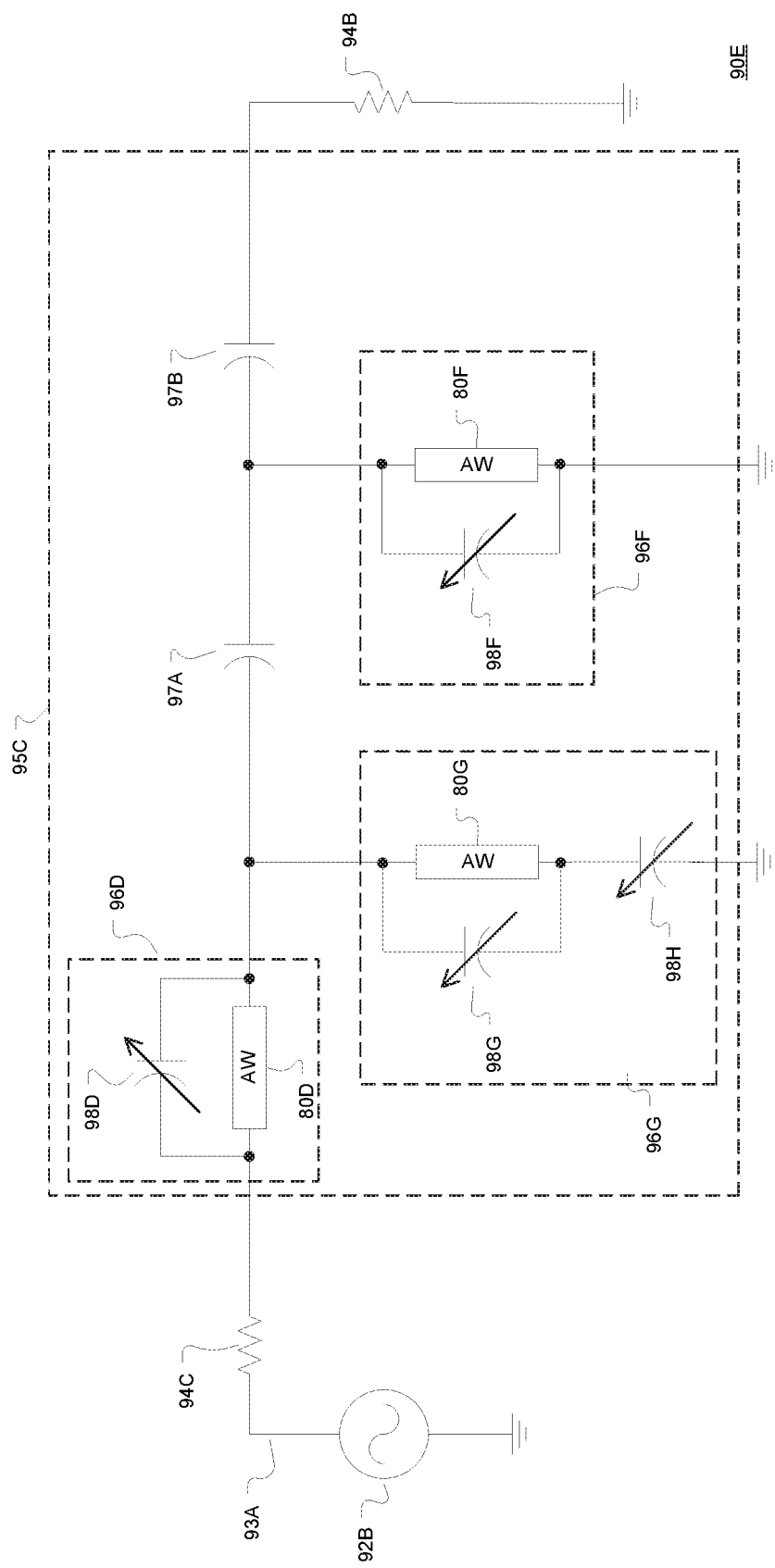
Figure 2H:
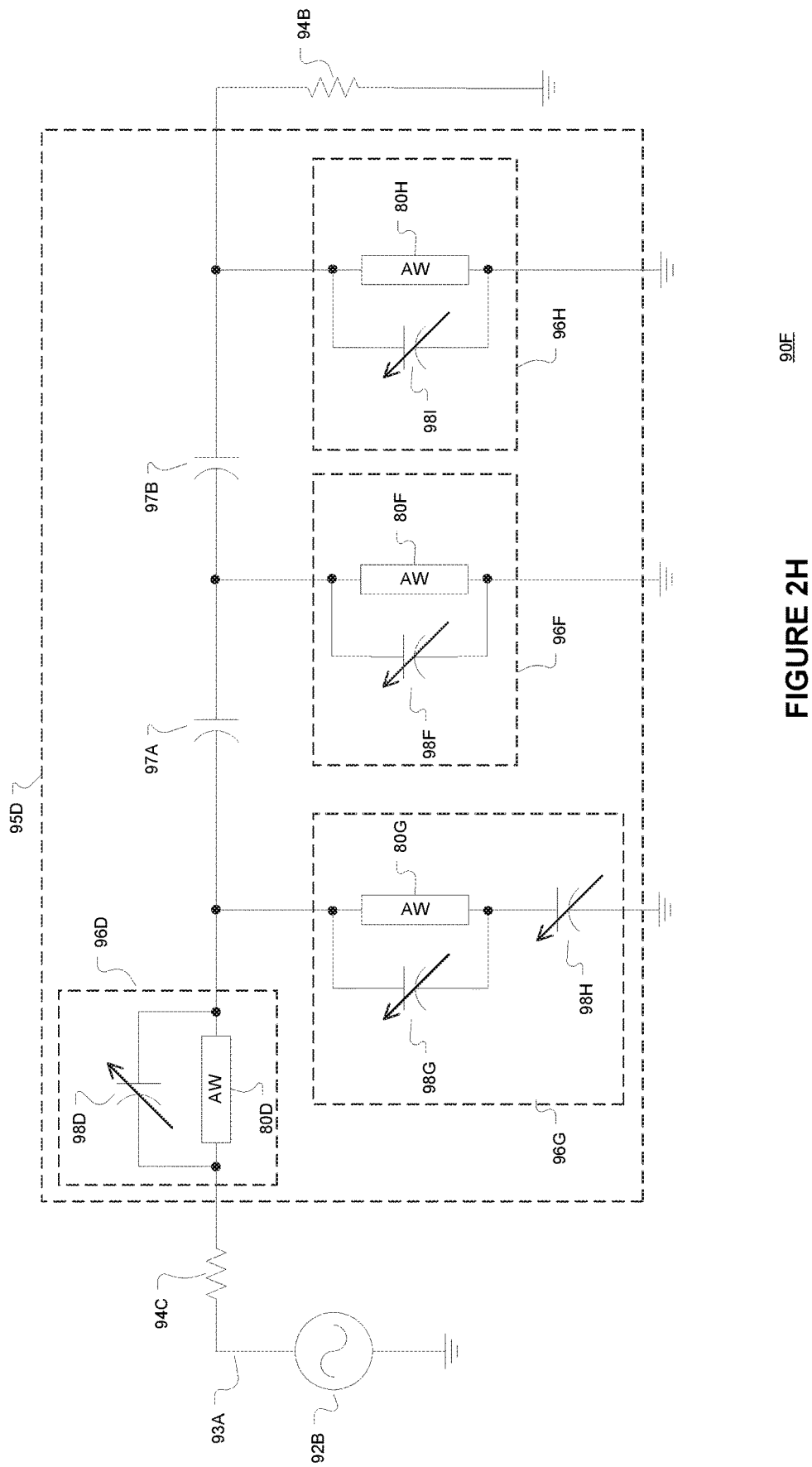
Figure 2J:
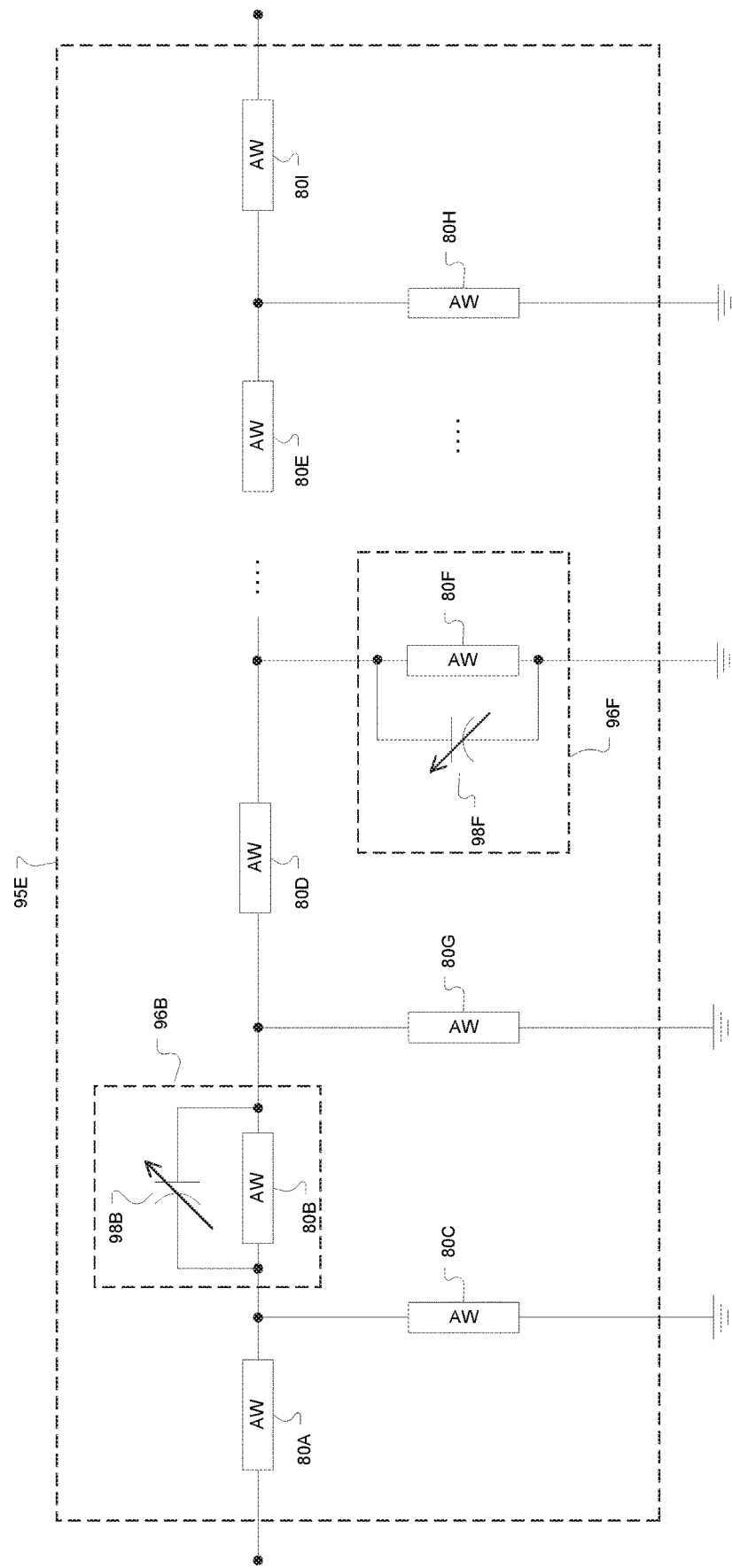

FIGS. 2G, 2H, 2J are block diagrams of tunable filter modules 95C, 95D, 95E including tunable or modulated resonators or AW that may be employed for various operations including filtering a RX band 73B or sub-band 75A, 75B, 75C in an embodiment. As shown in FIG. 2G the tunable filter module 90E may include tunable resonate or AW modules 96D, 96G, 96F, resistor 94C, resistor 94B, and effective capacitance 97A, 97B. Similar to above, resistor 94B may represent the antenna 50 load and resistor 94C may represent a signal (RX or TX) load and 92B a signal source. In an embodiment, the module 90E may include two shorts 96G and 96F and a single tunable AW module 96D in series with the loads 94C, 94B. Module 90E is similar to module 90D with the elimination of the second module 96E in series with the first module 96D.

As shown in FIG. 2H the tunable filter module 90F may include tunable resonate or AW modules 96D, 96G, 96F, 96H, tunable capacitor 98H, resistor 94C, resistor 94B, and effective capacitance 97A, 97B. Similar to above, resistor 94B may represent the antenna 50 load and resistor 94C may represent a signal (RX or TX) load and 92B a signal source. In an embodiment, the module 90F may include three tunable shorts 96G, 96F, and 96H and a single tunable AW module 96D in series with the loads 94C, 94B. Module 90F is similar to module 90F with the addition of a third short module 96H.

As shown in FIG. 2J the tunable filter module 95E may include tunable resonate AW modules 96B, 96F, and a plurality of AW modules 80A, 80C, 80D, 80E, 80G, 80H, 80I. In the filter module 95E, tunable resonate AW modules 96B, 96F, and a plurality of AW modules 80A, 80C, 80D, 80E, 80G, 80H, 80I form a series of "T" sub-filters such as 80A, 96B, and 80C. As explained above each T sub-filter may create a frequency response with two passband (AW 80A, 96B) and a stopband (80C). In the embodiment one or more AW 80A to 80I may not be tunable (AW modules 80A, 80C, 80D, 80E, 80G, 80H, 80I in FIG. 2J) while one or more AW 80A to 80I may be tunable (80B and 80F in FIG. 2J). A tunable capacitor 98B, 98F may be coupled (in parallel) to an AW 80A to 80I when one or more AW 80A to 80I may be desirably tunable to modulate the AW 80A to 80I for temperature or process variations or provide frequency adjustments to the AW 80A to 80I.

FIG. 3A-3C are diagrams of capacitor modules according to various embodiments where the modules may be used as capacitors 98A to 98G (in parallel to an AW 80A to 80F) and 98H (in series with an AW 80G). As shown in FIG. 3C, the module 120C includes a single capacitor 104A. The capacitor 104A capacitance may be determined after the physical characteristics of an AW 80A to 80G are measured (to account for process variations or operating temperature variance). The capacitor 104A capacitance may also be varied for different TX or RX bands 73A, 73B to be filtered by the module 96A to 96G including the module 120C.

As shown in FIG. 3B, the module 120B includes the capacitor 104A and a second capacitor 104B and resistor 106A parallel to the first capacitor 104A. The additional capacitor 104B may further shift the AW 80A to 80G anti-resonate or resonate frequency to tune to a second band or sub-band. As shown in FIG. 3A, the module 120A includes the capacitor 104A, the second capacitor 104B and a resistor 106A parallel to the first capacitor 104A, and a third capacitor 104C and a second resistor 106B parallel to the first capacitor 104A (and second capacitor 104B and resistor 106A). The additional capacitor 104C may still further shift the AW 80A to 80G anti-resonate or resonate frequency to tune to a third band or sub-band when the modules 120A to 120D are employed in parallel or series with a AW 80A to 80G as shown in modules 96A to 96G.

FIG. 3D is a diagram of a tunable capacitance module according to various embodiments. As shown in FIG. 3D, the module 120D includes the capacitor 104A, the second capacitor 104B and resistor 106A selectively parallel (via a switch 105A) to the first capacitor 104A, and a third capacitor 104C and a second resistor 106B selectively parallel (via the second switch 105B) to the first capacitor 104A (and second capacitor 104B and resistor 106A). The module 120D may shift the AW 80A to 80H anti-resonate or resonate frequency to tune to a first, second, or third band or sub-band as a function of the switches 105B, 105A when coupled in parallel or series with the AW 80A to 80H as shown in modules 96A to 96G. The module 120D may also shift an AW 80A to 80H anti-resonate or resonate frequency to account for temperature or manufacturing variants.

Figure 3E:
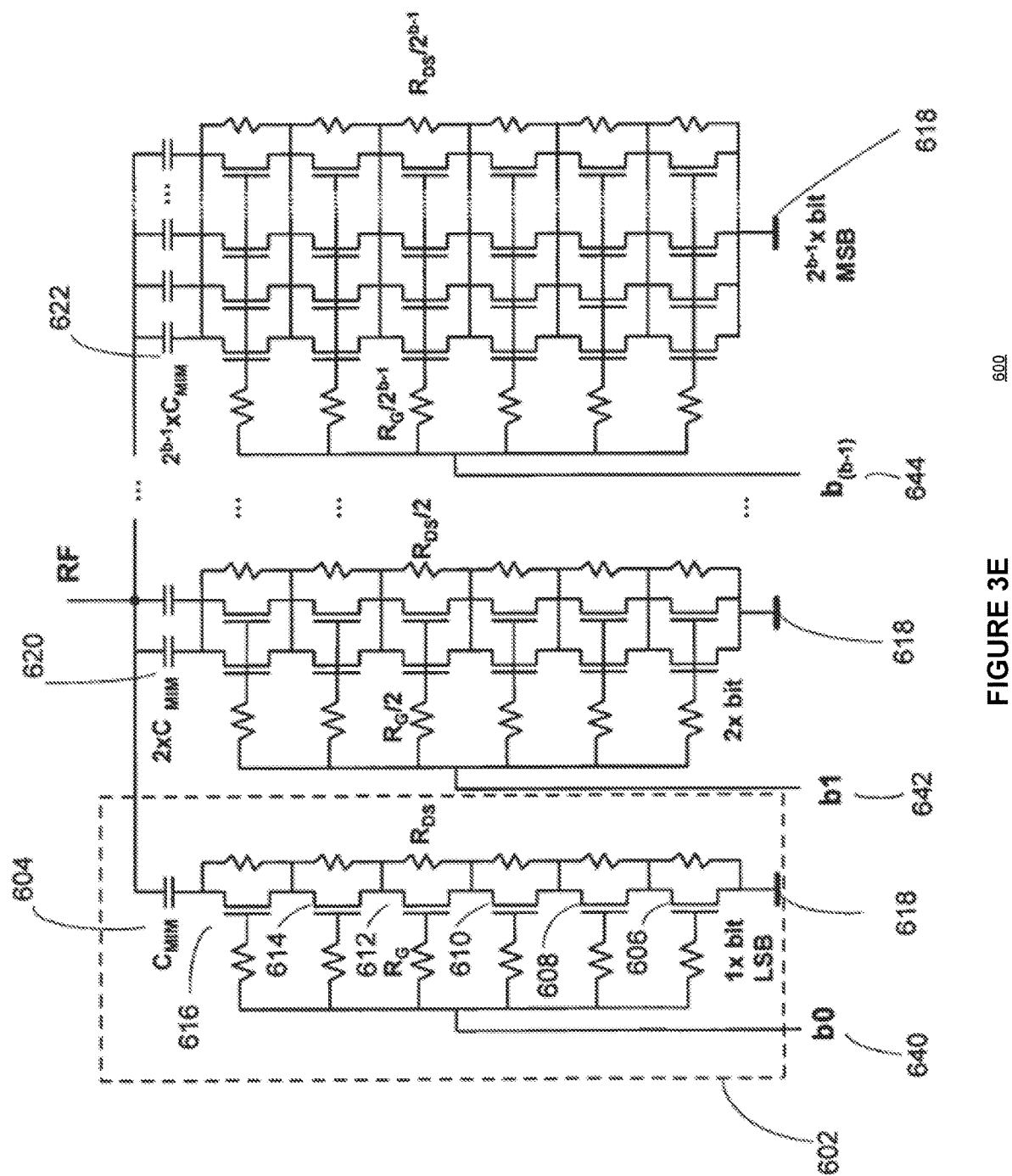
FIG. 3E is a diagram of a tunable capacitor module that may be coupled to AW according to various embodiments.

FIG. 3E is a diagram of a tunable capacitor module 600 according to various embodiments. The tunable capacitor module 600 includes a plurality of capacitor banks 602, each switchable in operation via control lines 640, 642, and 644. In an embodiment each successive capacitor bank has twice the capacitance of the previous bank 602 so that each control line 640, 642, and 644 is a digit of a binary number. In an embodiment, the capacitor banks are formed of CMOS FETs having their source and drain coupled via a resistor $R_{DS}$ to effectively form capacitors in parallel. Each gate of the CMOS FETs 606, 608, 610, 612, 614 is coupled to the respective control lines 640, 642, 644. Accordingly a tunable AW module 96A to 96G using the tunable capacitor 600 (in series or parallel) may have $N^2-1$ (where N is the number of control lines) different tunable anti-resonance or resonate frequencies based on the $N^2-1$ effective capacitances of the module 600. Further details of digitally tunable capacitors are recited in commonly assigned PCT application entitled "METHOD AND APPARATUS FOR USE IN DIGITALLY TUNING A CAPACITOR IN AN INTEGRATED CIRCUIT DEVICE", Attorney Docket—PER-024, Filed Mar. 2, 2009, and International Application Number PCT/US2009/001358, the entire contents of which are hereby incorporated herein by reference.

Figure 4:
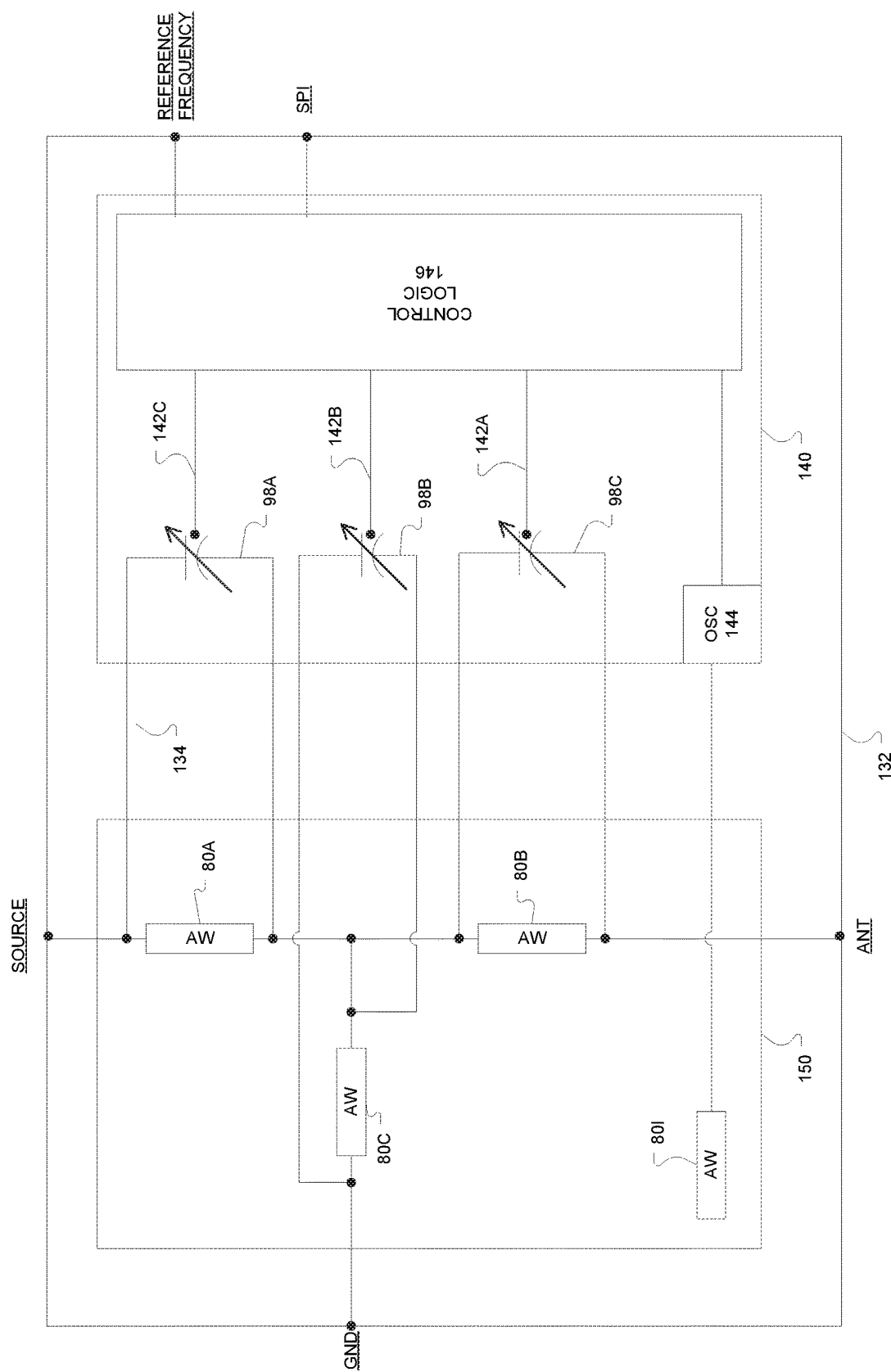
FIG. 4 is a block diagram of fabrication configuration for a tunable filter module including tunable resonators according to various embodiments.

FIG. 4 is a block diagram of a configuration of a tunable filter module 130 including tunable resonators according to various embodiments. The filter module 130 may have a common circuit board or module 132, a resonance or AW board or module 150, and electrical component board or module 140. The AW module 150 may include two or more resonators or AW 80A, 80B, 80C, 80I. In an embodiment, the AW 80A, 80B, 80C may form the T-configuration 90A shown in FIG. 2A. The AW module 150 may further include a bias AW 80I.

The electrical component board or module 140 may include three tunable capacitors 98A, 98B, 98C, a control logic module 146, and an oscillator 144. Each tunable capacitor 98A, 98B, 98C may be coupled in parallel to an AW 80A, 80B, 80C, respectively via two conductance lines 134 between the modules 140, 150. Accordingly, the combination of an AW 80A and a tunable capacitor 98A may form a tunable AW module 96A as shown in FIG. 2B. The oscillator 144 may be coupled to the bias AW 80I via a conductance line 134. The effective resonate frequency of the bias AW 80I may modulate the oscillation of the oscillator 144 in a known and measurable way.

The control logic module 146 may receive control signals SPI for controlling the capacitance of tunable capacitors 98A, 98B, and 98C and a stable clock or reference frequency (such a phase lock loop signal). In an embodiment, the AW 80I resonate or anti-resonate frequencies may vary as function of temperature. Similarly the oscillator 144 frequency may vary as the AW 80I resonate or anti-resonate frequencies fluctuate with temperature. The control logic 146 may monitor the change of oscillator frequency 144 via the stable reference frequency signal. The control logic 146 may then modulate the tunable capacitor's capacitance based on known deltas to account for the oscillator frequency and thereby corresponding AW 80A, 80B, 80C resonate or anti-resonate frequencies. In an embodiment, the delta may be added to the SPI control signals as needed to adjust for temperature effects of the AW 80A, 80B, 80C.

Figure 5B:
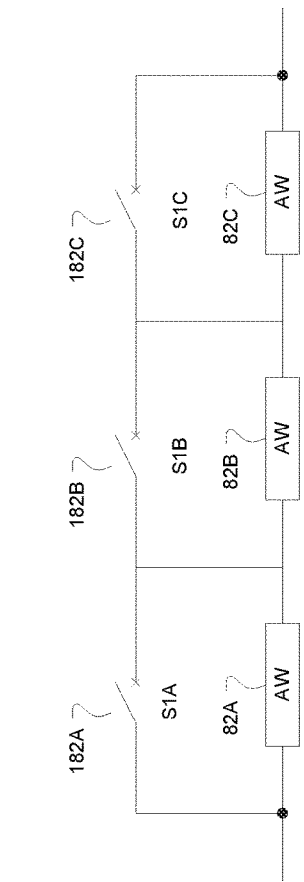
FIGS. 5B-5D are block diagrams of switchable resonator modules according to various embodiments.
Figure 5C:
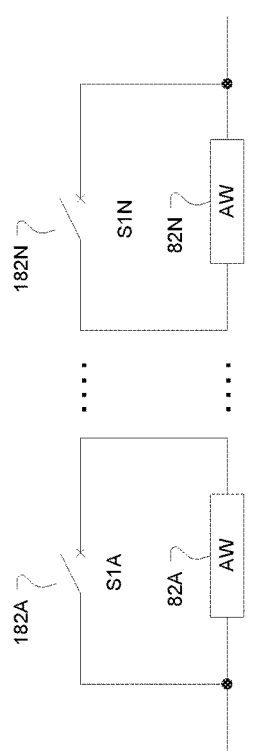
Figure 5A:
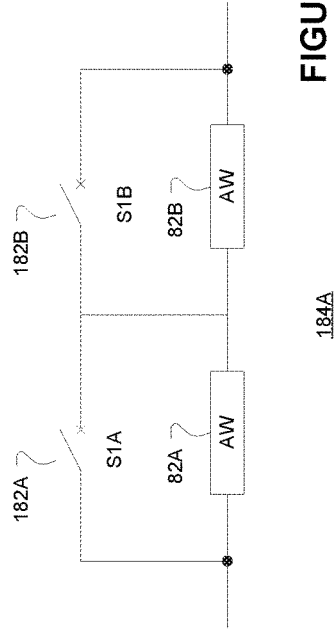
FIG. 5A is a block diagram of an electrical signal filter module including switchable resonators according to various embodiments.

FIG. 5A is a block diagram of an electrical signal filter module 190A including switchable resonator modules (SRM) according to various embodiments. The module 190A includes three switchable resonators modules (SRM) 180A, 180B, and 180C, resistors 94A, 94B, and a signal generator 92A. In an embodiment, the signal generator 92A may represent a TX signal to be communicated via an antenna 50, the resistor 94A may represent the load of the TX signal, and the resistor 94B may represent the load of an antenna 50. In an embodiment, the switchable resonators modules (SRM) 180A, 180B, 180C may form a T-shape between the signal to be transmitted and the antenna (source load 94A and antenna load 94B). The switchable resonators modules (SRM) 180A, 180B, 180C may include one or more resonator devices or modules where one or more of the modules may include switchable resonators. The one or more resonators may have a fixed resonate frequency and anti-resonate frequency similar to a pass band and stop band of a common inductor-capacitor type filter.

Figure 5D:
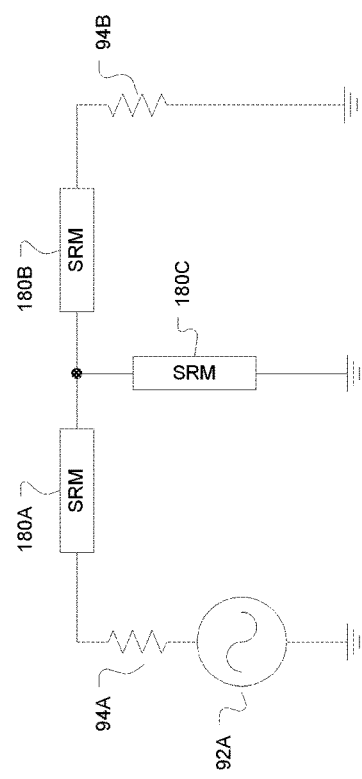

FIG. 5B to 5D are block diagrams of SRM 184A to 184C according to various embodiments. As shown in FIGS. 5B to 5D, a resonator module 184A, 184B, 184C may include several (acoustic wave) resonators 82A to 82N where the resonators 82A to 82N may be bypassed or activated via one or more switches 182A to 182N.

In FIG. 5B a switchable resonator module (SRM) 184A may include two resonators 82A, 82B, and two switches 182A, 182B. The resonators 82A, 82B are coupled in series. A switch 182A, 182B may be coupled in parallel to resonator 82A, 82B, respectively. When a switch 182A, 182B is closed, the corresponding resonator 82A, 82B may be bypassed and inoperative. When a switch 182A, 182B is open, the corresponding resonator 82A, 82B may be active. In an embodiment each switch 182A, 182B may be controlled by a control signal S1A, S1B. In an embodiment, resonator 82A and 82B may operate exclusively or in tandem as a function of the control signals S1A, S1B. In a further embodiment a single signal may control the switches 182A, 182B where in a first signal state switch 182A is open and switch 182B is closed and in a second signal state switch 182A is closed and switch 182B is open.

In FIG. 5C the switchable resonator module (SRM) 184B includes three resonators 82A, 82B, 82C and three switches 182A, 182B, and 182C. The resonators 82A, 82B, 82C are coupled in series. A switch 182A, 182B, 182C may be coupled in parallel to a resonator 82A, 82B, 82C, respectively. When a switch 182A, 182B, 182C is closed the corresponding resonator 82A, 82B, 82C may be bypassed and inoperative. Conversely when a switch 182A, 182B, 182C is open, the corresponding resonator 82A, 82B, 82C may be active. Each switch 182A, 182B, 182C may be controlled by an independent control signal S1A, S1B, S1C. In an embodiment, resonators 82A, 82B, and 82C may operate exclusively or in various combinations as a function of the control signals S1A, S1B, S1C.

In FIG. 5D the switchable resonator module (SRM) 184C includes a plurality of resonators 82A to 82N and corresponding switches 182A to 182N. The resonators 82A to 82N may be coupled in series. A switch 182A to 182N may be coupled in parallel to each resonator 82A to 82N, respectively. When a switch 182A to 182N is closed the corresponding resonator 82A to 82N may be bypassed and inoperative. Similarly, when a switch 182A to 182N is open the corresponding resonator 82A to 82N may be active. Each switch 182A to 182N may be controlled by a control signal S1A to S1N. In an embodiment, the resonators 82A, 82B, and 82C may operate exclusively or in various combinations as a function of the control signals S1A to S1N.

Figure 5E:
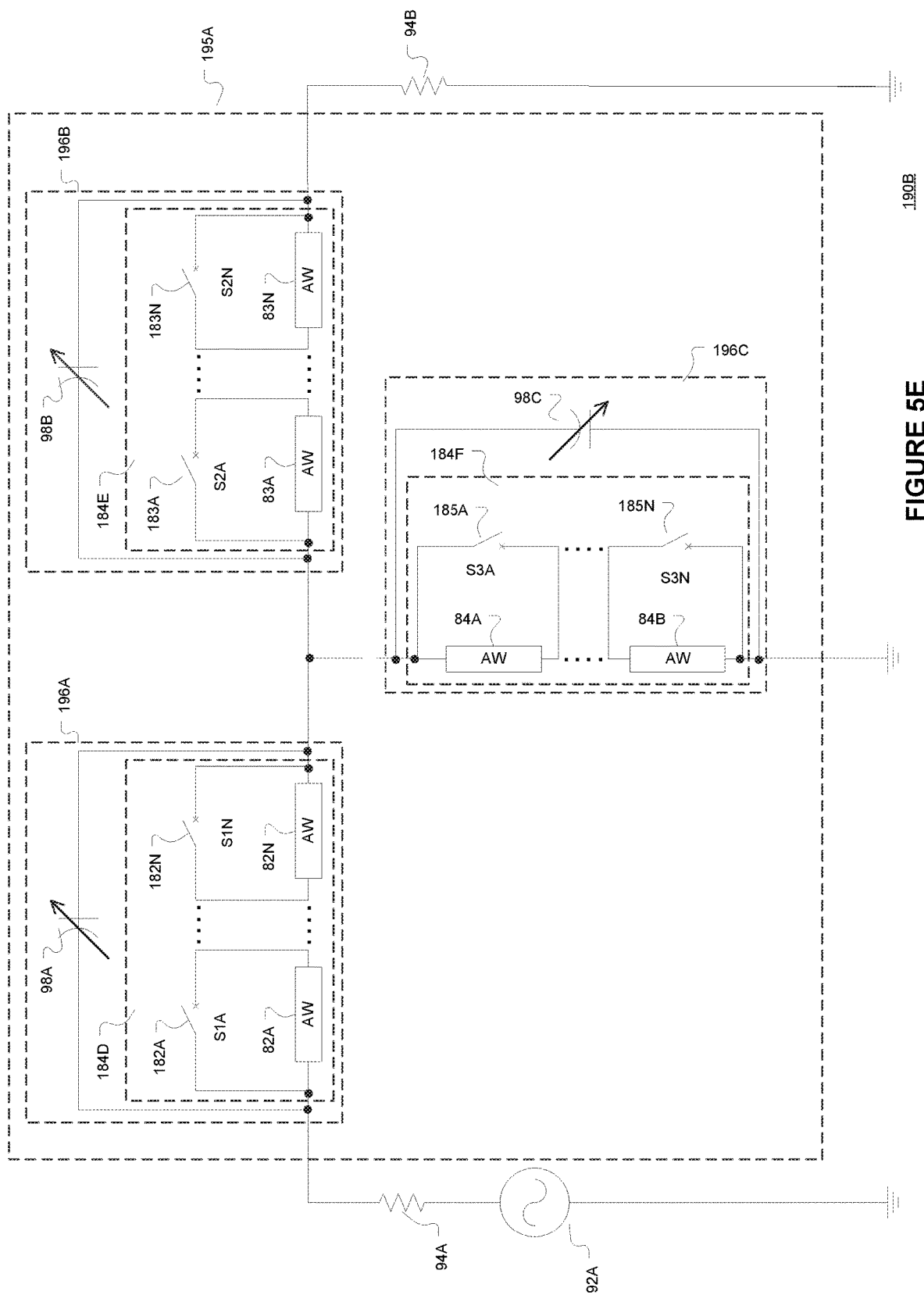
FIGS. 5E-5F are block diagrams of tunable, switchable filter modules including tunable or modulated, switchable resonators according to various embodiments.

FIG. 5E is a block diagram of a modulated or tunable resonator module system 190B according to various embodiments. The tunable resonator module system 190B includes several tunable resonator modules 196A, 196B, 196C, forming a T configuration similar to FIG. 5A. Each tunable resonator module 196A, 196B, 196C may include a variable capacitor 98A, 98B, 98C coupled in parallel with a SRM 184D, 184E, 184F. In each tunable modulator 196A, 196B, 196C, the variable capacitor 98A, 98B, 98C may modulate the anti-resonant frequency $w_a$ of corresponding active resonators 82A to 82N, 83A to 83N, and 84A to 84N based on the capacitor's selected capacitance $C_v$ (effective capacitance $C_e$ of an AW device may be equal to $C_0+C_v$ for a module 196A). In an embodiment, the variable capacitor 98A, 98B, 98C may module the anti-resonate $w_a$ for each resonator 82A to 82N, 83A to 83N, and 84A to 84N not bypassed by switches 182A to 182N, 183A to 183B, and 185A to 185N where the switches are controlled by switch control signals S1A to S1N, S2A to S2N, and S3A to S3N.

In an embodiment each resonator 82A to 82N, 83A to 83N, and 84A to 84N may have a different resonance in each respective SRM 184D, 184E, and 184F. The different resonances of the SRM 184D, 184E, and 184F may enable a system 190B to tune to different channels (different resonance frequencies) as shown in FIGS. 6A to 6F for frequency responses 197A to 197F. In an embodiment, the variable capacitor 98A and 98B in parallel with the SRM 184D, 184E may only module or tune the anti-resonate $w_a$ of the active resonators 82A to 82N, 83A to 83N respectively. By selectively bypassing resonators 82A to 82N and 83A to 83N in the SRM 184D, 184E, the resonate frequency or effective pass-bands of the system 190B may be tuned in addition to the stop bands.

In an embodiment control signals SxN in each corresponding SRM 184D, 184E, 184F may be similarly opened or closed, e.g., control signals 182A, 183A, and 185A may be simultaneously opened or closed (coordinated between modules 184D, 184E, 184F). In a further embodiment the only one switch 182A to 182N, 183A to 183N, 185A, to 185N may be open at any time so only one resonator 82A to 82N, 83A to 83N, 84A, to 84N is active at any time. In an embodiment, the variable capacitor 98C in parallel with the SRM 184F may only module or tune the anti-resonate $w_a$ of the active resonators 82A to 82N, 83A to 83N respectively. By selectively bypassing resonators 84A to 84N, the anti-resonate frequency or effective pass-bands of the SRM 196C may be tuned in addition to the stop bands.

Figure 5F:
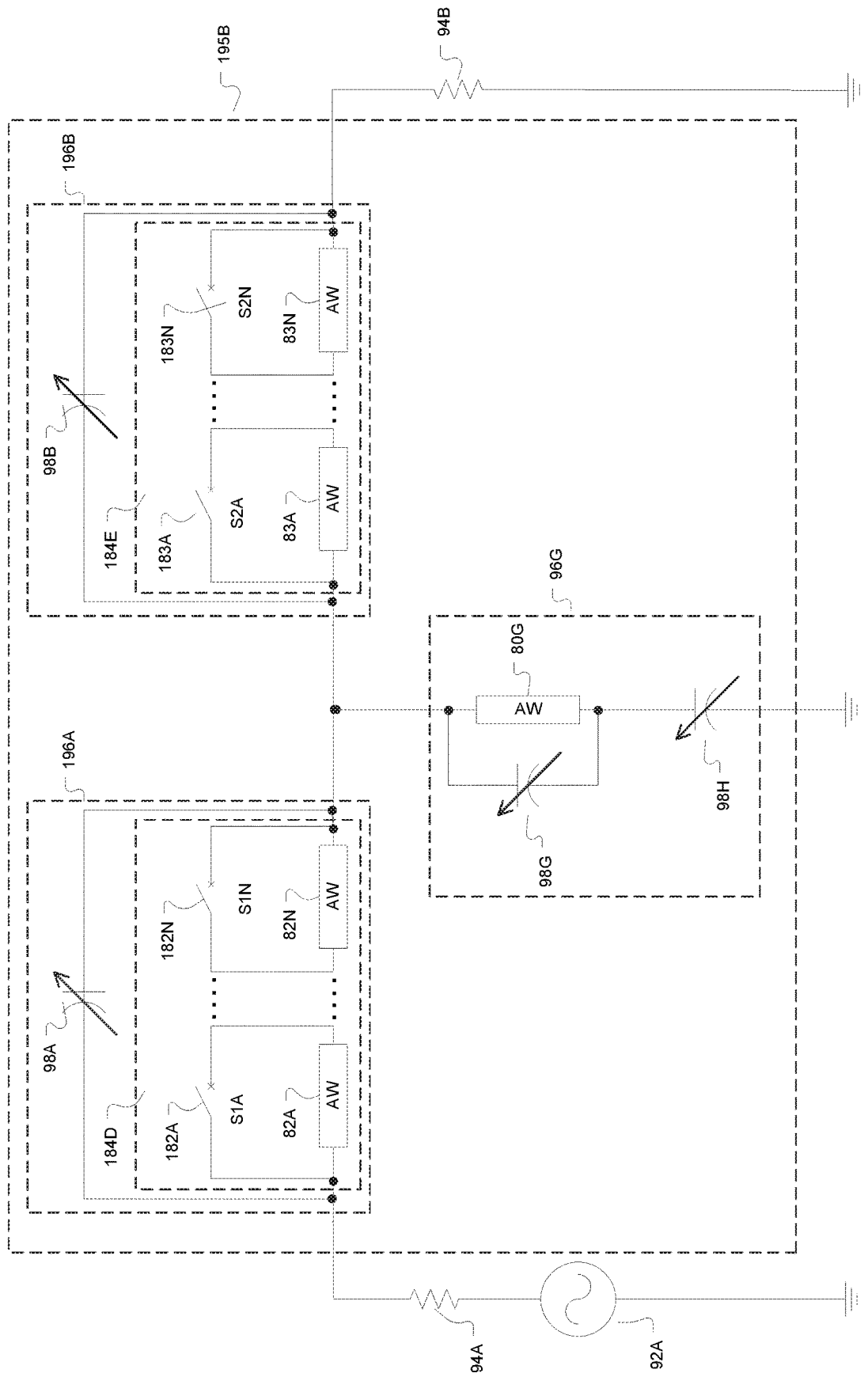

FIG. 5F is similar to FIG. 5E except the tunable module 196C is replaced by the module 96G described with respect to FIGS. 2E and 2I. The module 96G may include a variable capacitor 98G in parallel with an AW 80G and a variable capacitor 98H in series with the AW 80G. Accordingly, the anti-resonate $w_a$ of 96G may be modulated by the variable capacitor 98G having a capacitance $C_{v1}$ and the variable capacitor 98H having a capacitance $C_{v2}$. Similarly, the resonate $w_r$ may be modulated by the variable capacitor 98H having the capacitance $C_{v2}$. Capacitor 98H may be subject to high voltages.

Figure 5G:
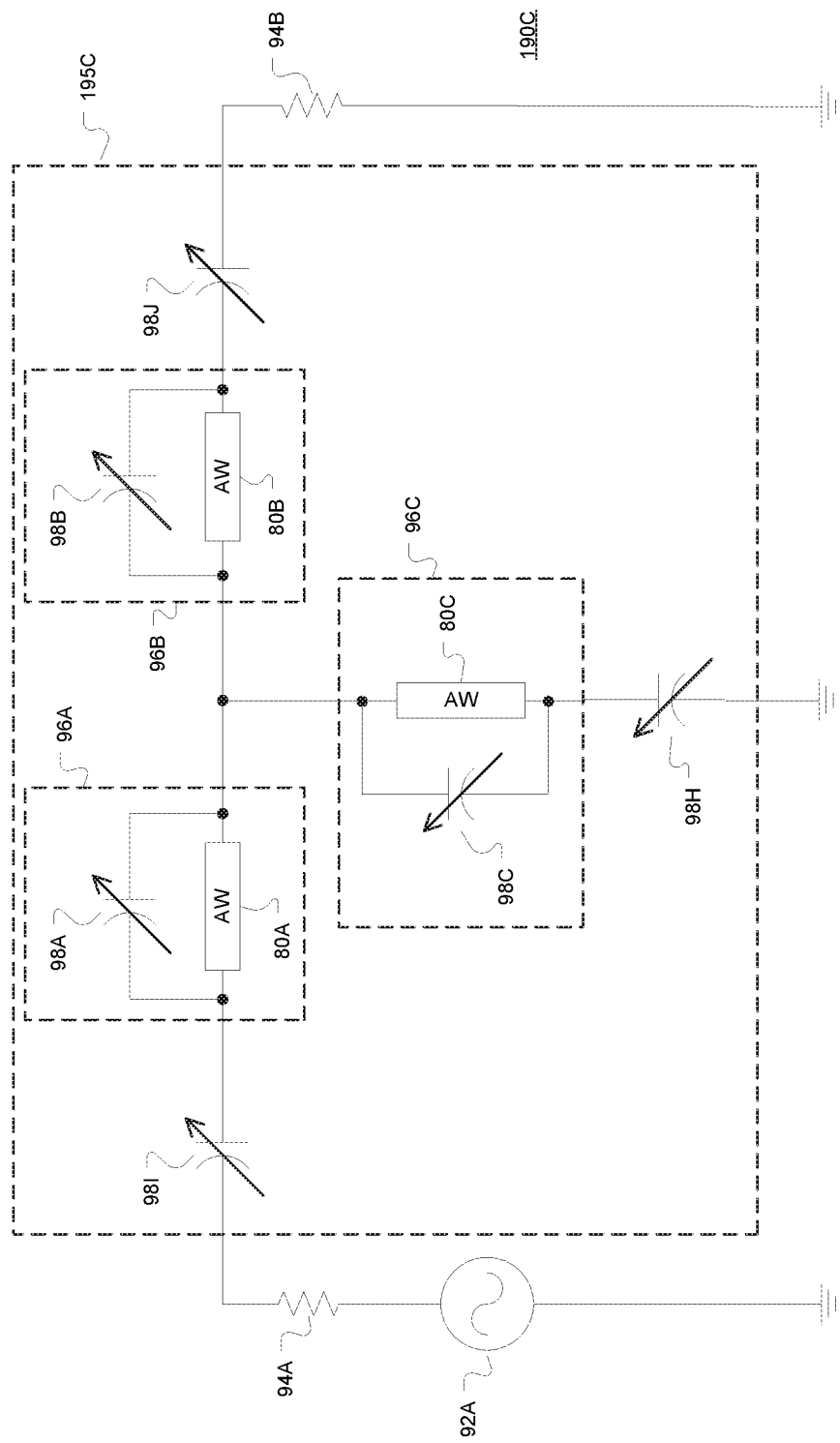
FIG. 5G is a block diagram of a tunable, switchable filter module including tunable or modulated resonators according to various embodiments.
Figure 6B:
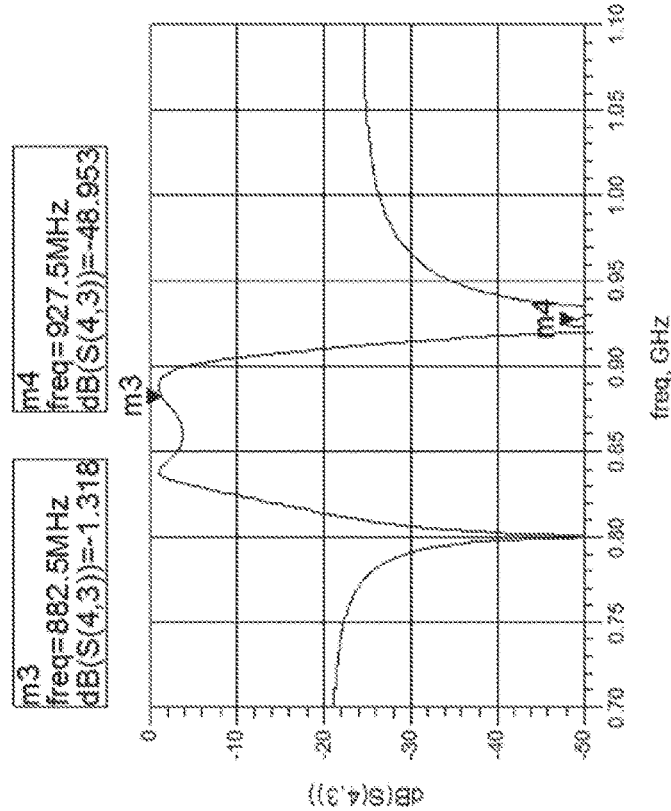
FIGS. 6A-6F are diagrams of filter responses of tunable, switchable filter modules according to various embodiments.
Figure 6A:
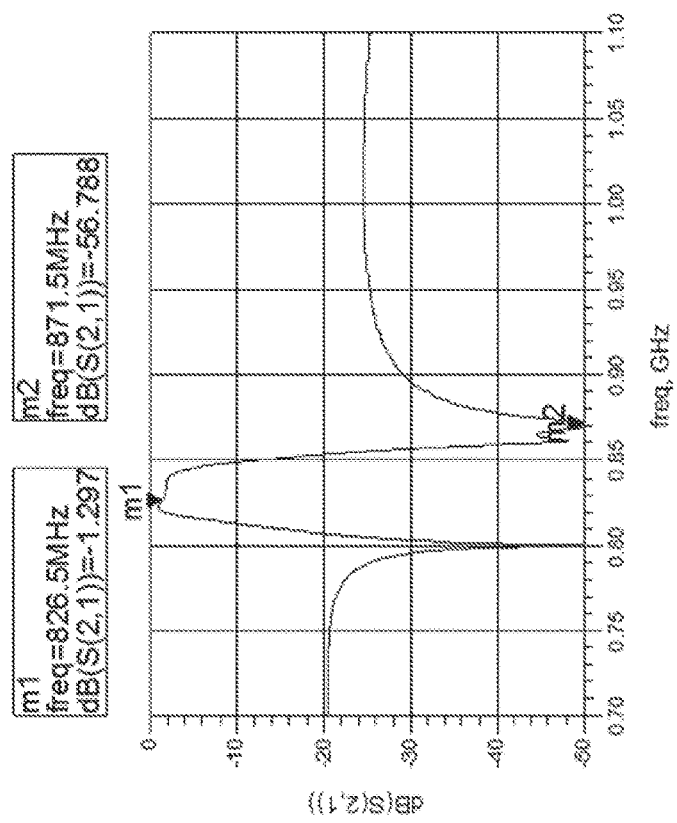
Figure 6D:
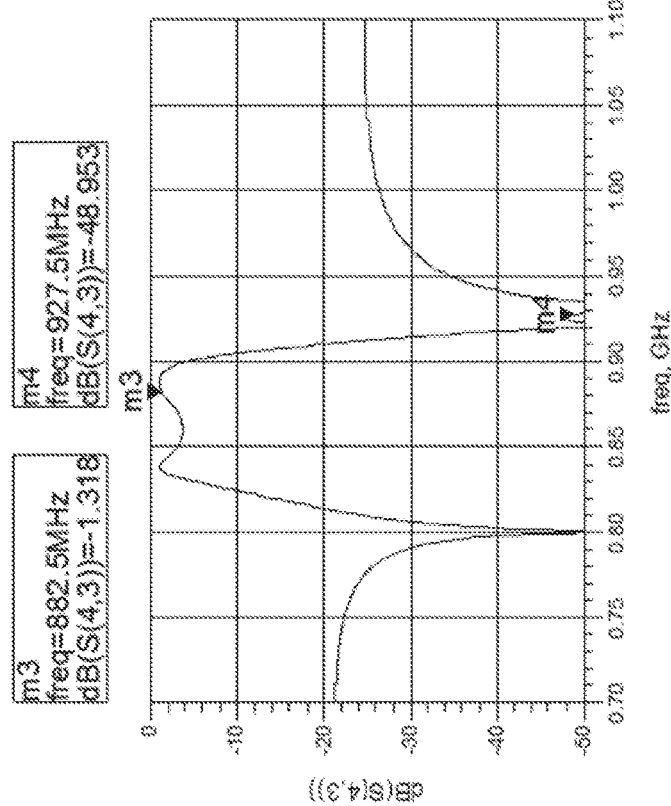
Figure 6C:
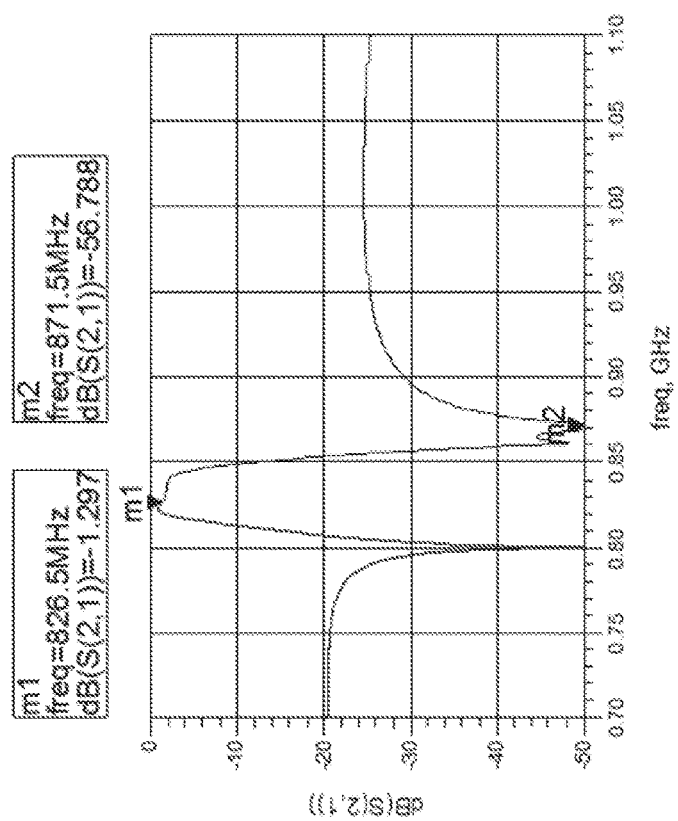
Figure 6F:
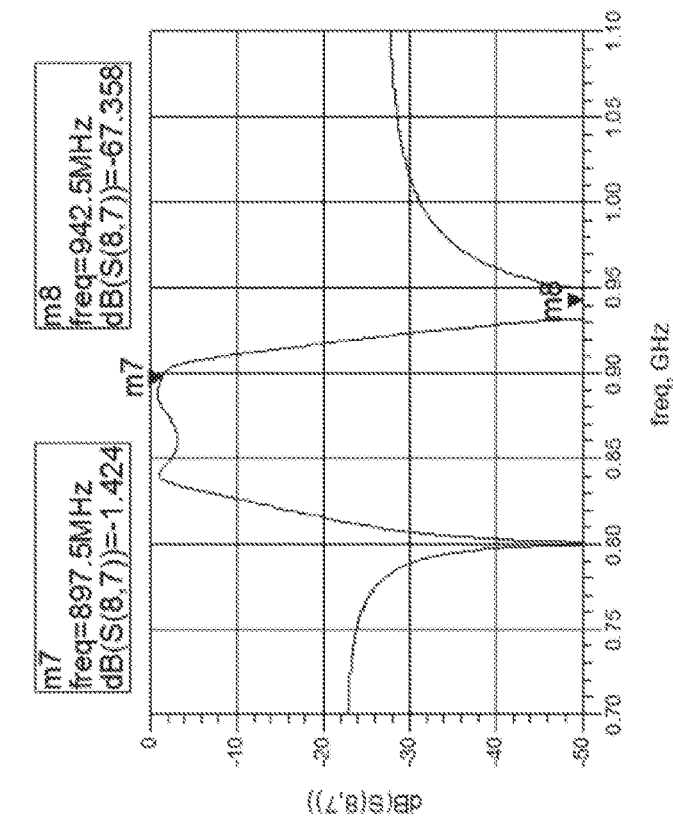
Figure 6E:
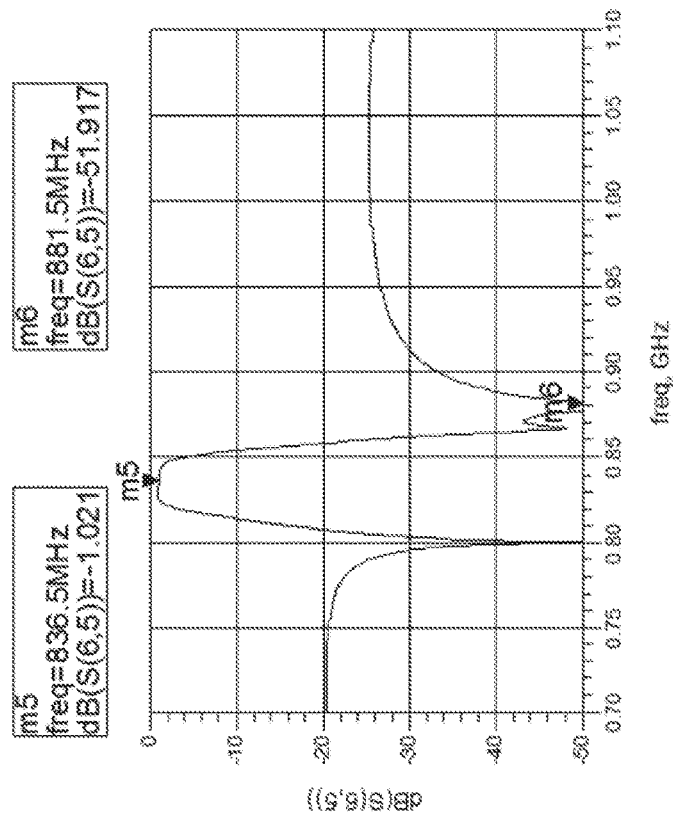

FIG. 5G is a block diagram of a modulated filter system 190C similar to FIG. 2D where the tunable resonators 96A, 96B, 96C may be further tuned by series coupled variable capacitors 98I, 98J, 98H. The variable capacitors 98I and 98J may modulate or tune the resonate frequencies of the resonators 80A, 80B, respectively. Such modulation may enable the system 190C to tune different pass-bands and stop-bands as a function of the tunable capacitors 98A, 98B, 98C, 98I, 98J, and 98H. The tunable capacitors 98I, 98J in series with the resonators 80A, 80B may be subject to significant voltages, requiring the capacitors to be large. It is noted any resonator 80A to 80H shown in FIG. 2A to 2H may be replaced by a SRM 184A, 184B, or 184C such as shown in FIG. 5B to 5D.

Figure 7A:
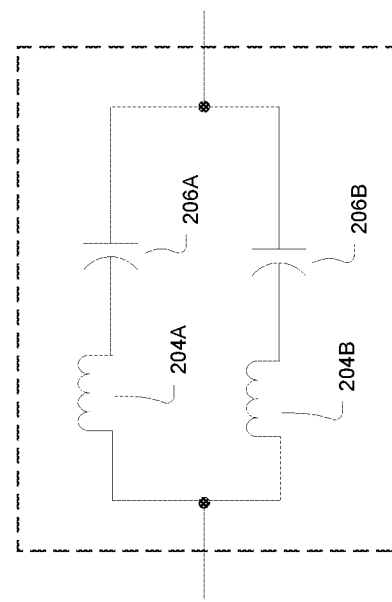
FIG. 7A is a block diagram of a filter module according to various embodiments.

In an embodiment it may be desirable to increase the isolation and stop-band rejection of a filter module. FIG. 7A is a block diagram of a filter module 202A according to various embodiments. The filter module 202A includes an inductor 204A and capacitor 206A in series coupled in parallel to another inductor 204B and capacitor 206B in series. The inductors 204A, 204B may have an inductance $L_1$, $L_2$ and the capacitors 206A, 206B may have a capacitance $C_1$, $C_2$. The filter module 202A may have two pass bands at $w_1$ and $w_2$ surrounding a rejection point at $w_r$. The rejection point may be limited by the quality, Q of the filter module 202A. In the filter module 202A the pass bands may be determined by the equations:

$$w_1 \equiv \frac{1}{\sqrt{L_1 C_1}} \text{ and } w_2 \equiv \frac{1}{\sqrt{L_2 C_2}}.$$

The impedance of the filter module 202A may be determined by the equation $$z_t(s) = \frac{L_t}{s} \times 2 \frac{(s^2 - s_1^2)(s^2 - s_2^2)}{s^2 - s_t^2} \text{ where}$$

$$s_1 = jw_1, s_2 = jw_2, s_t^2 = \left(\frac{L_1 s_1^2 + L_2 s_2^2}{L_1 + L_2}\right), \text{ and } L_t = \frac{L_1 \circ L_2}{L_1 + L_2}.$$

As noted with reference to FIG. 2B, an AW 80A may include an inductor 86A in series with a capacitor 82B with an inductance Lm and capacitance Cm, respectively. The resistor 84A and capacitor 82A may be nominal as a function of the inductor 86A and capacitor 82B. Accordingly, In an embodiment, the filter module 202A may be represented by the parallel coupling of an AW 214A, 214B (the filter module 212A shown FIG. 7B). In this embodiment the acoustic wave module 214A may represent the inductor 204A and capacitor 206A and the AW module 214B may represent the inductor 204B and capacitor 206B of filter module 202A.

The elasticity and inertia of an AW 214A, 214B may be configured or selected to have an equivalent Lm about $L_1$ or $L_2$ and Cm about $C_1$ and $C_2$ in an embodiment. In AW 214A, 214B, the parallel capacitance Co may represent the effective capacitance of the transverse electric fingers in the piezoelectric material and the resistance Rm may represent the heat generated by mechanical motion in the AW 214A, 214B (the effective quality or Q limiter of the AW). As a function of the signals to be filtered the pass bands and effective stop band between the pass bands $w_1$ and $w_2$ may need to be shifted or changed.

Figure 8A:
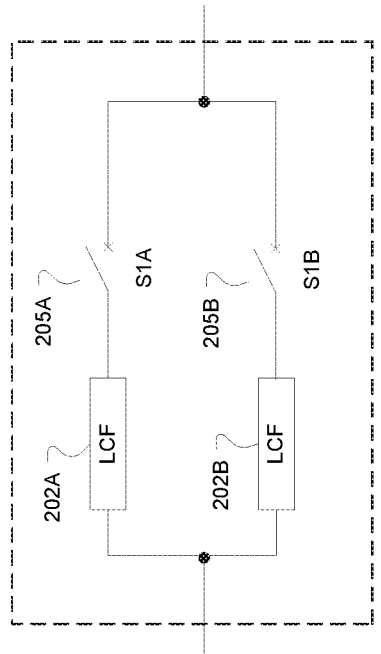
FIG. 8A is a block diagram of a switchable filter module according to various embodiments.

In an embodiment two or more inductor-capacitor filter modules (LCF) 202A, 202B, in series with a low resistive switch 205A, 205B may be coupled in parallel as shown FIG. 8A, filter module 208A. The switches 205A, 205B may include one or more CMOS or MOSFET devices that have a low resistance when closed (as a function of a control signal S1A, S1B). In an embodiment, the LCF 202A may have a first desired pass-band and stop-band and the LCF 202B may have a second desired pass-band and stop-band. Via the control signals S1A, S2A a signal may be processed by either the LCF 202A or the LCF 202B of the filter module 208A. Because the modules 202A, 202B are placed in parallel the operative signal path will only include the resistance of a single switch 205A, 205B, thus increasing the quality of the filter module 202A, 202B and its effective rejection strength (of its stop-band).

Figure 8B:
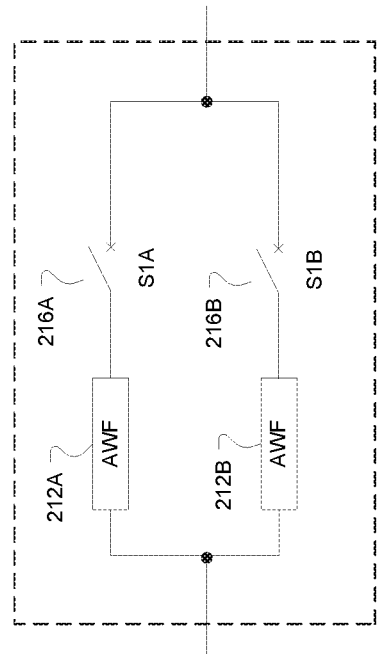
FIG. 8B is a block diagram of a switchable filter module including resonators according to various embodiments.
Figure 7B:
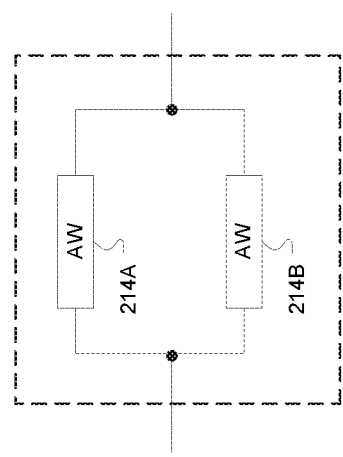
FIG. 7B is a block diagram of a filter module including resonators according to various embodiments.
Figure 8C:
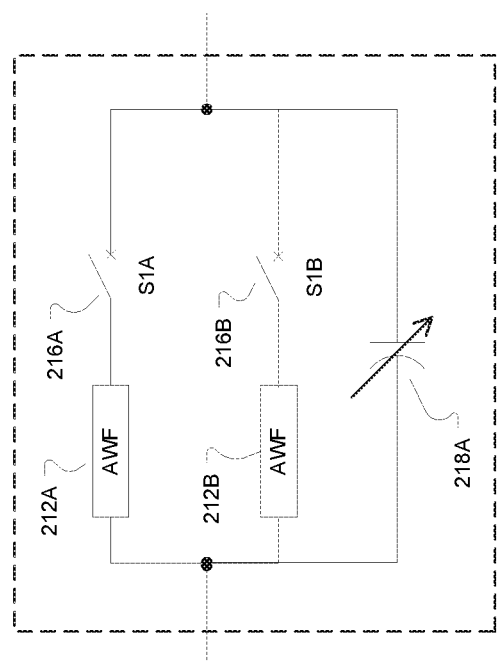
FIG. 8C is a block diagram of a tunable, switchable filter module including tunable or modulated resonators according to various embodiments.

In an embodiment it may be desirable to process signals with larger voltage or limit circuit elements. The LCF 202A, 202B of filter module 208A may be replaced by acoustic wave filters (AWF) 212A, 212B as shown in FIG. 8B, filter module 222. Each AWF 212A, 212B may include two or more AW modules 214A, 214B coupled in parallel as shown in FIG. 7B. As noted and shown in FIG. 8C a variable capacitor 218A may be coupled in parallel in with AW device(s) or module(s) to provide adjustments for process variations in the AW device(s) or module(s) variations due to temperature, and enable shifting of pass-band or stop-bands of the device(s). As shown in the filter module 224 of FIG. 8C, a variable capacitor 218A may also be placed in parallel with one or more AWF 212A, 212B. In filter module 224, the capacitor 218A capacitance may be varied as a function of the switch 216A, 216B control signals S1A, S1B to modulate the AWF 212A or the AWF 212B.

Figure 9A:
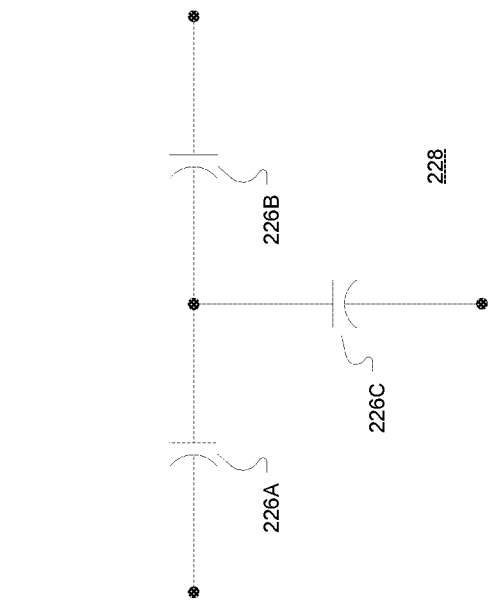
FIG. 9A is a block diagram of a filter module according to various embodiments.
Figure 9B:
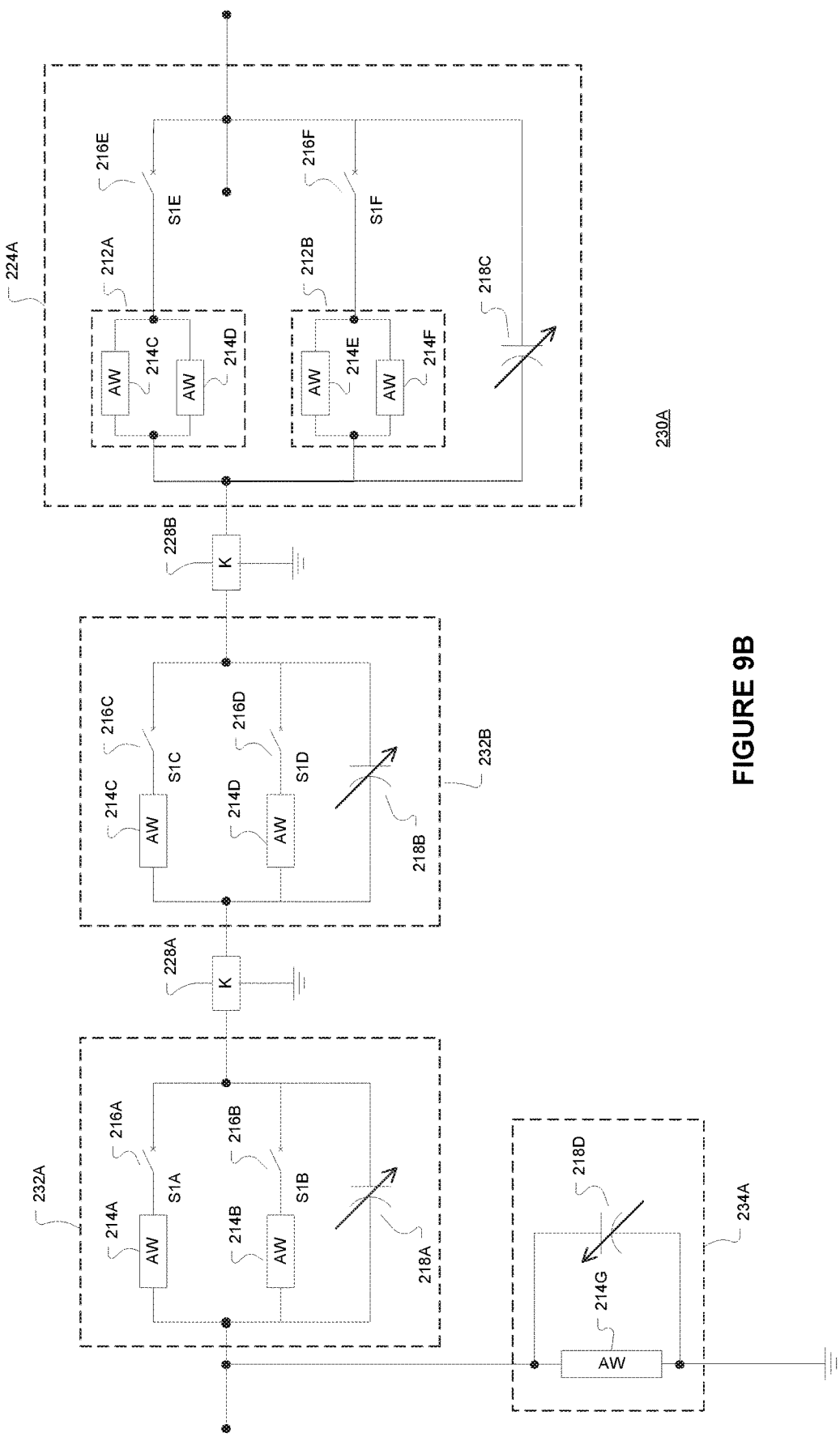
FIGS. 9B-9C are block diagrams of a tunable, switchable filter module including tunable or modulated resonators according to various embodiments.

FIG. 9B is a block diagram of filter module 230A according to various embodiments. The filter module 230A may include a first capacitive-tunable, parallel switched AW module filter 232A, a second capacitive-tunable, parallel switched AW module filter 232B, a first capacitive-tunable parallel switched AWF module filter 224A, a capacitive-tunable AW module 234A, and impedance inversion modules 228A, 228B. The module 232A may be coupled to the module 232B via the inversion module 228A and the module 232B may be coupled to the module 224A via the inversion module 228B. The module 234A may be coupled to ground and the module 232A.

In an embodiment, the first capacitive-tunable, parallel switched AW module filter 232A may include AW modules 214A, 214B, switches 216A, 216B, and variable capacitor 218A. AW module 214A is series coupled to switch 216A and AW module 214B is series coupled to switch 216B. Each module, switch pair 214A, 216A, 214B, 216B is coupled in parallel to the variable capacitor 218A. Similarly, the second capacitive-tunable, parallel switched AW module filter 232B may include AW modules 214C, 214D, switches 216C, 216D, and a variable capacitor 218B. AW module 214C is series coupled to switch 216C and AW module 214D is series coupled to switch 216D. Each module, switch pair 214C, 216C, 214D, 216D is coupled in parallel to the variable capacitor 218B.

The capacitive-tunable, parallel switched AWF module filter 224A may include AWF modules 212A, 212B, switches 216E, 216F, and variable capacitor 218C. AWF module 212A is series coupled to switch 216E and AWF module 212B is series coupled to switch 216F. Each module, switch pair 212A, 216E, 212B, 216F is coupled in parallel to the variable capacitor 218C. Each AWF module 212A, 212B includes two parallel coupled AW modules 214C, 214D and 214E, 214F, respectively. The capacitive-tunable AW module 234A includes an AW module 214G coupled in parallel to a variable capacitor 218D.

In an embodiment, the inversion module 228A, 228B may be a K-filter 228 as shown in FIG. 9A. The filter 228 includes two capacitors 226A, 226B in series with a third capacitor 226C in parallel and between the series pair 226A, 226B. In an embodiment, the capacitors 226A, 226B have a capacitance of −C and the capacitor 226C has a capacitance of +C. As shown in the FIG. 9B, the capacitor 226C of the inversion modules 228A, 228B is also coupled to ground.

Figure 9C:
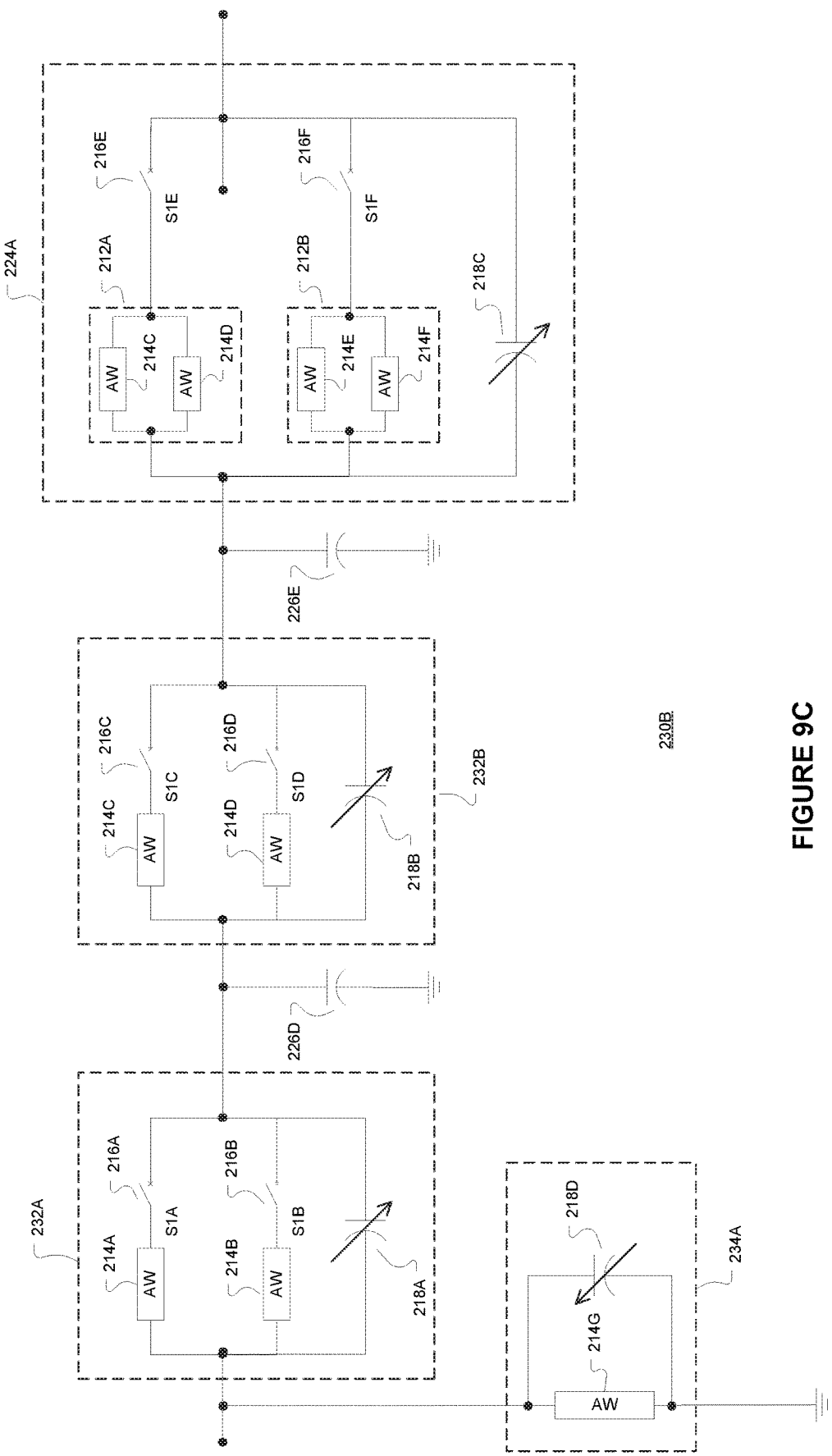
Figures 10A, 10B:
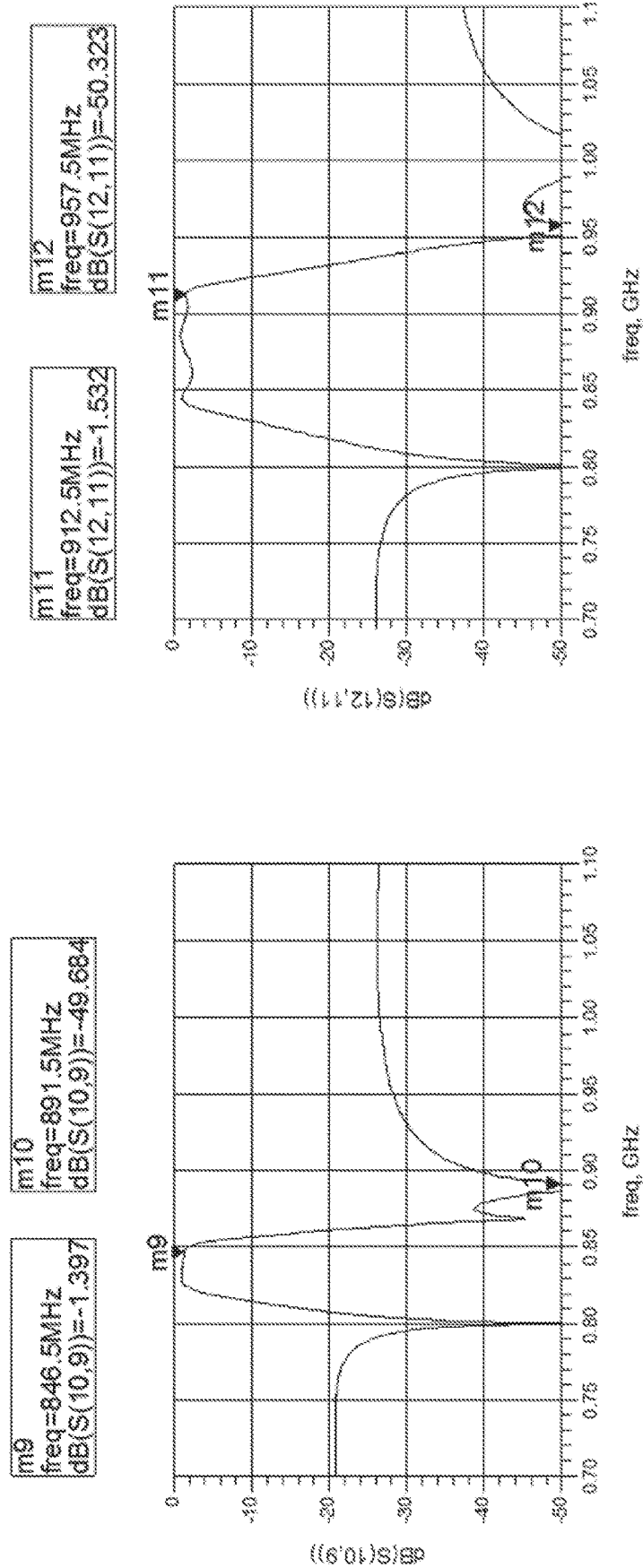
FIGS. 10A-10B are diagrams of filter responses of tunable, switchable filter modules according to various embodiments.

In an embodiment, the module 234A may provide a fixed high rejection and tunable pass-band, the modules 232A, 232B may provide a movable, switchable pass-band and tunable rejection band, and the module 224A may provide a movable, switchable high rejection point and pass-band. The filter module 230A of FIG. 9B may be employed to generate the frequency responses 240A, 240B shown in FIGS. 10A, 10B where the control signals S1A, S1C, S1E may be active, inactive while the control signals S1B, S1D, S1F may be inactive, active, respectively to shift the pass-bands and stop or rejection bands shown in FIGS. 10A, 10B (240A, 240B). In an embodiment 230B shown in FIG. 9C the inversion modules 228A, 228B of FIG. 9B may be replaced by one or more capacitors 226D, 226E coupled to ground.

Figure 11:
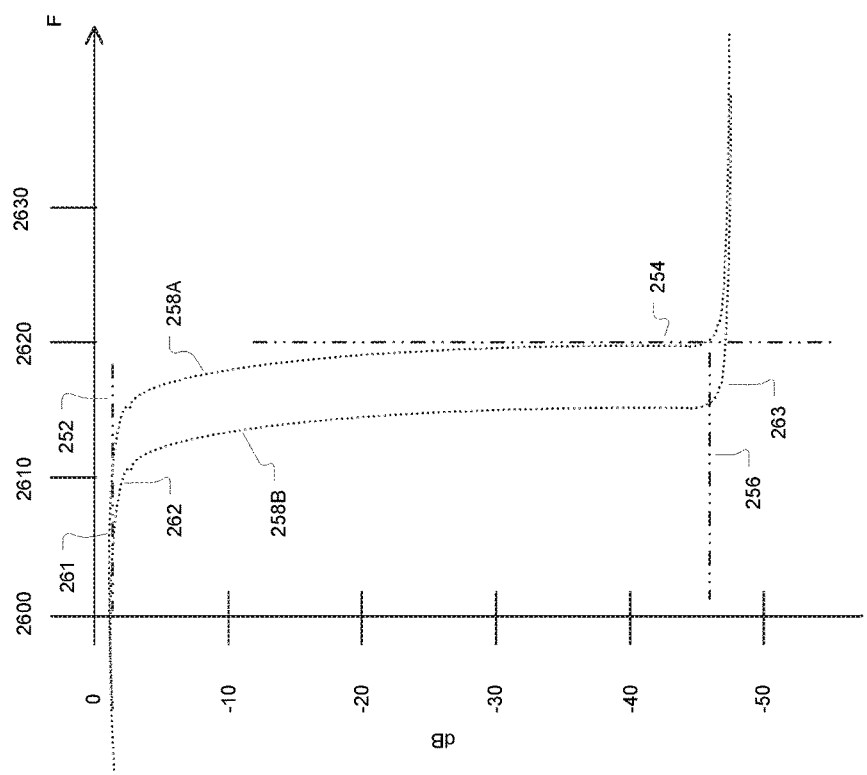
FIG. 11 is a diagram of a filter frequency response according to various embodiments.

FIG. 11 is a diagram of filter frequency responses 250 according to various embodiments. FIG. 11 depicts a first frequency response 258B and a second frequency response 258A. In an embodiment a filter response 258A, 258B includes a passband 261 with a passband edge 262 and stopband 263. Further a filter response 258A, 258B may have a maximum acceptable loss 252 in the passband area 261 (creating the passband edge 262) and a minimum attenuation or rejection 256 in the stopband 263. Further the minimum attenuation or rejection 256 in the stopband 263 may need to be achieved by a particular frequency 254 such a channel boundary or cutoff frequency. In an embodiment a filter mechanism or module such as resonator module 292B of FIG. 13B may produce a first frequency response 258B during ideal operation and fabrication conditions. The same filter module 292B may generate the shifted frequency response 258A due to non-ideal operation or fabrication conditions. In an embodiment, the frequency response shift from 258B to 258A may be due to temperature fluctuations and fabrication variations.

Given the potential filter module 292B frequency response shift (from 258B to 258A), the passband 261 region or width of a signal processed by the filter module 292B may be narrowed or reduced to ensure that the minimum required attenuation 256 is achieved by a required frequency 254. The required frequency 254 may be the start of another channel and the filter module 292B may be required to prevent signal leakage into adjacent channels. The distance between the channel boundary 254 and passband edge 262 is commonly termed the guard band of a filter or channel. In a system or architecture such as channel architecture 310A, 310B, 310C shown in FIG. 15A, 15B, 15C the guard band (316B in FIG. 15B and 318B in FIG. 15C) represents lost or unusable bandwidth. Accordingly it may be desirable to minimize the guard band 316B, 318B by reducing the effect of temperature and process or fabrication variations of filters or filter architectures that may be employed to limit or prevent signal leakage between adjacent channels (312A, 314A, and 312B).

Figure 12:
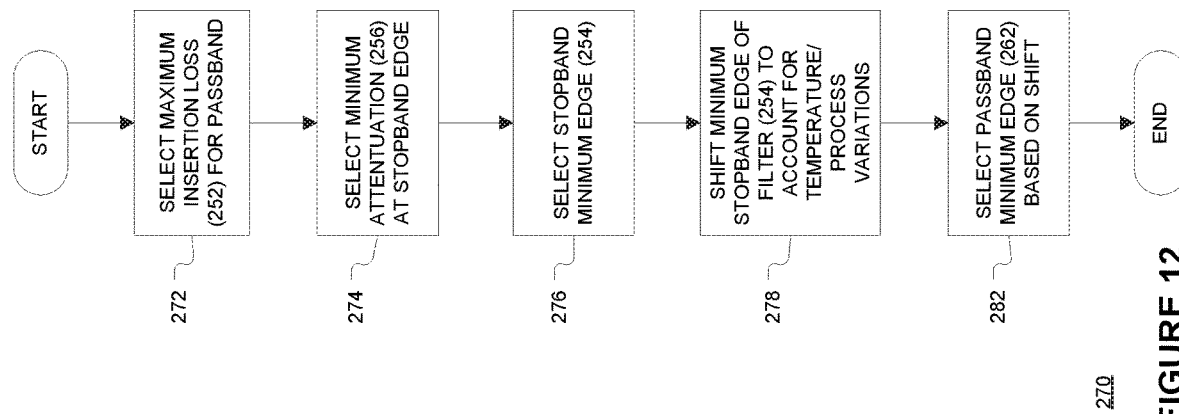
FIG. 12 is a flow diagram of a filter response selection method according to various embodiments.

FIG. 12 is a flow diagram of a filter configuration method 270 according to various embodiments. In the method 270 the maximum passband loss 252 may be selected where this loss level may be required or indicated (by a standard or other communication protocol establishment organization) (activity 272). The filter response stopband minimum attenuation 256 needed to reduce or limit signal leakage into adjacent channels may be selected where the minimum attenuation may be required or indicated (by a standard or other communication protocol establishment organization) (activity 274). Further the minimum stopband edge 254 for the minimum attenuation 256 may also be selected where the minimum stopband edge 254 may be required or indicated (by a standard or other communication protocol establishment organization) (activity 276).

In the method 270 the minimum stopband edge 254 of a non-tunable filter 292B may be pre-shifted to ensure the filter response 258B when shifted due to temperature or process variations achieves the minimum attenuation 256 by the desired or required boundary or edge 254 (activity 278). Further, the filter passband 262 edge may also be shifted, effectively reducing the usable signal bandwidth to ensure less than the maximum loss 252 is present in the passband (activity 282). Accordingly the effective guard band 316B, 318B may be increased.

Figure 13B:
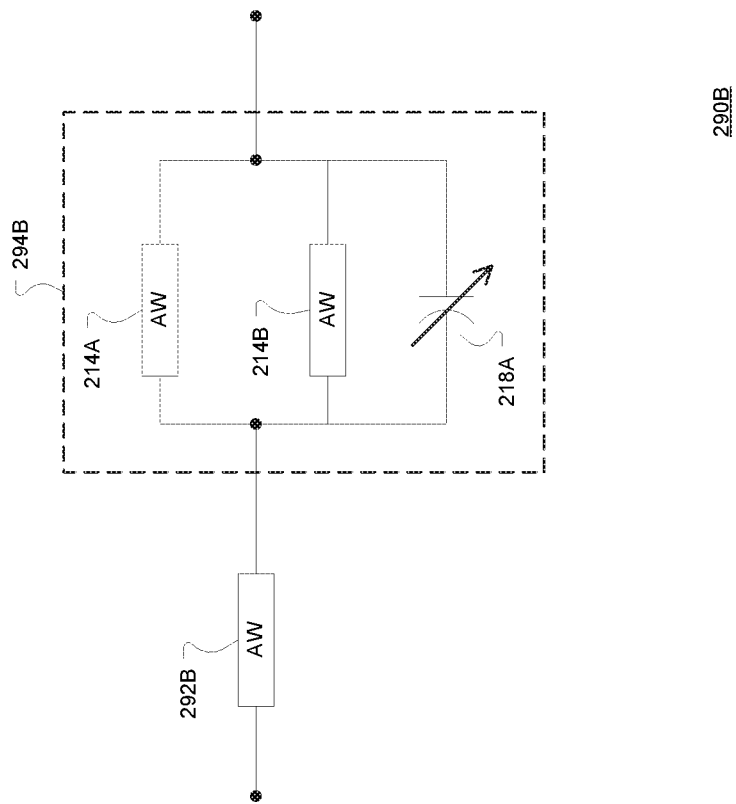
FIG. 13B is a block diagram of a filter architecture including modulated or tunable resonator modules and a resonator module according to various embodiments.
Figure 13A:
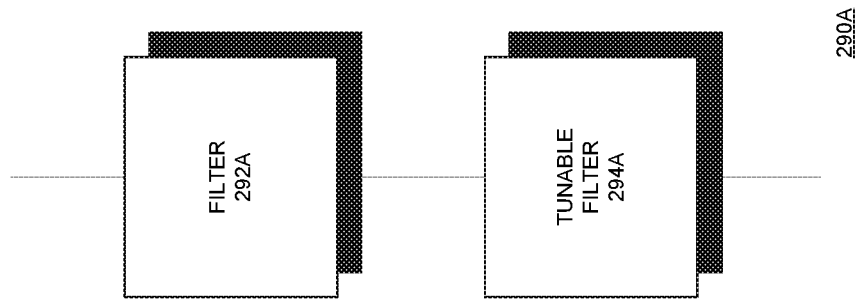
FIG. 13A is a simplified block diagram of a filtering architecture according to various embodiments.

FIG. 13A is a simplified block diagram of a filtering architecture 290A according to various embodiments. The filter architecture includes a filter 292A coupled in series with a tunable filter 294A. In an embodiment, the filter 292A may have a desired frequency response shown as 258A shown in FIG. 11 but be subject to temperature or process variations where the fixed filter 292A frequency response may shift to the filter response 300A shown in FIG. 14A. Such a worst case frequency response 302A may be unacceptable due to potential signal leakage beyond the desired channel or signal boundary 254. The frequency response 302A otherwise has stable passband and stopband 304A.

Figure 14B:
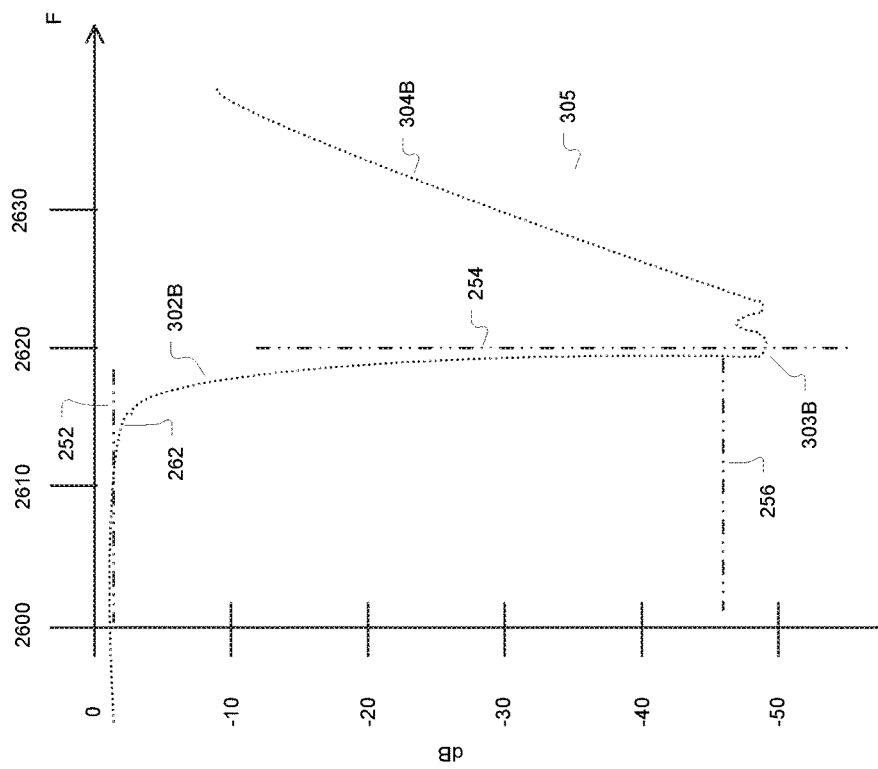
FIG. 14B is a diagram of a filter frequency response of a modulated or tunable resonator module according to various embodiments.
Figure 14A:
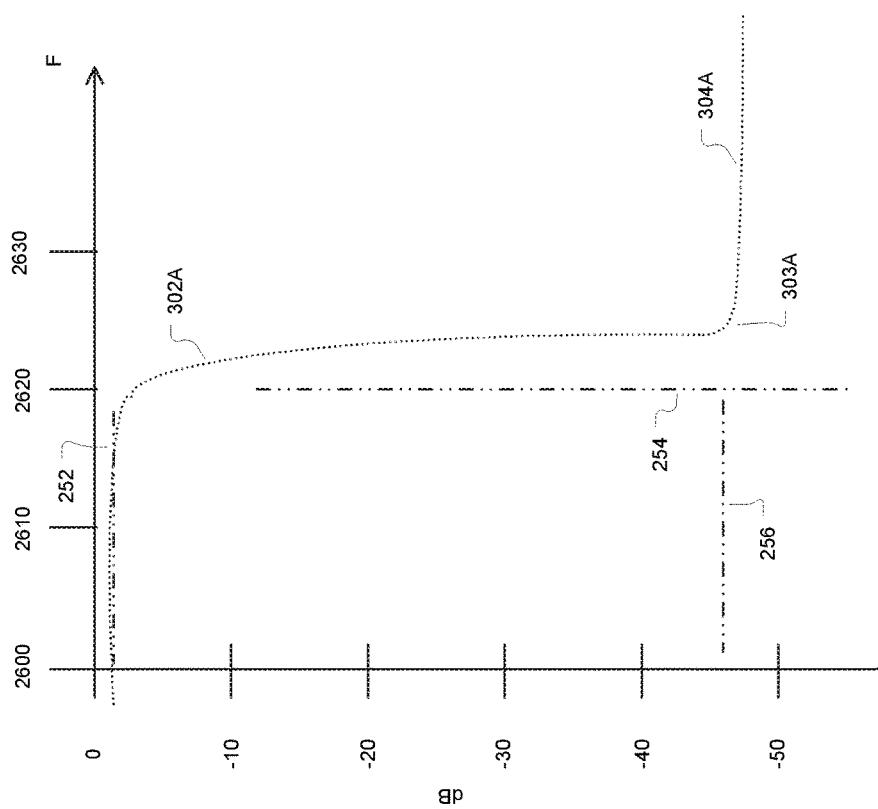
FIG. 14A is a diagram of a filter frequency response of a resonator module according to various embodiments.

The tunable filter 294A may have a tunable frequency response such as module 294B shown in FIG. 13B where temperature and process variations are corrected or modulated by an adjustable element such as a tunable capacitor 218A. The tunable filter 294A may have a frequency response 300B in FIG. 14B. As shown in FIG. 14B the frequency response 302B may achieve the desired or required maximum passband loss 252 with an edge 262 than is greater in frequency than the filter 302A (when adjusted to account for potential shifts) and correspondingly a smaller needed guard band 316B, 318B. The filter response 302B for tunable filter 294A may also meet the minimum attenuation 256 by the frequency boundary 254 (point 303B in FIG. 14B). The tunable filter 294A filter response 302B may have a second, unacceptable passband 304B within the adjacent channel 305 and thus be unacceptable as a single filter.

Figure 14C:
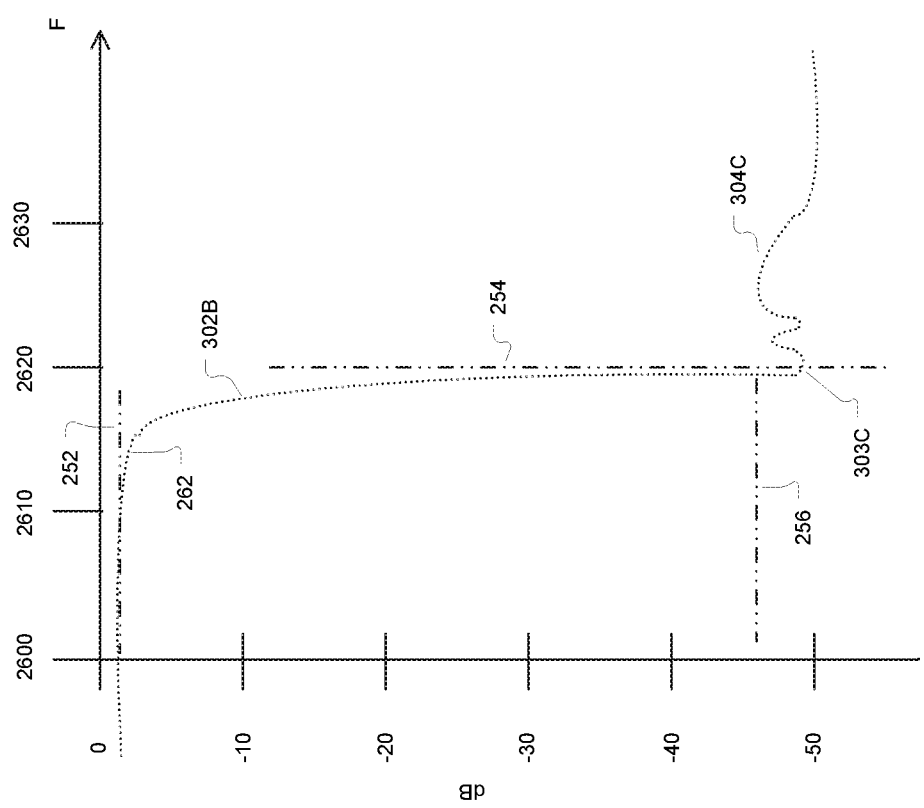
FIG. 14C is a diagram of a filter frequency response of a filter architecture including a modulated or tunable resonator module and a resonator module according to various embodiments.

In an embodiment, the filter module 292A, 292B and tunable filter 294A, 294B, 290A, 290B respectively, in combination may create the frequency response 300C shown in FIG. 14C. As shown in FIG. 14C the net frequency response 300C may include the desirable stopband of filter 294A, B without the subsequent passband 304B due the filter 292A, B stopband 304A. Further, while the filter 292A, B stopband edge 303A may vary with temperature and process variations it is sufficient to suppress the filter 294A, B undesirable second passband 304B. The resultant frequency response 300C may have an acceptable passband loss 252 and minimum stopband attenuation 256 by the desired boundary or frequency cutoff 254 without temperature and process variations.

FIG. 13B is a block diagram of a filter architecture 290B including a modulated or tunable resonator module 294B and a resonator module 292B according to various embodiments. The resonator module 292B may be a non-tunable filter that may be configured to a frequency response similar to frequency response 300A shown in FIG. 14A. The resonator module 292B may include surface acoustic wave (SAW) and bulk acoustic wave (BAW) devices where the device enables the transduction of acoustic waves. In an acoustic wave device electrical energy is transduced to mechanical energy back to electrical energy via piezoelectric materials. The piezoelectric materials may include quartz, lithium niobate, lithium tantalate, and lanthanum gallium silicate. One or more transverse fingers of conductive elements may be placed in the piezoelectric materials to convert electrical energy to mechanical energy and back to electrical energy.

In an embodiment, the tunable resonator 294B may include one or more acoustic wave modules or devices 214A, 214B, and a tunable capacitor 218A. The AW modules 214A, 214B, and tunable capacitor 218A may be coupled in parallel in an embodiment as shown in FIG. 13B. As noted this configuration may have two pass bands at $w_1$ and $w_2$ surrounding a rejection point at $w_r$. The pass bands at $w_1$ and $w_2$ may correspond to filter response components 302B and 304B shown in FIG. 14B and the rejection point at $w_r$ may correspond to the component 303B. The variable capacitor 218A coupled in parallel with the AW modules 214A, 214B may tune or modulate the filter module 294B frequency response 300B to correct for temperature or process variations. Other resonator filters such as shown in FIGS. 2A to 2H, FIG. 4, FIGS. 5A to 5G, FIGS. 7B to 8C, and FIGS. 9B-9C may be employed in whole or part as a tunable resonator or filter 294B.

Figure 16D:
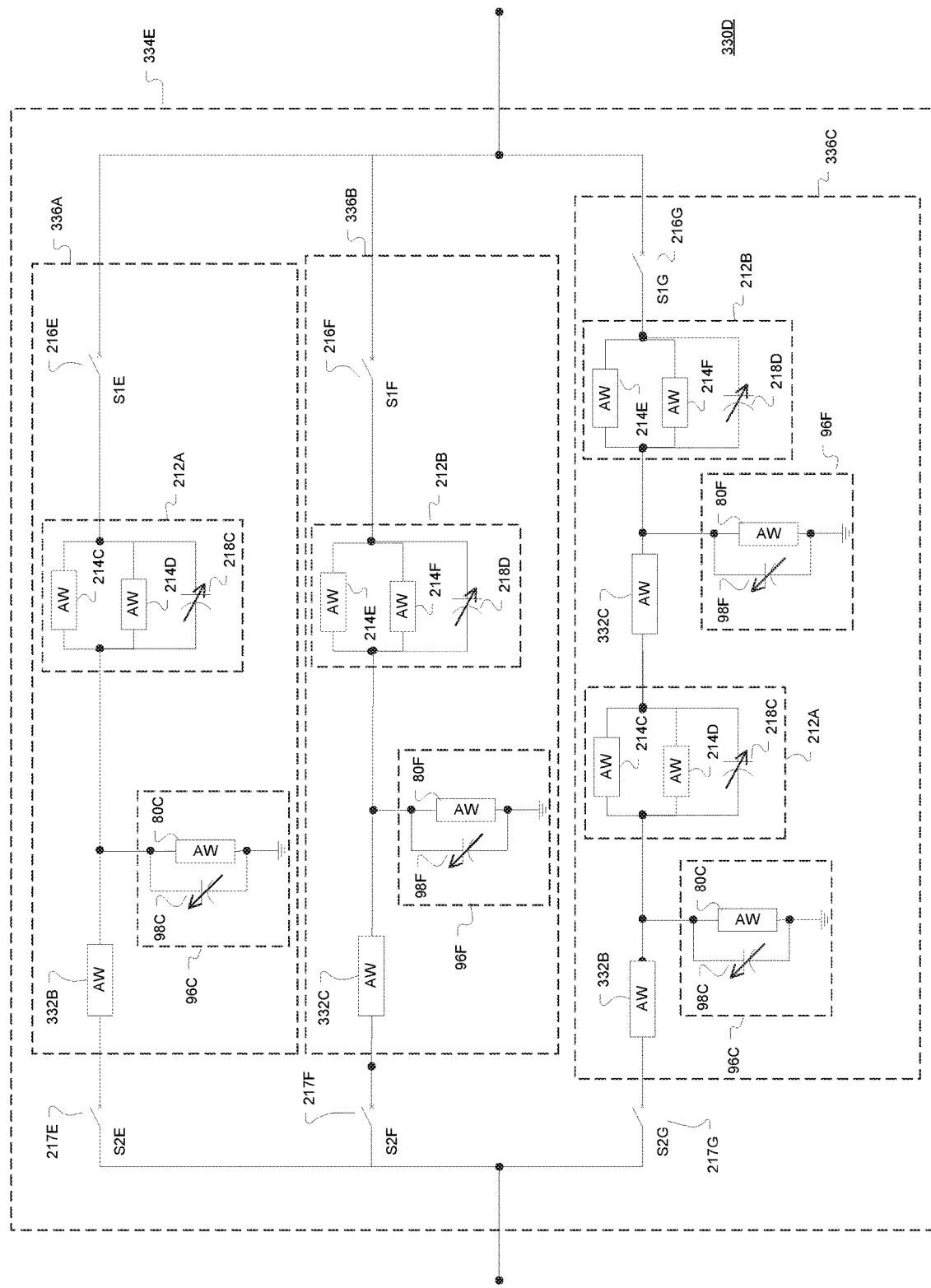
FIG. 16D is a block diagram of another filter architecture including switchable, modulated or tunable resonator modules and a resonator module according to various embodiments.

The filter architecture 290A may be modified such as shown in FIGS. 16A, 16B, 16C, and 16D for different filter requirements or parameters. As shown in FIG. 16A, the filter architecture 330A may include a switchable and tunable filter module 334A. Such a module 334A and resulting architecture (and switchable frequency response) may be employed in communication architectures requiring varying filters to process one or more signals. As shown in FIG. 16B, a switchable, tunable filtering architecture 330B may include a first switchable tunable filter module 335A and a second switchable tunable filter module 335B. Each module 335A, 335B may include a filter module 332B, 332C similar to module 292B (FIG. 13B). Each switchable, tunable module 335A, 335B may also include an AWF 212A, AWF 212B, switch pairs 216E, 217E and 216F, 217F, and a AW module 96C, 96F.

Each AWF module 212A, 212B may include two AW modules 214C, 2124D, and 214E, 214F coupled in parallel and a variable capacitor 218C, 218D further coupled in parallel to the two AW modules 214C, 214D and 214E, 214F, respectively. The tunable modules 335A, 335B may include the AW module 96C, 96D located between the AW 332B, 332C and 212A, 212B and ground. Each AW module 96C, 96D may include an AW module 80C, 80F and a tunable capacitor 98C, 98F coupled in parallel to the AW module 80C, 80F. Each switchable, tunable module 335A, 335B may be coupled in parallel. As noted above each AWF module 212A, 212B may have a frequency response that includes two pass bands at $w_1$ and $w_2$ surrounding a rejection point at $w_r$. In an embodiment, the switchable, tunable architecture 330B may operate in two modes: mode 1 (switch pair 216E, 217E closed and switch pair 216F, 217F open) (frequency responses 320A and 320B shown in FIGS. 17A and 17B may combine to create response 320C shown in 17C) and mode 2 (switch pair 216E, 217E open and switch pair 216F, 217F closed), frequency response 320D and 320E shown in FIGS. 17D and 17E may combine to create response 320F shown in 17F.

Figure 17A:
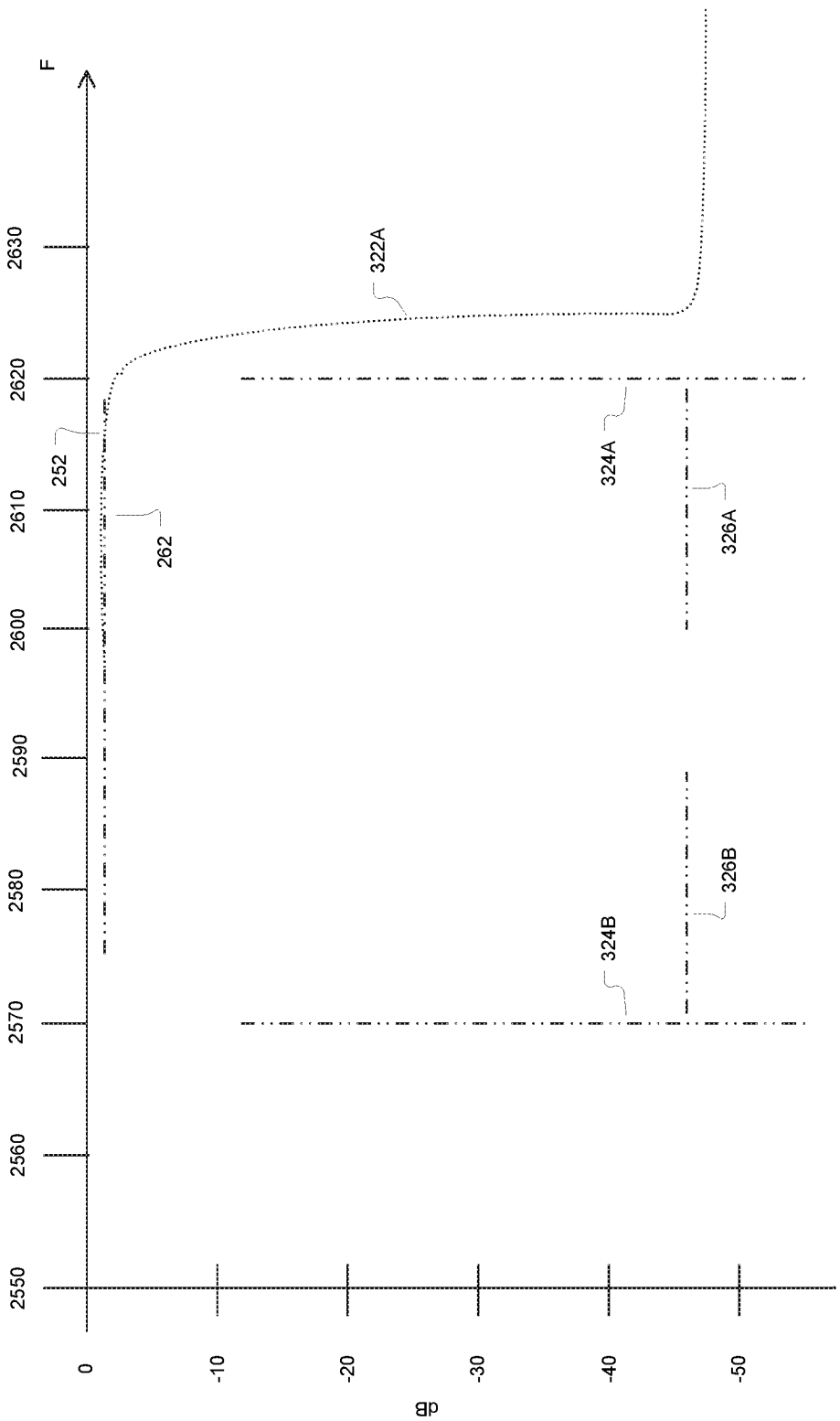
FIG. 17A is a diagram of a filter frequency response of a resonator module according to various embodiments.
Figure 17B:
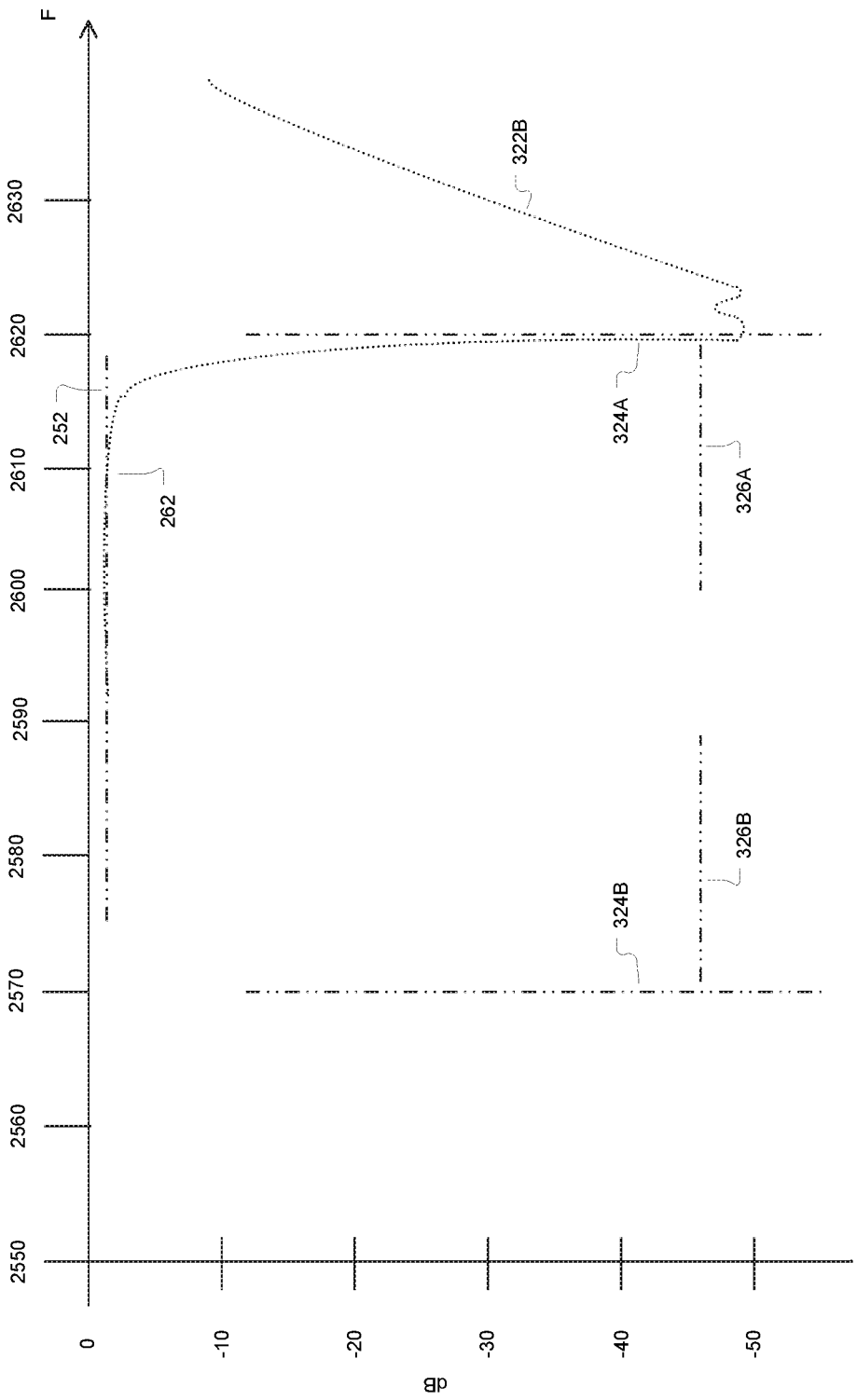
FIG. 17B is a diagram of a filter frequency response of a switchable, modulated or tunable resonator module in a first mode according to various embodiments.
Figure 17C:
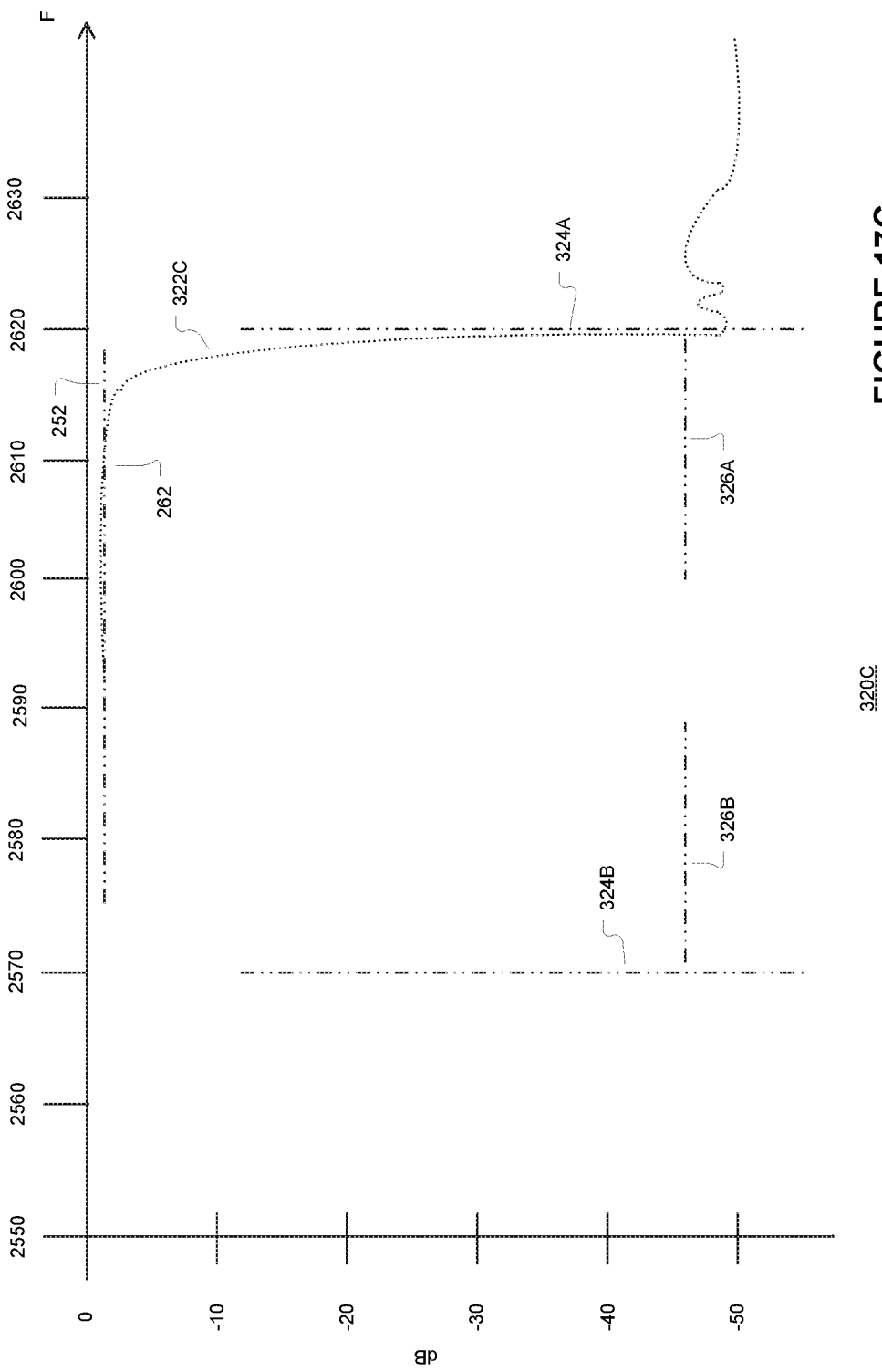
FIG. 17C is a diagram of a filter frequency response of a filter architecture including a switchable, modulated or tunable resonator module in a first mode and a resonator module according to various embodiments.
Figure 17D:
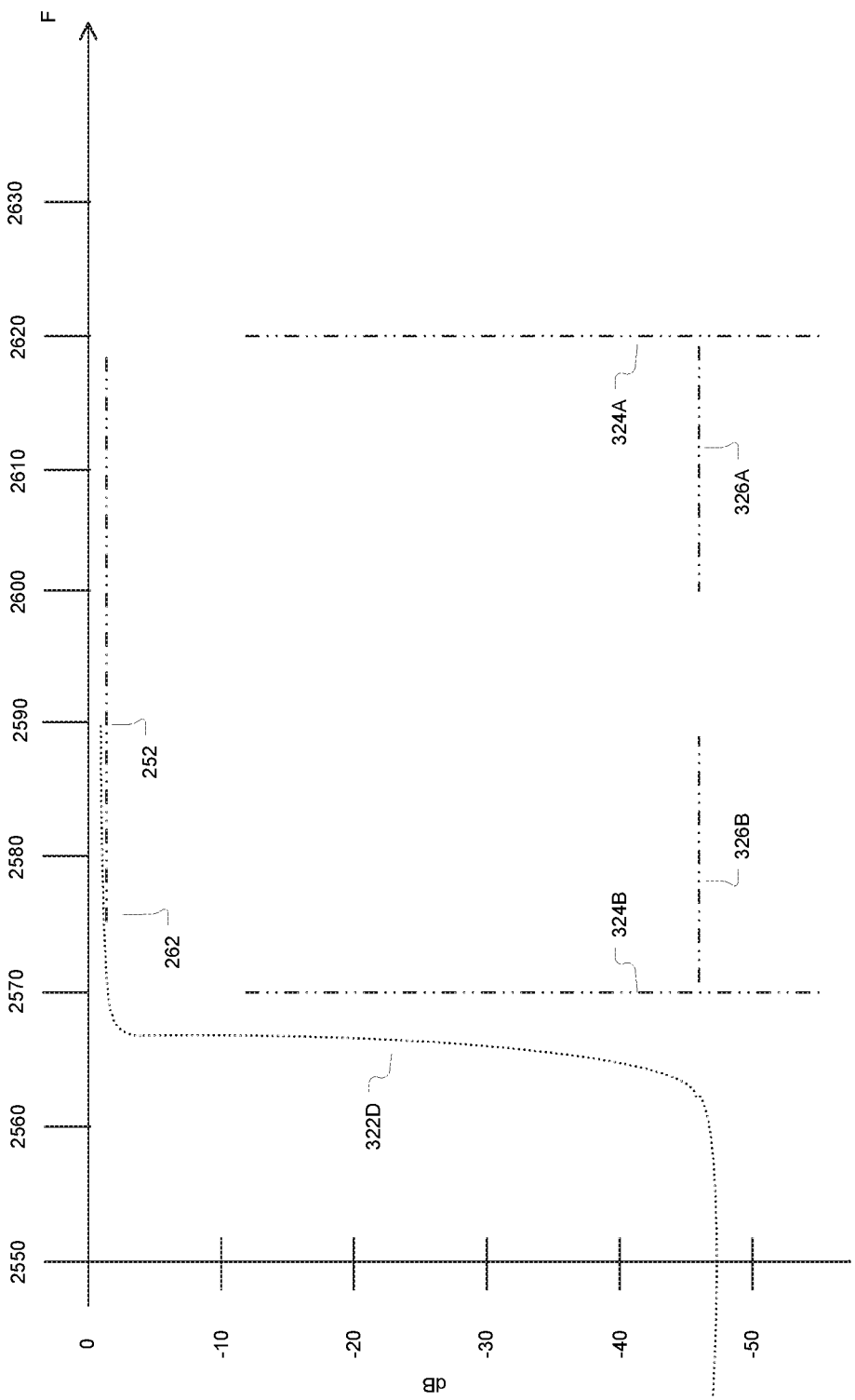
FIG. 17D is a diagram of a filter frequency response of a resonator module according to various embodiments.
Figure 17E:
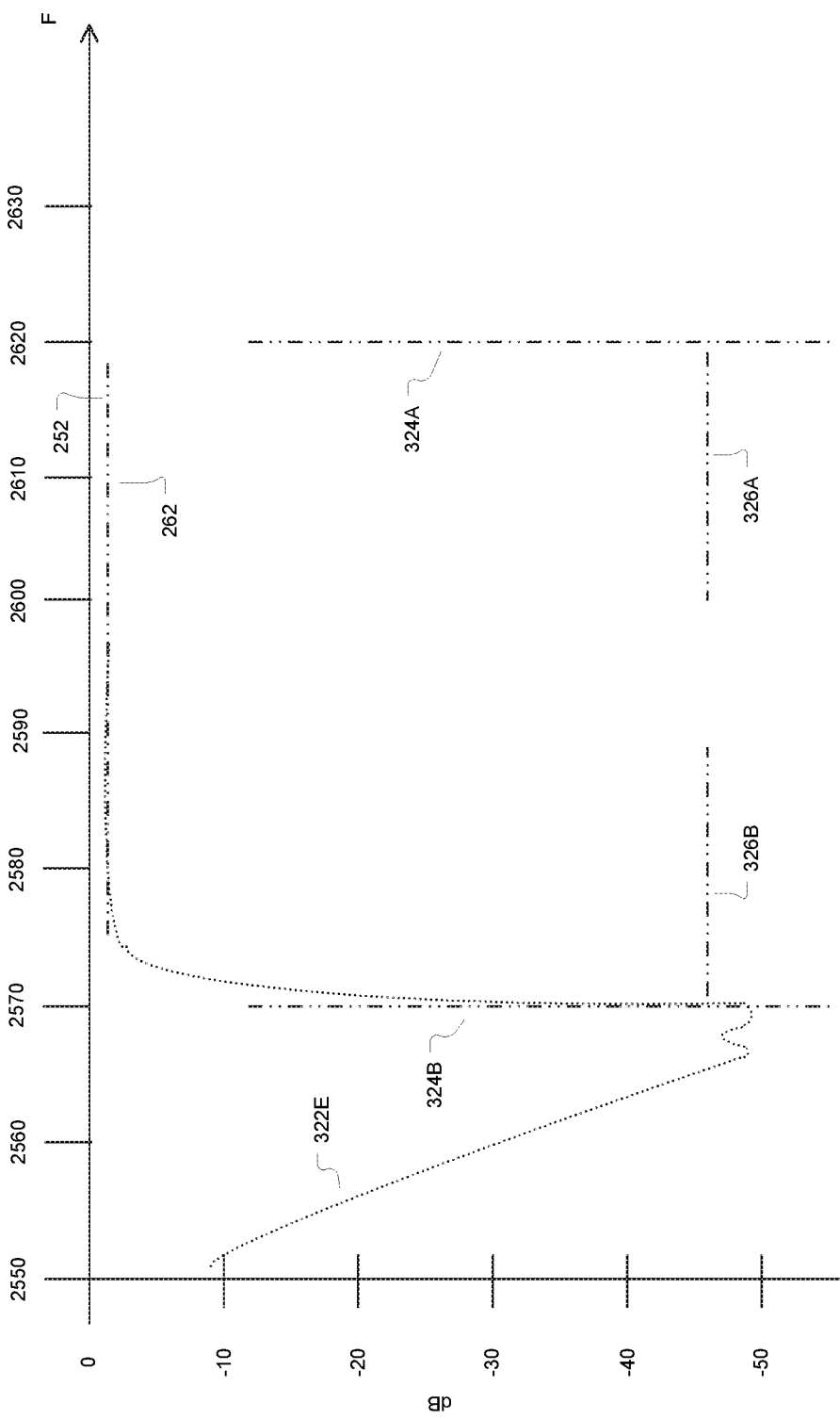
FIG. 17E is a diagram of a filter frequency response of a switchable, modulated or tunable resonator module in a second mode according to various embodiments.

The AW module 332B, 332C may have a frequency response 320A, 320D shown in FIG. 17A, FIG. 17D, respectively. When this frequency response 320A, 320D is combined with the switchable, tunable AW module's 335A frequency response mode 1 320B—FIG. 17B or tunable AW module's 335B, mode 2 320D—FIG. 17E, the resultant frequency response may be combined mode 1 320C—FIG. 17C or mode 2 320F—FIG. 17F. Such a switchable, tunable filter architecture 330A, 330B may be applied in a channel architecture requiring different filter operation modes such as shown in FIGS. 15A to 15C. The AWF 96C, 96F may provide an additional stop band as a function of the AW 80C, 80F configuration.

In the channel configuration 310A shown in FIG. 15A a time division multiplex (TDD) band 38 is located between a transmit channel of band 7 and a receive channel of band 7. In an embodiment band 7 may represent frequency division duplex (FDD) spectrum of a long term evolution (LTE) system and band 38 may represent TDD spectrum of the LTE system or architecture. In the combined LTE FDD, TDD spectrum, band 38 spectrum 314A may be sandwiched between band 7's spectrum 312A 312B. When the TDD channel or band 38 is transmitting (as shown in configuration 310B shown in FIG. 15B) band 38 should not leak into RX band 7 312B. In band 38 transmit mode 310B, mode 1 of the filter architecture 330B may be employed to generate the frequency response 320C shown in FIG. 17C.

In channel configuration 310B during band 38 transmit mode, a guard band 316B may be located between band 38's transmit section or passband 316A and band 7's receive band 312B. In mode 1 the filter architecture 330B may generate the frequency response 320C shown in FIG. 17C where the stopband 324A is located in the guard band 316B. When band 38 is in receive mode (FIG. 15C, 310C), the band 7 transmit channel 312A may interfere with the band 38 receive channel 318A. In such a configuration the filter architecture 330B of FIG. 16B may operate in the second mode (mode 2) to generate the frequency response 320F shown in FIG. 17F. The frequency response 320F stopband 324B may be located in the guard band 318B when band 38 is in receive mode. The architecture 330B shown in FIG. 16B may reduce the guard band size 316B, 318B enabling greater bandwidth utilization (of band 38 in the embodiment shown in FIGS. 15A to 15C).

Another filter embodiment 330C is shown in FIG. 16C. Filter 330C includes a first, tunable switchable filter module 334C and a second, tunable switchable filter module 334D serially coupled. The first, tunable switchable filter module 334C may include a first resonator 332B, a first tunable resonator 212A, a first, grounded tunable resonator 96C, and a first opposite switch pair 216E, 217E. The switch 217E, the first resonator 332B, and the first tunable resonator 212A may be serially coupled together and the serial group (217E, 332B, 212A) may be coupled in parallel to the switch 216E. The AWF module 96C may be located between the AW 332B and 212A and ground. The AWF 96C may include an AW module 80C and a tunable capacitor 98C coupled in parallel to the AW module 80C.

Similarly, the second, tunable switchable filter module 334D may include a second resonator 332C, a second tunable resonator 212B, a second, grounded tunable resonator module 96F, and a second opposite switch pair 216F, 217F. The switch 217F, the second resonator 332C, and the second tunable resonator 212B may be serially coupled together and the serial group (217F, 332C, 212B) may be coupled in parallel to the switch 216F. The AWF module 96F may be located between the AW 332C and 212B and ground. The AWF 96F may include an AW module 80F and a tunable capacitor 98F coupled in parallel to the AW module 80F.

Figure 17G:
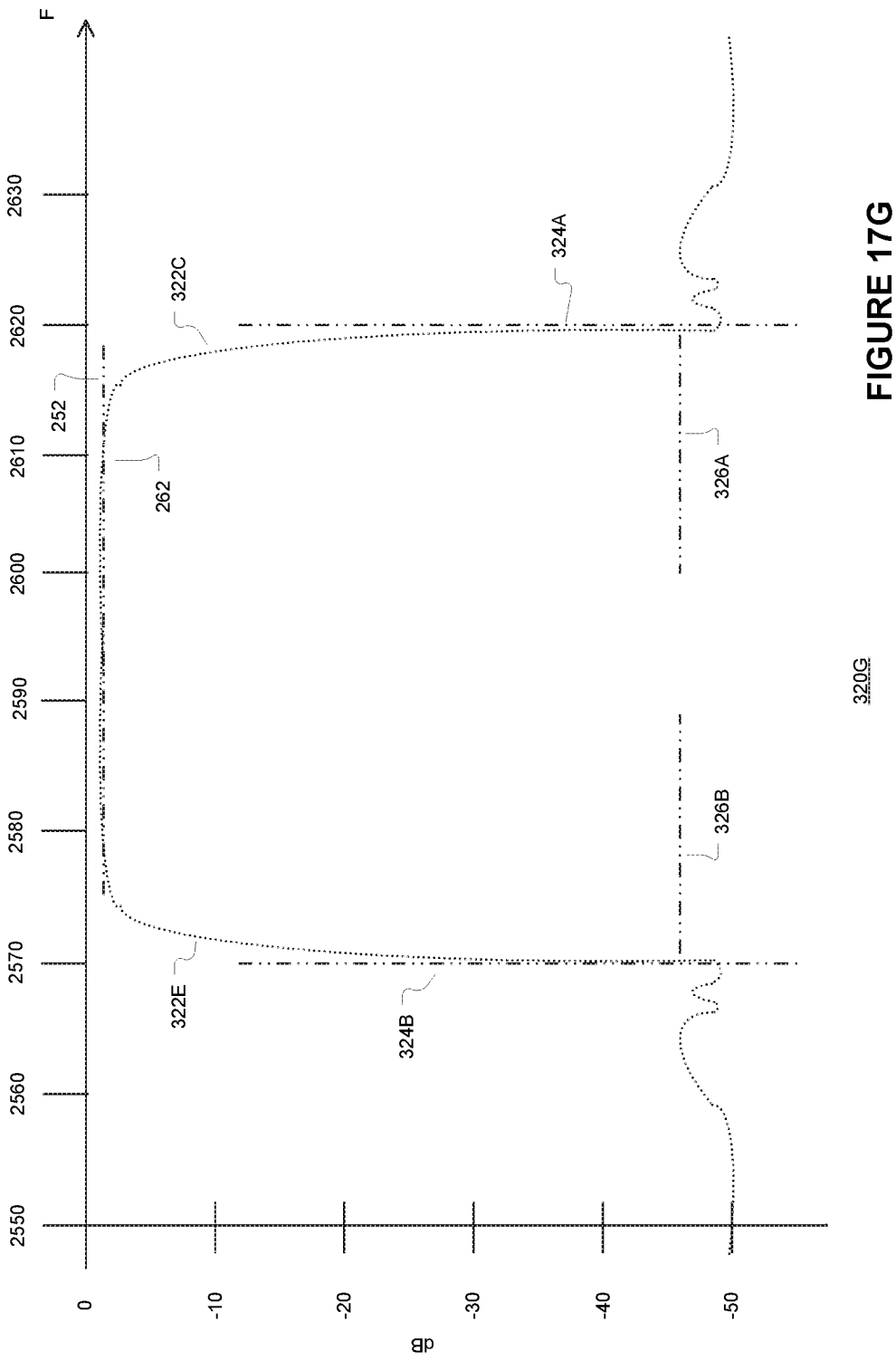
FIG. 17G is a diagram of a filter frequency response of a filter architecture including a first switchable, modulated or tunable resonator module, a first resonator module, a second switchable, modulated or tunable resonator module, and a second resonator module according to various embodiments.

The filter module 334C, when active (switch 216E open, switch 217E closed, switch 216F closed, switch 217F open (mode 1)) may produce the frequency response 320C shown in FIG. 17C. The filter module 334D, when active (switch 216E closed, switch 217E open, switch 216F open, switch 217F closed (mode 2)) may produce the frequency response 320F shown in FIG. 17F. In another mode, mode 3 switches 216E and 216F may both be open and switches 217E, 217F closed (engaging both filter modules 334C, 334D) generating the frequency response 320G shown in FIG. 17G. Such a frequency response may be employed to protect bands on either side of the combined filter, such as band 7 transmit 312A and receive 312B shown in FIG. 15A. The AWF 96C may provide an additional stop band as a function of the AW 80C configuration.

The filter system or architecture 330C may have an unacceptable insertion loss in mode 1 or 2 given the potential loss and capacitance of the open switches 216F, 217E (mode 2), switch 216E, 217F (mode 1). Another filter architecture 330D enabling modes 1, 2, and 3 with a lower insertion loss is show in FIG. 16D. As shown in FIG. 16D, the filter architecture 334E includes a first filter module 336A, a second filter module 336B, and a third filter module 336C, all coupled in parallel to each other. The first filter module 336A includes a first resonator 332B, a first AWF 212A, a first, grounded AWF 96C, and a switch pair 216E, 217E coupled in series where these resonators in series may produce the frequency response 320C shown in FIG. 17C (mode 1—switch pair 216E, 217E closed, switch pair 216F, 217F open, and switch pair 216G, 217G open).

The second filter module 336B includes a second resonator 332C, a second AWF 212B, a second, grounded AWF 96F, and a switch pair 216F, 217F coupled in series where these resonators in series may produce the frequency response 320F shown in FIG. 17F (mode 2—switch pair 216E, 217E open, switch pair 216F, 217F closed, and switch pair 216G, 217G open)). The third filter module 336C may include the first resonator 332B, the first AWF 212A, the second resonator 332C, the second AWF 212B, the first, grounded AWF 96C, the second, grounded AWF 96F, and the switch pair 216G, 217G in series. In mode 3, the combined resonators 332B, 212A, 332C, and 212B may generate the frequency response 320G shown in FIG. 17G.

A signal processing architecture 330E is shown in FIG. 16E. The architecture 330E may include a first filter system 215A, a second filter system 215B, a two position switch 216H, a power amplifier (PA) 12, a low noise amplifier (LNA) 14, an antenna 50, and a mixer 60A. A signal 8 to be transmitted via antenna 50 may be amplified by PA 12 to produce an amplified signal 22. The resultant amplified signal 22 may include signal content beyond the desired or permitted transmission bandwidth such as band 38 transmit channel 316A shown in FIG. 15B. The resultant signal 22 may filtered by the filter system 215A. The filter system 215A may include the first resonator module 332B, a first grounded resonator module 96C (including a resonator 80C and a tunable capacitor 98C), and a first parallel resonator module (including resonator 214C, 214D and a tunable capacitor 218C). In an embodiment, the first filter system 215A may generate the frequency response 320C shown in FIG. 17C.

The filtered, amplified signal may be coupled to the antenna 50 via the switch 216H. Similarly a signal 42 received on the antenna 50 may be filtered by the second filter system 215B. The filter system 215B may include the second resonator module 332C, a second grounded resonator module 96F (including a resonator 80F and a tunable capacitor 98F) and a second parallel resonator module (including resonator 214E, 214F and a tunable capacitor 218D). In an embodiment, the second filter system 215B may generate the frequency response 320F shown in FIG. 17F. The resultant filtered, received signal may be amplified by the LNA 14. The amplified, filtered, received signal may be shifted to another center frequency (such as base-band) via the mixer 60A and a reference frequency signal 60B to generate the frequency shifted, amplified, filtered, received signal 60C. The filter architecture 330E may be employed in a TDD communication system such as band 38 in an LTE spectrum in an embodiment.

Figure 18:
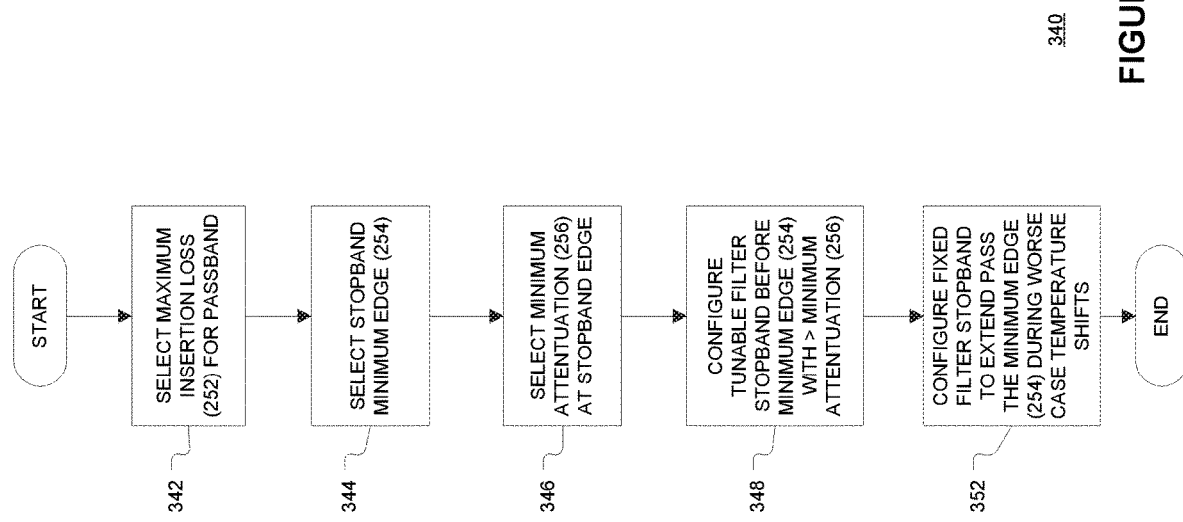
FIG. 18 is a flow diagram of a combined filter configuration method according to various embodiments.

In an embodiment, the method 340 shown in FIG. 18 may be employed to configure a filter architecture 290A, 290B, 330A-E shown in FIGS. 13A, 13B, and 16A-16E, respectively. In method 340 the maximum insertion loss (passband maximum loss) 252 may be selected (as required or indicated) (activity 342). The stopband minimum edge(s) 254 may then be selected (as required or indicated) (activity 344). Similarly the minimal attenuation for the stopband edge may also be selected (as required or indicated) 256 (activity 346). Based on these requirements 252,254, 256, a tunable resonator filter 294A, 294B, 334A, 334B may be configured to have a stopband located at the point 254 and having at least the minimum attenuation 256 while meeting the maximum passband loss 252 requirement (activity 348). A resonator filter 292A, 292B, 332A, 332B, 332C may be configured to have stopband extend pass the initial stopband 254 with the minimum attenuation 256 and the maximum passband loss 252 based on the potential temperature and process variation of the filter (activity 352). Activities 348, 352 may be performed in any order or contemporaneously.

Figure 19A:
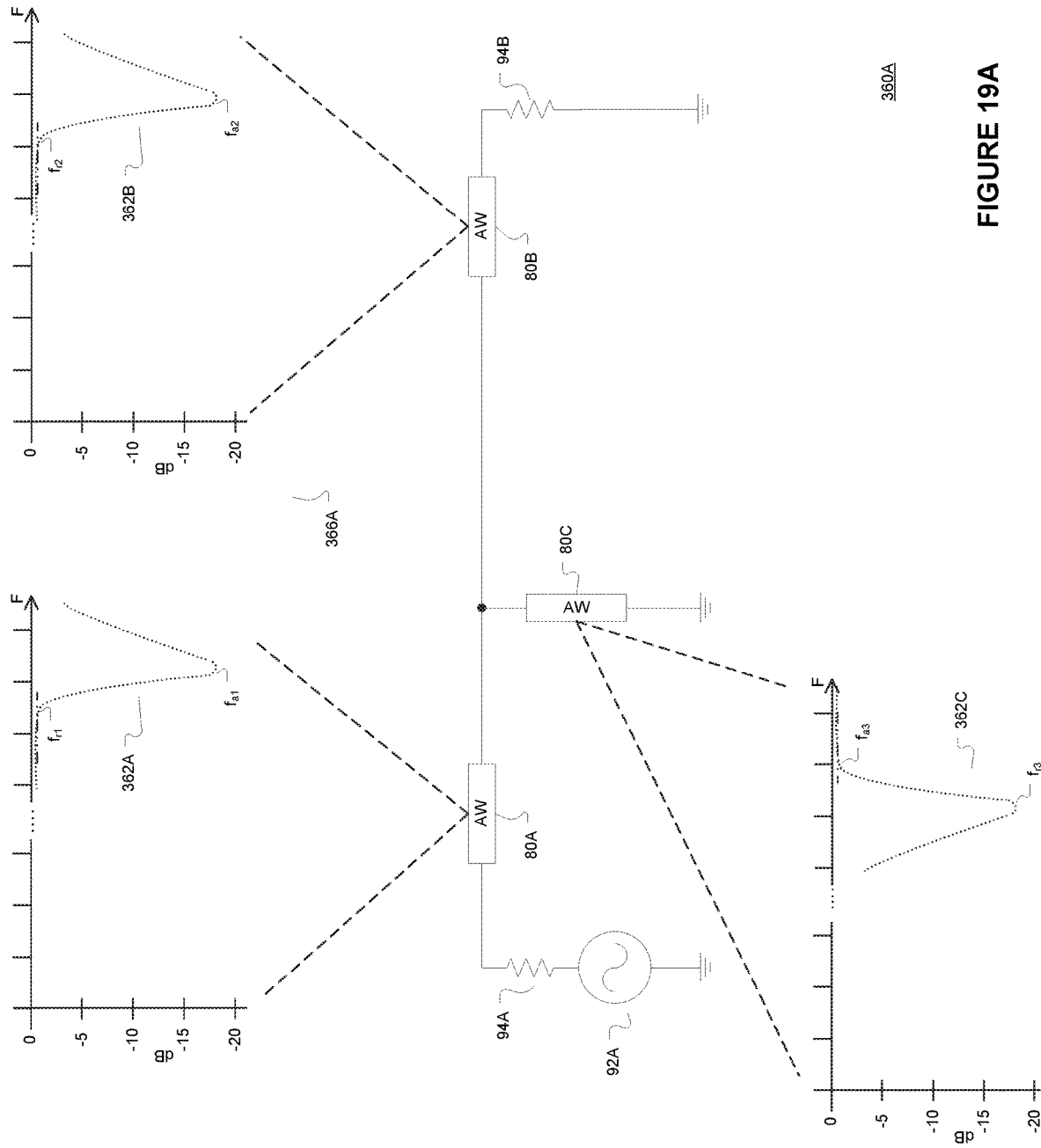
FIG. 19A is a block diagram of an electrical signal filter module including resonators and diagrams of filter frequency responses of resonators according to various embodiments.
Figure 20A:
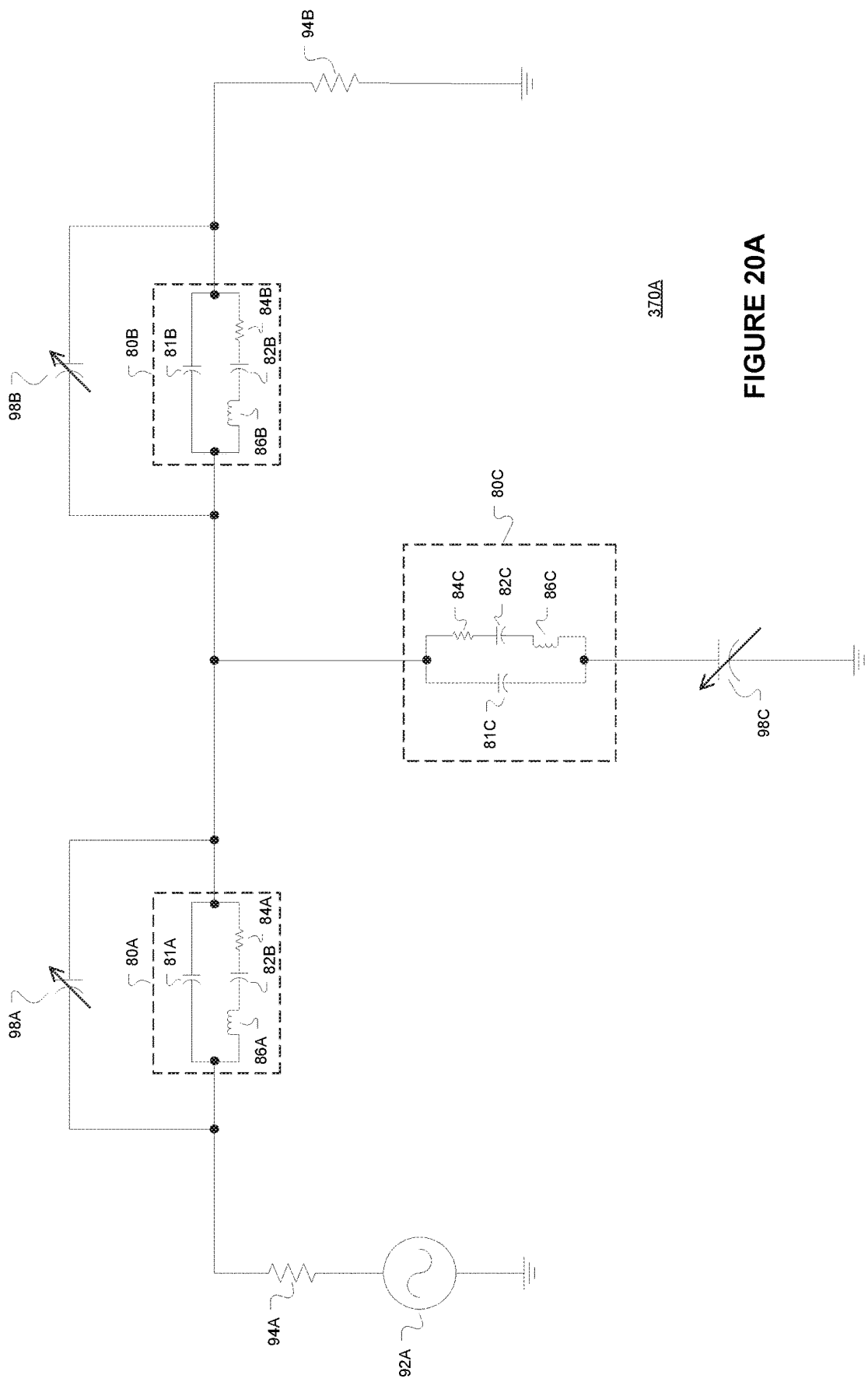
FIG. 20A is a block diagram of a tunable filter module including electrical elements representing the characteristics of tunable resonators according to various embodiments.
Figure 20B:
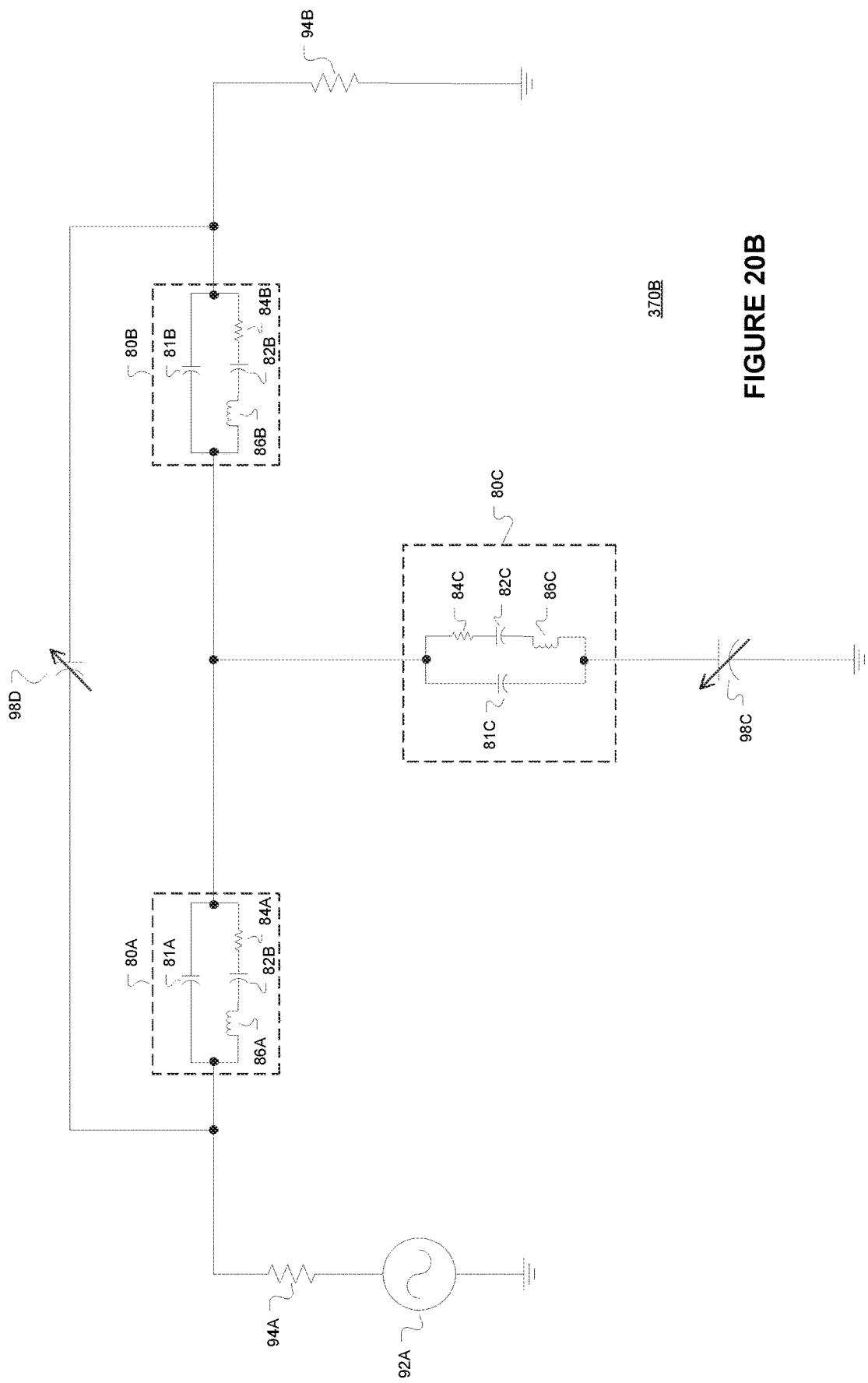
FIG. 20B is a block diagram of another tunable filter module including electrical elements representing the characteristics of tunable resonators according to various embodiments.

FIG. 19A is a block diagram of an electrical signal filter module 360A including resonators 80A, 80B, 80C and diagrams of filter frequency responses 362A, 362B, 362C of resonators 80A, 80B, 80C, respectively according to various embodiments. A resonator 80A, 80B, 80C may be represented by corresponding electrical components according to various embodiments such as shown in FIGS. 2B, 20A, 20B. As shown in FIG. 2B, 20A, 20B, a resonator 80A, 80B, 80C may be represented by a first capacitor 81A, 81B, 81C in parallel with a series coupling of an inductor 86A, 86B, 86C, second capacitor 82A, 82B, 82C, and resistor 84A, 84B, 84C where the capacitors 81A, 81B, 81C, 82A, 82B, 82C may have a capacitance of $C_{OA}$, $C_{OB}$, $C_{OC}$, $C_{MA}$, $C_{MB}$, $C_{MC}$, respectively, inductors 86A, 86B, 86C may have an inductance of $L_{MA}$, $L_{MB}$, $L_{MC}$ and the resistors 84A, 84B, 84C may have a resistance of $R_{MA}$, $R_{MB}$, $R_{MC}$ in an embodiment.

The values of $C_{MA}$, $C_{MB}$, $C_{MC}$ and $L_{MA}$, $L_{MB}$, $L_{MC}$ may be related to the elasticity and inertia of an AW 80A, 80B, 80C in an embodiment. The values of $C_{OA}$, $C_{OB}$, $C_{OC}$ may represent the effective capacitance of the transverse electric fingers in the piezoelectric material of the AW 80A, 80B, 80C in an embodiment. The values of $R_{MA}$, $R_{MB}$, $R_{MC}$ may represent the heat generated by mechanical motion in the AW 80A, 80B, 80C (the effective quality or Q limiter of the AW) in an embodiment. Using the values $C_{OA}$, $C_{MA}$, $L_{MA}$, and $R_{MA}$ for the first capacitor 81A, the inductor 86A, the second capacitor 82B, and the resistor 84A for resonator 80A, the resonance $w_r$ and the anti-resonance $w_a$ of the acoustic wave (AW) device 80A may be defined by the following equations:

$$w_{r1} \equiv \frac{1}{\sqrt{L_{MA}C_{MA}}} \text{ and } w_{a1} \equiv \frac{1}{\sqrt{L_{MA}C_{MA}C_{OA}/(C_{MA}+C_{OA})}}.$$

Using these equations the AW 80A may form the frequency response 362A shown in FIG. 19A, the response similar to a low pass filter with a pass band about the resonate frequency, $f_{r1}$ and stop band about the anti-resonance $f_{a1}$. Similarly, the AW 80B may form the frequency response 362B shown in FIG. 19A, the response similar to a low pass filter with a pass band about the resonate frequency, $f_{r2}$ and stop band about the anti-resonance $f_{a2}$. The AW 80C may form a short path and its frequency response 362C shown in FIG. 19A may be similar to a high pass filter with a pass band about the anti-resonance $f_{a3}$ and stop band about the resonate frequency, $f_{r3}$. It is noted that the resonator AW 80A, 80B, 80C resonate and anti-resonate frequencies $f_{r1}$, $f_{r2}$, $f_{r3}$ and $f_{a1}$, $f_{a2}$, $f_{a3}$ may be fixed as a function of the physical characteristics of the AW devices 80A, 80B, 80C. Using the resultant frequency response of an AW device 80A, 80B, 80C based on its physical characteristics, various filter responses may be formed by various combinations of the devices 80A, 80B, 80C.

Figure 19B:
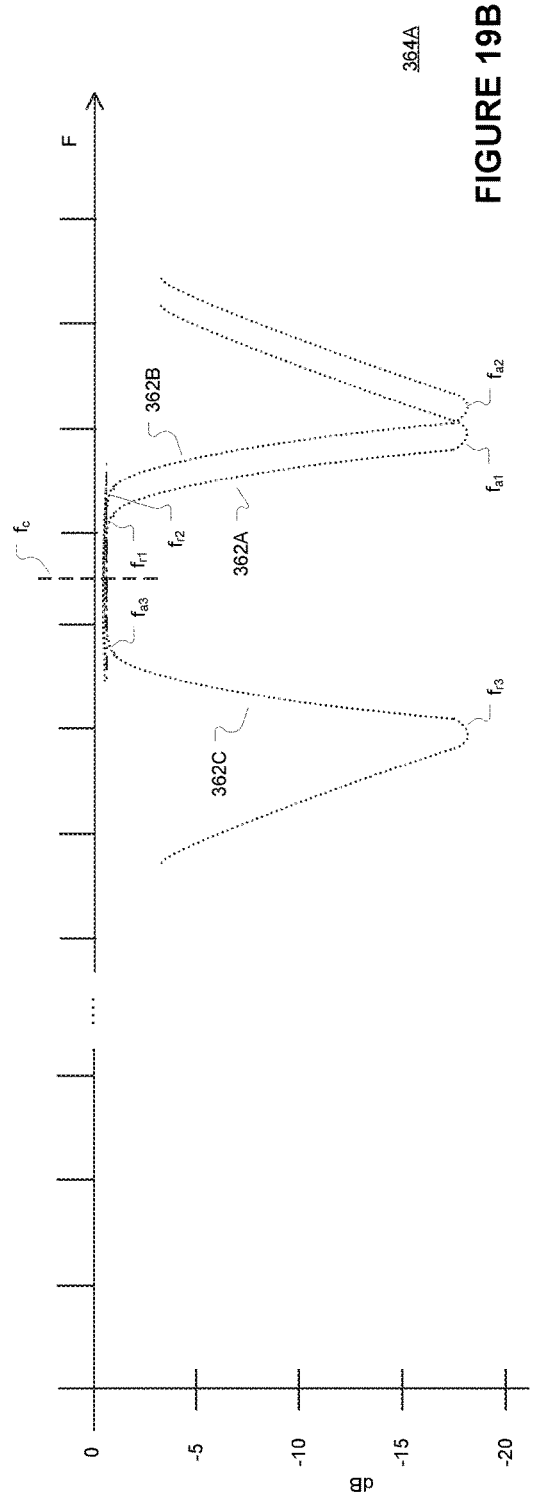
FIG. 19B is a diagram of filter frequency responses of the electrical signal filter module including resonators of FIG. 19A in a first, pass-band filter mode according to various embodiments.

FIG. 19B is a diagram of filter frequency responses 362A, 362B, 362C of the electrical signal filter module 360A including resonators 80A, 80B, 80C of FIG. 19A in a first, pass-band filter configuration 364A having a center frequency $f_c$ according to various embodiments. FIG. 19D is a diagram of the effective combination of filter frequency responses 362A, 362B, 362C of the electrical signal filter module 360A including resonators 80A, 80B, 80C of FIG. 19A in the first, pass-band filter configuration 364C having a center frequency $f_c$ according to various embodiments.

In FIGS. 19B and 19D the AW device 80A frequency response 362A resonate frequency, $f_{r1}$ may be configured to be greater than $f_c$ of the filter 364A and accordingly its stop band about the anti-resonance $f_{a1}$ also greater than $f_c$ of the filter 364A and its resonate frequency, $f_{r1}$. Similarly, the AW device 80B frequency response 362B resonate frequency, $f_{r2}$ may be configured to be greater than $f_c$ of the filter 364A and the AW device 80A frequency response 362A resonate frequency, $f_{r1}$. The AW device 80B stop band about its anti-resonance $f_{a2}$ may also be greater than $f_c$ of the filter 364A, its resonate frequency, $f_{r2}$ and the AW device 80A resonate frequency, $f_{r1}$ and anti-resonate frequency, $f_{a1}$. The short part AW device 80C frequency response 362C anti-resonate frequency, $f_{a3}$ may be configured to be less than $f_c$ of the filter 364A and accordingly its stop band about the resonance $f_{r3}$ also less than $f_c$ of the filter 364A and its anti-resonate frequency, $f_{a3}$. As shown in FIG. 19D the effective combination of the AW devices 80A, 80B, 80C having the frequency responses 362A, 362B, 362C as shown in FIG. 19B (based on the AW devices physical characteristics) may form the band pass filter 364C with bandwidth 366A.

Figure 19C:
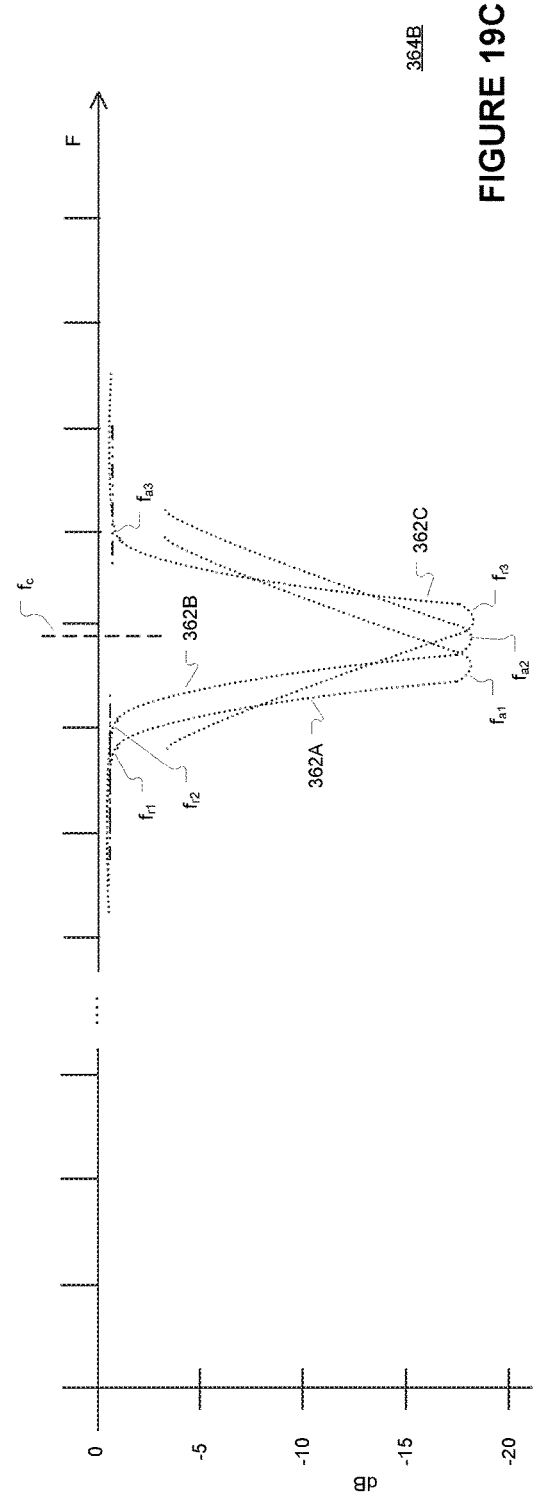
FIG. 19C is a diagram of filter frequency responses of the electrical signal filter module including resonators of FIG. 19A in a second, notch filter mode according to various embodiments.

FIG. 19C is a diagram of filter frequency responses 362A, 362B, 362C of the electrical signal filter module 360A including resonators 80A, 80B, 80C of FIG. 19A in a notch filter configuration 364B having a center frequency $f_c$ according to various embodiments. FIG. 19E is a diagram of the effective combination of filter frequency responses 362A, 362B, 362C of the electrical signal filter module 360A including resonators 80A, 80B, 80C of FIG. 19A in the notch filter configuration 364E having a center frequency $f_c$ according to various embodiments.

In FIGS. 19C and 19E the AW device 80A frequency response 362A anti-resonate stop-band frequency, $f_{a1}$ may be configured to be less than $f_c$ of the filter 364A and accordingly its pass band about the resonance $f_{r1}$ also less than $f_c$ of the filter 364A and its anti-resonate frequency, $f_{a1}$. The AW device 80B frequency response 362B anti-resonate frequency, $f_{a2}$ may be configured to be about the center frequency, $f_c$ of the filter 364B and greater than the AW device 80A frequency response 362A anti-resonate frequency, $f_{a1}$. The AW device 80B pass band about its resonance $f_{r2}$ may also be less than $f_c$ of the filter 364B, its anti-resonate frequency, fat and the AW device 80A anti-resonate frequency, $f_{a1}$. The AW device 80B pass band about its resonance $f_{r2}$ may be greater the AW device 80A resonate frequency, $f_{r1}$.

The short part AW device 80C frequency response 362C stop-band resonate frequency, $f_{r3}$ may be configured to be greater than $f_c$ of the filter 364A and accordingly its pass-band about the anti-resonance $f_{a3}$ also greater than $f_c$ of the filter 364A and its resonate frequency, $f_{r3}$. As shown in FIG. 19E the effective combination of the AW devices 80A, 80B, 80C having the frequency responses 362A, 362B, 362C as shown in FIG. 19C (based on the AW devices physical characteristics) may form the notch filter 364D with bandwidth 366B.

Figure 21A:
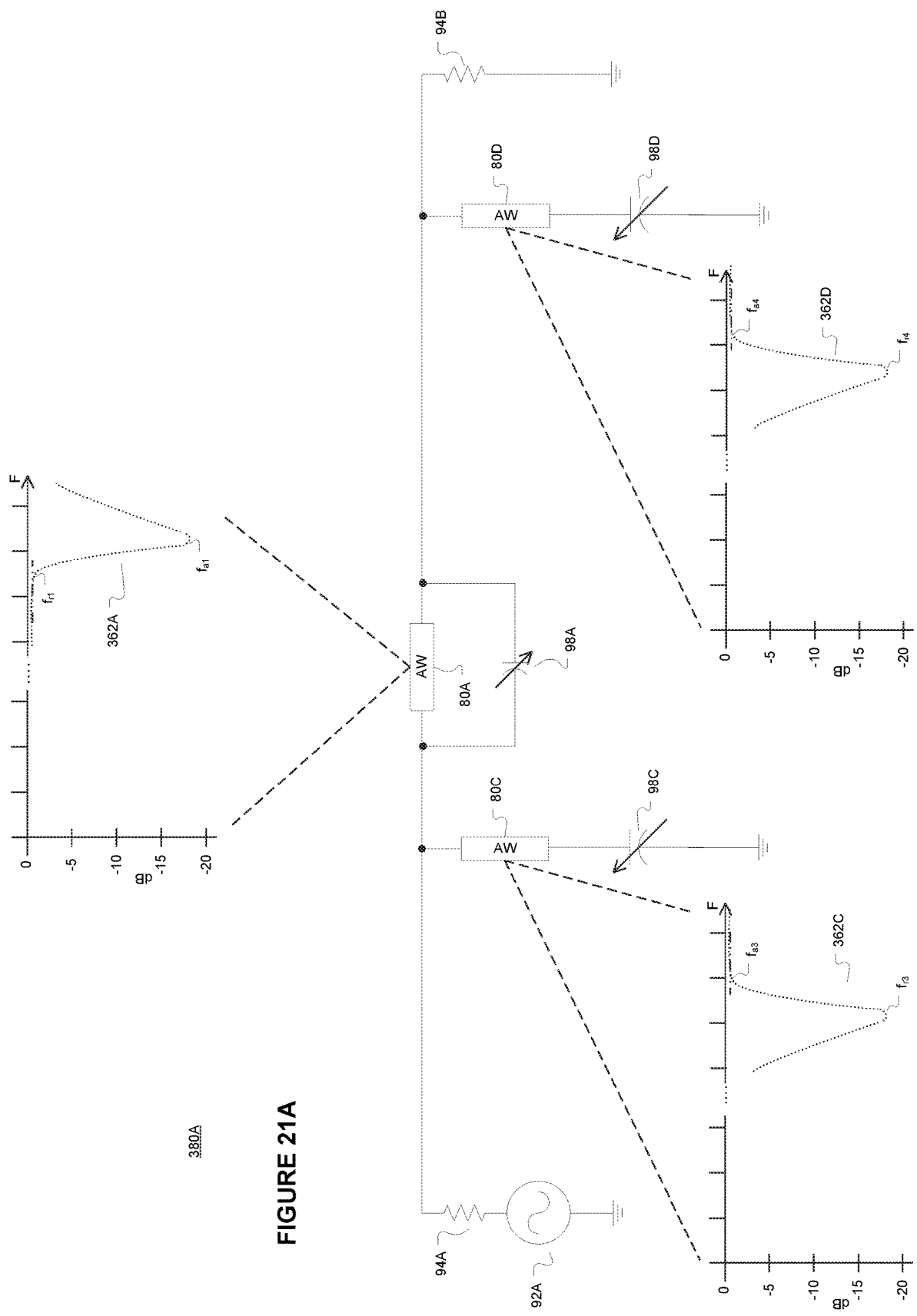
FIG. 21A is a block diagram of an electrical signal filter module including resonators and diagrams of filter frequency responses of resonators according to various embodiments.

FIG. 21A is a block diagram of a tunable electrical signal filter module 380A including resonators 80A, 80C, 80D, variable capacitors 98A, 98C, and 98D, and diagrams of filter frequency responses 362A, 362C, 362D of resonators 80A, 80C, 80D, respectively according to various embodiments. In an embodiment, the variable capacitor 98A may be coupled in parallel to the AW device 80A. The variable capacitor 98C may be coupled in series with the AW device 80C. The variable capacitor 98D may be coupled in series with the AW device 80D. The AW device 80C coupled in series with the variable capacitor 98C may form a first short path. The AW device 80D coupled in series with the variable capacitor 98D may form a second short path.

Similar to FIG. 19A the AW 80A may form the frequency response 362A shown in FIG. 21A, the response similar to a low pass filter with a pass band about the resonate frequency, $f_{r1}$ and stop band about the anti-resonance $f_{a1}$. The AW 80C may form a short path and its frequency response 362C shown in FIG. 21A may be similar to a high pass filter with a pass band about its anti-resonance $f_{a3}$ and a stop band about its resonate frequency, $f_{r3}$. The AW 80D may also form a short path and its frequency response 362D shown in FIG. 21A may be similar to a high pass filter with a pass band about its anti-resonance $f_{a4}$ and a stop band about its resonate frequency, $f_{r4}$.

It is noted that the resonator AW devices 80A, 80C, 80D resonate and anti-resonate frequencies $f_{r1}$, $f_{r3}$, $f_{r4}$ and $f_{a1}$, $f_{a3}$, $f_{a4}$ may be fixed as a function of the physical characteristics of the AW devices 80A, 80C, 80D. The variable capacitors 98A, 98C, 98D may shift the device 80A, 80C, 80D characteristics as described above. Using the resultant frequency response of a AW device 80A, 80C, 80D based its physical characteristics various filter responses may be formed by various combinations of the devices 80A, 80C, 80D.

FIG. 21B is a diagram of filter frequency responses 362A, 362C, 362D of the electrical signal filter module 380A (FIG. 21A) including resonators 80A, 80C, 80D of FIG. 21A in a notch filter configuration 380B having a center frequency $f_c$ according to various embodiments. FIG. 21C is a diagram of the effective combination 380C of filter frequency responses 362A, 362C, 362D of the electrical signal filter module 380A including resonators 80A, 80C, 80D of FIG. 21A in the notch configuration 380C having a center frequency $f_c$ and bandwidth 386C according to various embodiments.

In FIGS. 21B and 21C the AW device 80A frequency response 362A anti-resonate stop-band frequency, $f_{a1}$ may be configured to be less than $f_c$ of the filter 380B and accordingly its pass band about the resonance $f_{r1}$ also less than $f_c$ of the filter 380B and its anti-resonate frequency, $f_{a1}$. The short part AW device 80C frequency response 362C stop-band resonate frequency, $f_{r3}$ may be configured to be about the $f_c$ of the filter 380A and accordingly its pass-band about the anti-resonance $f_{a3}$ greater than $f_c$ of the filter 380A and its resonate frequency, $f_{r3}$. The second short part AW device 80D frequency response 362D stop-band resonate frequency, $f_{r4}$ may be configured to be greater than the $f_c$ of the filter 380A and accordingly its pass-band about the anti-resonance $f_{a3}$ greater than $f_c$ of the filter 380A and its resonate frequency, $f_{r3}$. As shown in FIG. 21C the effective combination of the AW devices 80A, 80C, 80D having the frequency responses 362A, 362C, 362D as shown in FIG. 21C (based on the AW devices physical characteristics) may form the notch filter 380C with bandwidth 386C.

FIG. 20A is a block diagram of a tunable filter module 370A including electrical elements representing the characteristics of tunable resonators 80A, 80B, 80C according to various embodiments. As shown in FIG. 20A, the filter module 370A may include AW devices 80A, 80B, 80C, variable capacitors 98A, 98B, and 98C, a signal source or generator 92A, resistors 94A representing an input load, and a resistor 94B representing an antenna load. The variable capacitor 98A may be coupled in parallel to the AW device 80A. The variable capacitor 98B may be coupled in parallel to the AW device 80B. The variable capacitor 98C may be coupled in series with the AW device 80C.

As shown in 20A a resonator 80A, 80B, 80C may be represented by a first capacitor 81A, 81B, 81C in parallel with a series coupling of an inductor 86A, 86B, 86C, second capacitor 82A, 82B, 82C, and resistor 84A, 84B, 84C where the capacitors 81A, 81B, 81C, 82A, 82B, 82C may have a capacitance of $C_{OA}$, $C_{OB}$, $C_{OC}$, $C_{MA}$, $C_{MB}$, $C_{MC}$, respectively, inductors 86A, 86B, 86C may have an inductance of $L_{MA}$, $L_{MB}$, $L_{MC}$ and the resistors 84A, 84B, 84C may have a resistance of $R_{MA}$, $R_{MB}$, $R_{MC}$ in an embodiment. As noted the AW devices 80A, 80B, 80C physical characteristics may be selected to create one or filter modules (band-pass 364C of FIG. 19D and notch 364D of FIG. 19E). In order for the variable capacitors 98A, 98B, 98C to have a desired tuning effect on the corresponding AW device 80A, 80B, 80C, their capacitance range may need to be significant relative the effective inductance $L_{MA}$, $L_{MB}$, $L_{MC}$ of the AW devices 80A, 80B, 80C.

A variable capacitor 98A, 98B, 98C may consume significant die area of a semiconductor including the capacitors and affect the Q (quality) of a filter 370A including the capacitors 98A, 98B, 98C. In an embodiment a filter 364D of FIG. 19E may have a center frequency of about 800 MHz. The AW 80A, 80B, 80C may be selected to have resonate frequencies $f_{r1}$, $f_{r2}$, $f_{r3}$ of about 797 MHz, 818 MHz, and 800 MHz, respectively. For such a filter the modeled AW devices 80A, 80B, 80C inductance $L_{MA}$, $L_{MB}$, $L_{MC}$ may be about 30 nH, 30 nH, and 132 nH, respectively. In order to effectively tune the AW devices 80A, 80B, 80C, the 98A, 98B, 98C capacitance range may need to be about 4-9.5 pF, 3.5-13 pF, and 2-10 pF in an embodiment. In this example the Q of the resonators may be about 500 and the Q of the variable capacitors 98A, 98B, and 98C may be about 100.

In an embodiment, the AW device 80A may be similar to the AW device 80B. In this embodiment the variable capacitor 98A may also be similar to the variable capacitor 98B. As shown in FIG. 20B a single variable capacitor 98D may be used to effectively tune both the AW device 80A and the AW device 80B. In the filter module 370B, the variable capacitor 98D is coupled in parallel to the serial coupled AW devices 80A, 80. Using the filter module 370B of FIG. 20B, the AW 80A, 80B, 80C may be selected to have resonate frequencies $f_{r1}$, $f_{r2}$, $f_{r3}$ of about 800 MHz, 805 MHz, and 800 MHz, respectively. For such a filter the modeled AW devices 80A, 80B, 80C inductance $L_{MA}$, $L_{MB}$, $L_{MC}$ may be about 46 nH, 77 nH, and 44 nH, respectively. In order to effectively tune the AW devices 80A, 80B, 80C of filter 370B, the 98D and 98C capacitance range may need to be about 2-4 pF and 2.5-3.3 pF in an embodiment, a substantial reduction in capacitance relative to the capacitors 98A, 98B, 98C of filter module 370A of FIG. 20A. The filter module or configuration 370B of FIG. 20B may lower the insertion loss of the filter and improved the Q of the filter module 370B. In an embodiment, the AW devices 80A, 80B, and 80C may include 41 degree lithium niobate (LiNbO$_3$).

As noted above an acoustic wave (AW) device such as 80A, 80B, 80C shown in FIG. 4, resonate and anti-resonate frequencies $f_{rO}$, $f_{aO}$ may vary due to manufacturing variants and operating temperature. In addition a variable capacitor such as device such as 98A, 98B, 98C shown in FIG. 4, selected or variable capacitance co m (where x is variable capacitance selection x) may vary due to manufacturing variants and operating temperature. In an embodiment, a system such as 430 shown in FIG. 23 may adjust one or more variable capacitors tuning signals 442A, 442B, 442C based on measured manufacturing variants for AW devices 80A, 80B, 80C and variable capacitors 98A, 98B, 98C and the operating temperature of the system 430 near the AW modules 98A, 98B, 98C.

In an embodiment a temperature sensor module 444A electrically coupled to a contact 444B near the AW modules 98A, 98B, 98C may calculate the temperature near the AW modules 98A, 98B, 98C. A control logic module 446 may use the calculated temperature and known manufacturing variants for the system 430 components to control or modulate one or more variable capacitors 98A, 98B, 98C via their control signals 442A, 442B, 442C.

Figure 23:
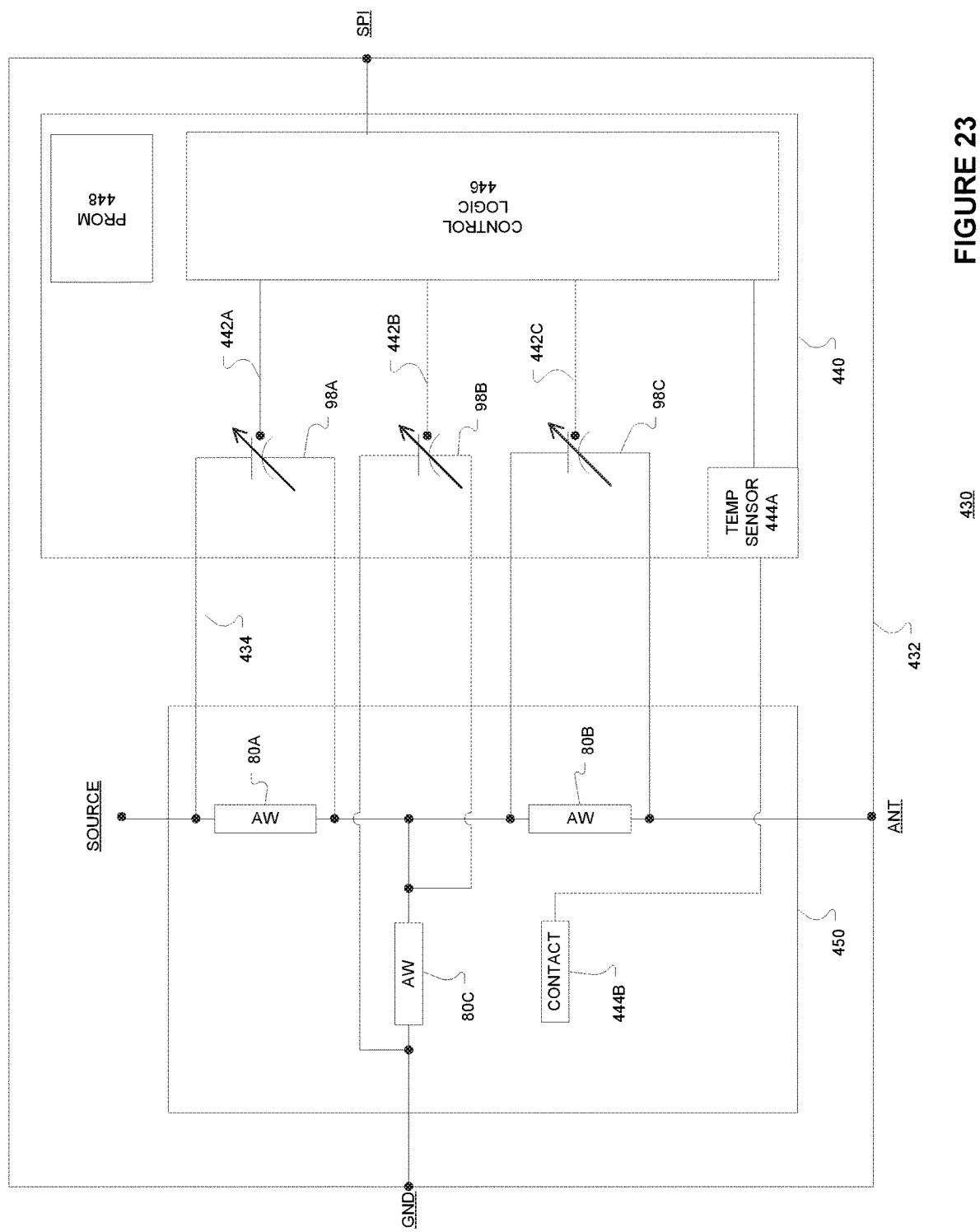
FIG. 23 is a block diagram of a configuration for a tunable filter module including tunable resonators according to various embodiments.

In an embodiment, the AW modules 98A, 98B, 98C may be configured to operate at a nominal operating temperature where the actual environmental temperature may be below or above the nominal operating temperature. The control logic module 446 may determine the differential between the AW modules' 98A, 98B, 98C nominal operating temperature and the calculated or determined environmental temperature. An AW modules' 98A, 98B, 98C nominal operating temperature may be stored in the PROM 448 (FIG. 23). Further a SPI signal may provide desired settings for the variable capacitors 98A, 98B, 98C. The control logic module 446 may adjust the SPI based settings for the variable capacitors 98A, 98B, 98C based on the calculated environmental temperature and known manufacturing variants for the system 430 components.

In an embodiment a programmable read only memory (PROM) 448 may include manufacturing variance characteristics for one or more components 80A to 80C and 98A to 98C of the system 430. The PROM 448 characteristics may include the possible resonate and anti-resonate frequencies $f_{rO}$, $f_{aO}$ for each AW module 80A to 80C or a delta between the optimal or normal resonate and anti-resonate frequencies $f_{rO}$, $f_{aO}$ and the probable resonate and anti-resonate frequencies $f_{rO}$, $f_{aO}$ for each AW module 80A to 80C. The control logic module 446 may use the delta or differential frequency or probable frequency for each AW module 80A to 80C to calculate a desired correction to be achieved by modulating a corresponding variable capacitor 98A to 98C.

Figure 22B:
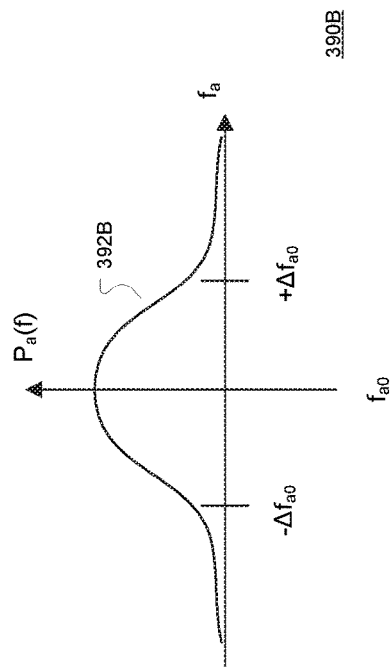
FIG. 22B is a diagram of an anti-resonant frequency probably function representing manufacturing variations for an acoustic wave (AW) device the according to various embodiments.
Figure 22D:
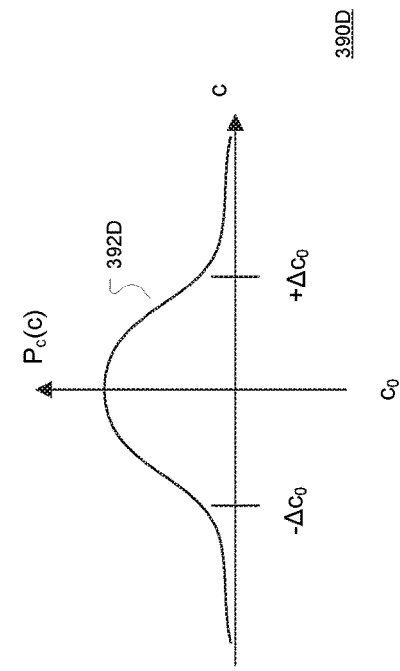
FIG. 22D is a diagram of a capacitance per unit area probably function representing manufacturing variations for a capacitor module the according to various embodiments.
Figure 22A:
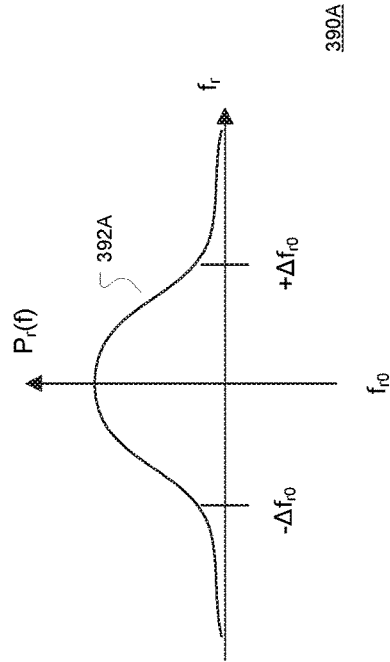
FIG. 22A is a diagram of a resonant frequency probably function representing manufacturing variations for an acoustic wave (AW) device the according to various embodiments.

FIG. 22A is a diagram of a resonant frequency $f_{rO}$ probably function $P_r(f)$ 392A representing manufacturing variations for an acoustic wave (AW) module according to various embodiments. FIG. 22B is a diagram of an anti-resonant frequency $f_{aO}$ probably function $P_a(f)$ 392B representing manufacturing variations for an acoustic wave (AW) module according to various embodiments. FIG. 22D is a diagram of a capacitance per unit area co probably function $P_c(f)$ 392D representing manufacturing variations for a capacitor module according to various embodiments. In an embodiment, the PROM 448 may include data representing each $P_r(f)$ 392A, $P_a(f)$ 392B, $P_c(f)$ 392C including the measured standard deviation $\Delta f_{rO}$, $\Delta f_{aO}$, $\Delta f_{cO}$ for each function 392A to 392C where the functions are approximately Gaussian in nature (as measured or sampled).

In an embodiment a programmable read only memory (PROM) 448 may also include temperature variance characteristics for one or more components 80A to 80C of the system 430. The PROM 448 characteristics may include the possible resonate and anti-resonate frequencies $f_{rO}$, $f_{aO}$ for each AW module 80A to 80C or a delta between the optimal or normal resonate and anti-resonate frequencies $f_{rO}$, $f_{aO}$ and the probable resonate and anti-resonate frequencies $f_{rO}$, $f_{aO}$ for each AW module 80A to 80C based on temperature. The control logic module 446 may use the temperature delta or differential frequency or probable frequency for each AW module 80A to 80C to calculate a desired correction to be achieved by modulating a corresponding variable capacitor 98A to 98C.

Figure 22C:
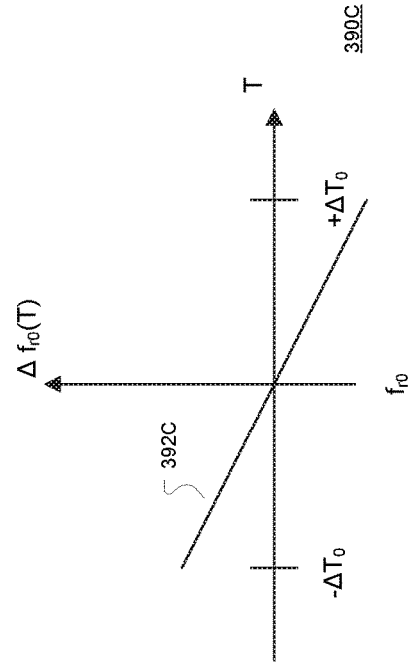
FIG. 22C is a diagram of a resonant frequency function representing temperature variations for an acoustic wave (AW) module the according to various embodiments.

In an embodiment, the resonant and anti-resonant frequency variation 392C for an AW module 80A to 80C may be linear as shown in FIG. 22C. As shown in FIG. 22C for a positive temperature delta $\Delta T_0$ from a nominal temperature (such as room temperature), an AW module 80A to 80C resonant or anti-resonant frequency may be reduced by a predetermined number based on the slope of the temperature function 392C and magnitude of the temperature delta $\Delta T_0$. Similarly, as shown in FIG. 22C for a negative temperature delta $-\Delta T_0$ from a nominal temperature (such as room temperature), an AW module 80A to 80C resonant or anti-resonant frequency may be increased by a predetermined number based on the slope of the temperature function 392C and magnitude of the negative temperature delta $-\Delta_{T0}$.

In an embodiment, the control logic module 446 may combine manufacturing variation deltas and temperature variation deltas provided by the PROM 448 for a component 80A to 80C to determine or calculate an overall delta or correction for corresponding variable capacitor 98A to 98C. In a further embodiment the control logic module 446 may combine manufacturing variation deltas and temperature variation deltas provided by the PROM 448 for a component 80A to 80C and a manufacturing variation deltas provided by the PROM 448 for a corresponding variable capacitor 98A to 98C to determine or calculate an overall delta or correction for the corresponding variable capacitor 98A to 98C.

In an embodiment, the PROM 448 data may be updatable via one or more methods. In such an embodiment the PROM 448 characteristic data for temperature or manufacturing variants for one or more components 80A to 80C may be updated based on measured response or updated component testing. Similarly characteristic data for manufacturing variants for one or more capacitors 98A to 98C may be updated based on measured response or updated component testing. In an embodiment, the system 430 control logic module 446 may include memory for storing temperature and manufacturing characteristics for components 80A to 80C and manufacturing characteristics for components 98A to 98C.

Figure 24:
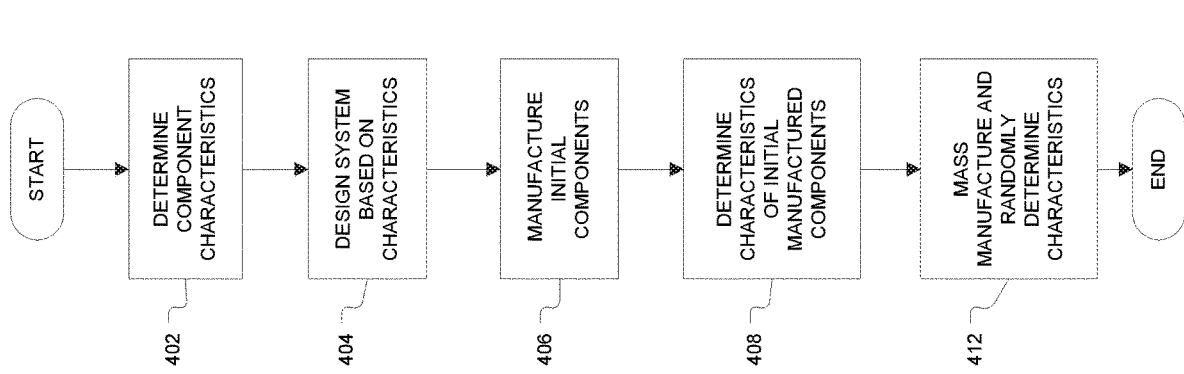
FIG. 24 is a flow diagram of a component modeling, manufacturing, and configuration method according to various embodiments.

In order to produce AW modules 80A to 80C or variable capacitors 98A to 98C or other components having possible variable system characteristics due to manufacturing a process 400 shown in FIG. 24 may be employed. FIG. 24 is a flow diagram of a component modeling, manufacturing, and configuration method according to various embodiments. In the process 400 general component characteristics of an AW module 80A to 80C or variable capacitor module 98A to 98C may be determined. In order to design and manufacture an AW module 80A to 80C or variable capacitor module 98A to 98C having desired parameters, test devices or related modules may be produced and its characteristics evaluated (activity 402). In particular, key or critical parameters may be checked for the test devices including resonant and anti-resonant frequencies for an AW module related device and capacitance per unit area for a capacitor or series of capacitors forming a digital, variable capacitor related device.

Based on the test devices and a consistent or well behaved manufacturing process, probability curves or standard deviations for critical parameters of the test devices may be determined. In an embodiment, a Gaussian distribution may be applied and first standard deviations may be determined for each critical parameter probability function. Using correlation(s) between the test devices and an AW module or variable capacitor module to be designed and produced, probability functions (such as each $P_r(f)$ 392A, $P_a(f)$ 392B, $P_c(f)$ 392C) may be determined for the AW module or variable capacitor modules.

Based on the correlations between the test devices and resultant probability functions for critical parameters, an AW module or capacitor module may be designed (activity 404). Without compensating modules or methods as recited by the present invention, an AW module or capacitor module design parameters may be required to be loose to compensate for the manufacturing variants. Employing the AW modules or capacitors in a system 430 (with compensating modules) of the present invention may enable tighter design parameters given the ability to compensate for variants of the system 430. In an embodiment initial, final components (AW module or capacitor modules) based on a design may be produced (activity 406). Then, the initial components based on the associated design may be tested to determine the probability characteristics for key or critical parameters (activity 408).

The determined probability characteristics for the initial final, designed components may be compared to the determined probability characteristics for the test devices. Where the characteristics are correlated as expected, larger quantities of the final, design components may be produced and randomly tested (activity 412). Where the manufacturing process and source is controlled and well-behaved only sparse or random components may need to be tested to confirm correlation to the previously determined probability functions $P_r(f)$ 392A, $P_a(f)$ 392B, $P_c(f)$ 392C. For temperature sensitive components including AW modules, the temperature effects may also be modeled (activity 402) and considered during the component design (activity 404). The temperature characteristics of initial, final components may also be determined (activity 408) prior to producing higher quantities of temperature sensitive components (activity 412). In an embodiment each or batch groups of final, designed component (AW module or variable capacitor module) may be tested and resultant probability function determined for key or critical module characteristics. As noted the determined probability functions may be stored in a system 430 employing a corresponding module (80A to 80C, 98A to 98C).

Figure 25A:
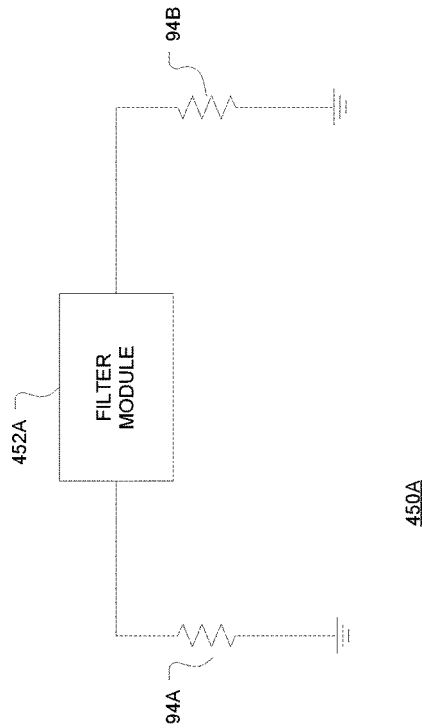
FIG. 25A is a simplified block diagram of a signal filter architecture according to various embodiments.

In addition to adjusting for AW modules' performance variants due manufacturing variants and operating temperature, impedances present at a filter module 452A input or output port may affect the filter module 452A (FIG. 25A) performance. In particular a filter module 452A may be designed for a particular load at its input node and a particular load at its output node. In an embodiment a differential between the target/designed load 94A on the input node or the target/designed load 94B on the output node of a filter module 452A may affect its performance. FIG. 25A is block diagram of signal filter architecture 450A. Architecture 450A includes a filter module 452A, an input load 94A represented by a resistor and an output load 94B represented by a resistor. The filter module 452A may be configured to have a balanced load where the input load impedance 94A and the output load impedance 94B are about equal and have a predetermined level such as 50 ohms in an embodiment.

Figure 25B:
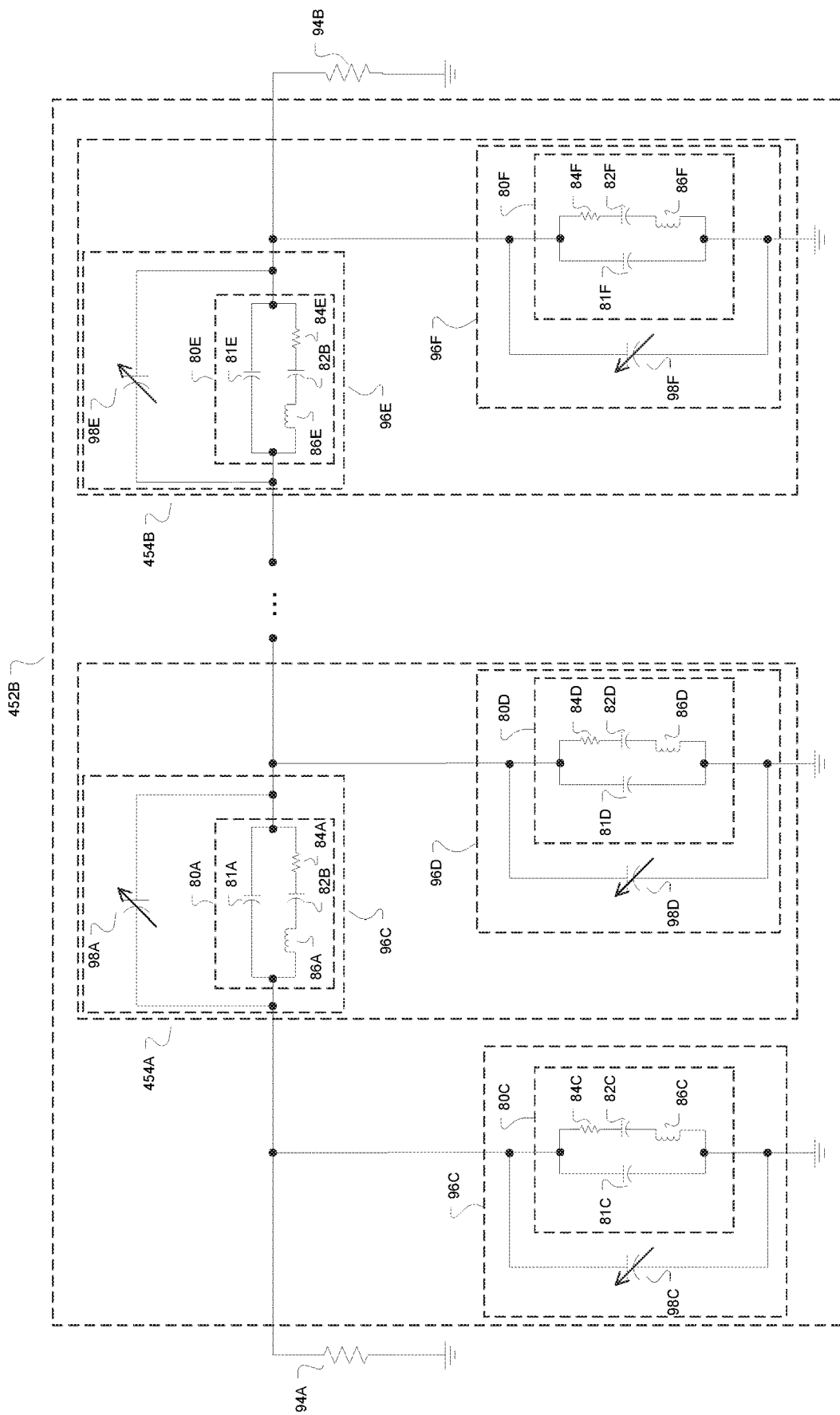
FIG. 25B is a simplified block diagram of a signal filter architecture according to various embodiments.

The ratio between target loads 94A, 94B is related to the Voltage Standing Wave Ratio (VSWR) for the module. As noted, a filter module 452A may be configured for a common VSWR of 1:1 (where the input load 94A is about equal to the output load 94B). For a filter module 452A configured for a VSWR of 1:1 an input-output mismatch (VSWR other than 1:1) may result in a greater input signal insertion loss (greater filter passband loss). FIG. 25B is a block diagram of a signal filter architecture 450B including a tunable filter module 452B that may be configured to reduce effects of impedance mismatches between loads 94A, 94B (VSWR other than expected by filter module 452A, 452B nominally).

As shown in the FIG. 25B the signal filter architecture 450B includes an input load 94A, an output load 94B, and a tunable filter module 452B. The tunable filter module 452B includes multiple tunable AW modules 96A, 96C, 96D, 96E. Each tunable AW module 96A, 96C, 96D, 96E may include an AW device 80A, 80C, 80D, 80E, and 80F (represented by their electrical component equivalents) coupled in parallel to a variable capacitor 98A, 98C, 98D, 98E, and 98F, respectively. The tunable AW module 96C may be coupled to the input load 94A and ground. One or more sub-filter modules 454A, 454B may be coupled between the tunable AW module 96C and the output load 94B.

Each sub-filter module 454A, 454B may include a first tunable AW module 96C, 96E and a second tunable AW module 96D, 96F coupled to ground, respectively. As noted above an AW device 80A, 80C, 80D, 80E, 80F may be modeled from a series of a inductor 86A, 86C, 86D, 86E, 86F, capacitor 82A, 82C, 82D, 82E, 82F, resistor 84A, 84C, 84D, 84E, 84F coupled in parallel with a capacitor 81A, 81C, 81D, 81E, 81F, respectively. Each variable capacitor 98A, 98C, 98D, 98E, and 98F coupled in parallel with an AW device 80A, 80C, 80D, 80E, and 80F may be varied to affect the filter characteristics of the AW device 80A, 80C, 80D, 80E, and 80F.

As noted previously a variable capacitor 98A, 98C, 98D, 98E, and 98F may be employed to modulate an AW device 80A, 80C, 80D, 80E, and 80F to shift a resonant or anti-resonant frequency to select different bands, sub-bands, correct for manufacturing variants, and temperature shifts. A variable capacitor 98A, 98C, 98D, 98E, and 98F may also be employed to modulate an AW device 80A, 80C, 80D, 80E, and 80F to reduce a input signal insertion loss due to an unexpected or non-conforming VSWR (not equal to VSWR the filter model 452B was designed to process).

In an embodiment, the filter module 452B may be designed for a VSWR of about 1:1 and the variable capacitors 98A, 98C, 98D, 98E, and 98F may be modulated to reduce insertion loss due to a VSWR other than 1:1 (non-forming). For example, FIG. 26A is a diagram of the frequency response of the filter module 452B for a VSWR of 1:1 (nominal). As shown in FIG. 26A the insertion loss (passband attenuation) is about 0.5 dB. FIG. 26B is a diagram of the frequency response of the filter module 452B for a VSWR of 1:1.5 and one or more variable capacitors 98A, 98C, 98D, 98E, and 98F modulating a AW device 80A, 80C, 80D, 80E, and 80F, respectively to reduce the insertion loss. As shown in FIG. 26B the insertion loss (passband attenuation) is about 0.68 dB. FIG. 26C is a diagram of the frequency response of the filter module 452B for a VSWR of 1:2 and one or more variable capacitors 98A, 98C, 98D, 98E, and 98F modulating a AW device 80A, 80C, 80D, 80E, and 80F, respectively to reduce the insertion loss. As shown in FIG. 26C the insertion loss (passband attenuation) is about 1 dB.

In another embodiment the PROM 448 of FIG. 23 may be configured to include variable capacitor deltas for various VSWR. A user may be indicate the output load and configure the PROM 448 accordingly. In another embodiment the control logic module may sense the output load, determine the VSWR differential, and choose the closest set of variable capacitor deltas from the PROM 448. In a further embodiment a filter module 452B may be configured or designed for a nominal VSWR (median relative to possible VSWR that the filter module 452B may experience). For example in architecture 450B, VSWRs of 1:1, 1:1.5 and 1:2 may be expected. The filter module 452B may be configured or designed to be optimal for a VSWR of 1:1.5 and the variable capacitors 98A, 98C, 98D, 98E, and 98F may be adjusted to modulate the AW device 80A, 80C, 80D, 80E, and 80F, respectively when the VSWR is 1:1 or 1:2. In a further embodiment a variable capacitor may be placed in series with a AW module 80C, 80F (or 80A, 80E) (such as capacitor 98C in FIG. 20A). The variable capacitor in series with an AW module 80C, 80F may be modulated to compensate for loads 94A, 94B other than the target/designed loads of the filter module 450B.

FIG. 27A is a diagram of the frequency response of the filter module 452A for a VSWR of 1:1 where the filter module 452B is optimized for VSWR of 1:1, 1:1.5, and 1:2 and one or more variable capacitors 98A, 98C, 98D, 98E, and 98F modulate a AW device 80A, 80C, 80D, 80E, and 80F, respectively to reduce the insertion loss for VSWR 1:1. As shown in FIG. 27A the insertion loss (passband attenuation) is about 0.65 dB. FIG. 27B is a diagram of the frequency response of the filter module 452B for a VSWR of 1:1.5 where the filter module 452A is optimized for VSWR of 1:1, 1:1.5, and 1:2 and one or more variable capacitors 98A, 98C, 98D, 98E, and 98F modulate a AW device 80A, 80C, 80D, 80E, and 80F, respectively to reduce the insertion loss for VSWR 1:1.5. As shown in FIG. 27B the insertion loss (passband attenuation) is about 0.62 dB. FIG. 27C is a diagram of the frequency response of the filter module 452B for a VSWR of 1:2 where the filter module 452B is optimized for VSWR of 1:1, 1:1.5, and 1:2 and one or more variable capacitors 98A, 98C, 98D, 98E, and 98F modulate a AW device 80A, 80C, 80D, 80E, and 80F, respectively to reduce the insertion loss for VSWR 1:2. As shown in FIG. 27C the insertion loss (passband attenuation) is about 0.69 dB.

As shown in FIG. 26A to 26C the average insertion loss is about 0.72 dB for a system designed for a VSWR 1:1 and adjusted for VSWR of 1:1.5 and 1:2. As shown in FIG. 27A to 27C the average insertion loss is about 0.65 dB for a system optimized for a range of VSWR from 1:1 to 1:2 and adjusted for VSWR of 1:1.0, 1:1.5, and 1:2. The insertion loss of the filter module 452B optimized for VSWR 1:1 has a lower insertion loss for VSWR 1:1 than the insertion loss for the filter module 452B optimized for a range of VSWR from 1:1 to 1:2 (0.5 dB versus 0.65 db) even with variable capacitor modulation. Accordingly different filter modules 452B for VSWR 1:1 optimization or a range of VSWR may be selected as a function of the expected range of VSWR in a system implementation and minimal acceptable insertion loss criteria.

Figure 28A:
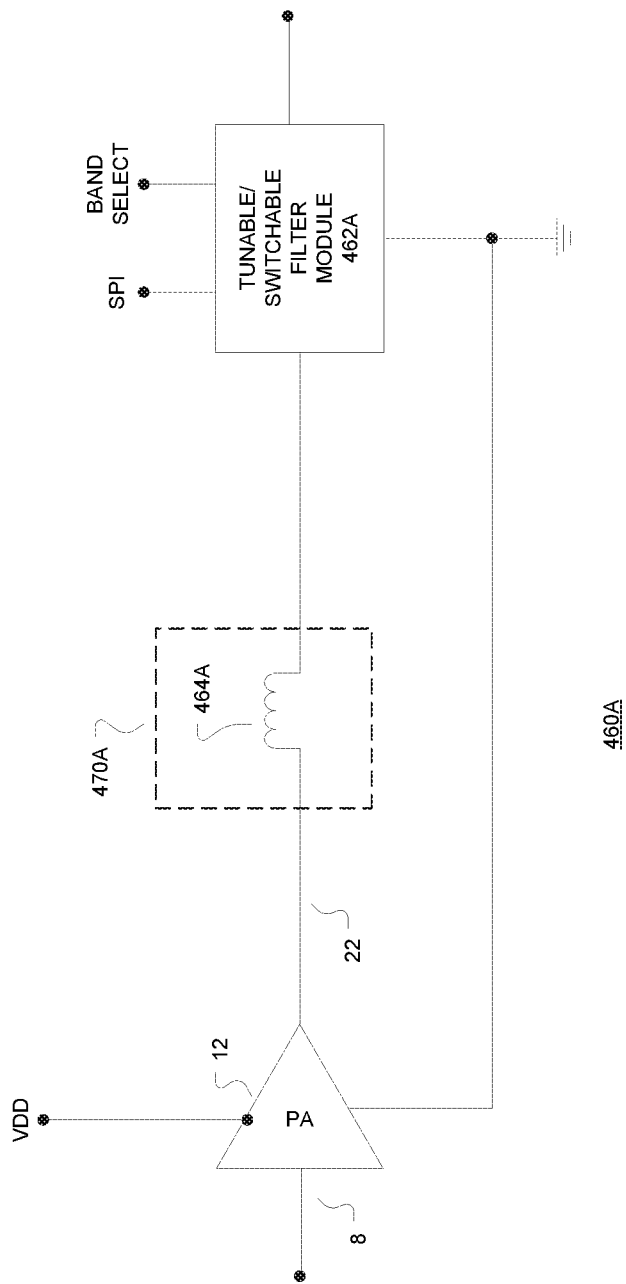
FIG. 28A is a simplified block diagram of a signal filter architecture according to various embodiments.

As noted the VSWR is based on the balance between the input load and output load of a system. As shown in FIG. 1A and FIG. 28A, a power amplifier 12 may, in part provide a load to filter module 452A (FIG. 28A). Power amplifiers 12 commonly produce very low impedance. In order to provide a desired input impedance to the filter module 452A (FIG. 28) or RF switch 40 (FIG. 1A), one or more elements forming an impedance matching module 470A may be placed between the PA 12 and filter module 462A. The impedance matching module 470A may provide the expected impedance at the input port of a filter module 462A. When the filter module 462A is tunable and support filtering different frequency bands, the matching module 470A may not be effective for all the various operating/filtering modes of the tunable filter module 462A.

FIG. 28A is a block diagram of a filter system architecture 460A according to various embodiments. Architecture 460A includes a PA 12, an impedance matching module 470A and a tunable/switchable filter module 462A. The impedance matching module 470A couples the PA 12 to the tunable/switchable filter module 462A. In an embodiment, the tunable/switchable filter module 462A includes a variable capacitor control signal SPI and a band select signal. The tunable/switchable filter module 462A may produce or switch between different frequency responses to process different frequency spectrum or bands. In an embodiment, the impedance matching module 470A may include an inductor 464A. The PA 12 may receive power via input VDD in an embodiment.

Figure 28B:
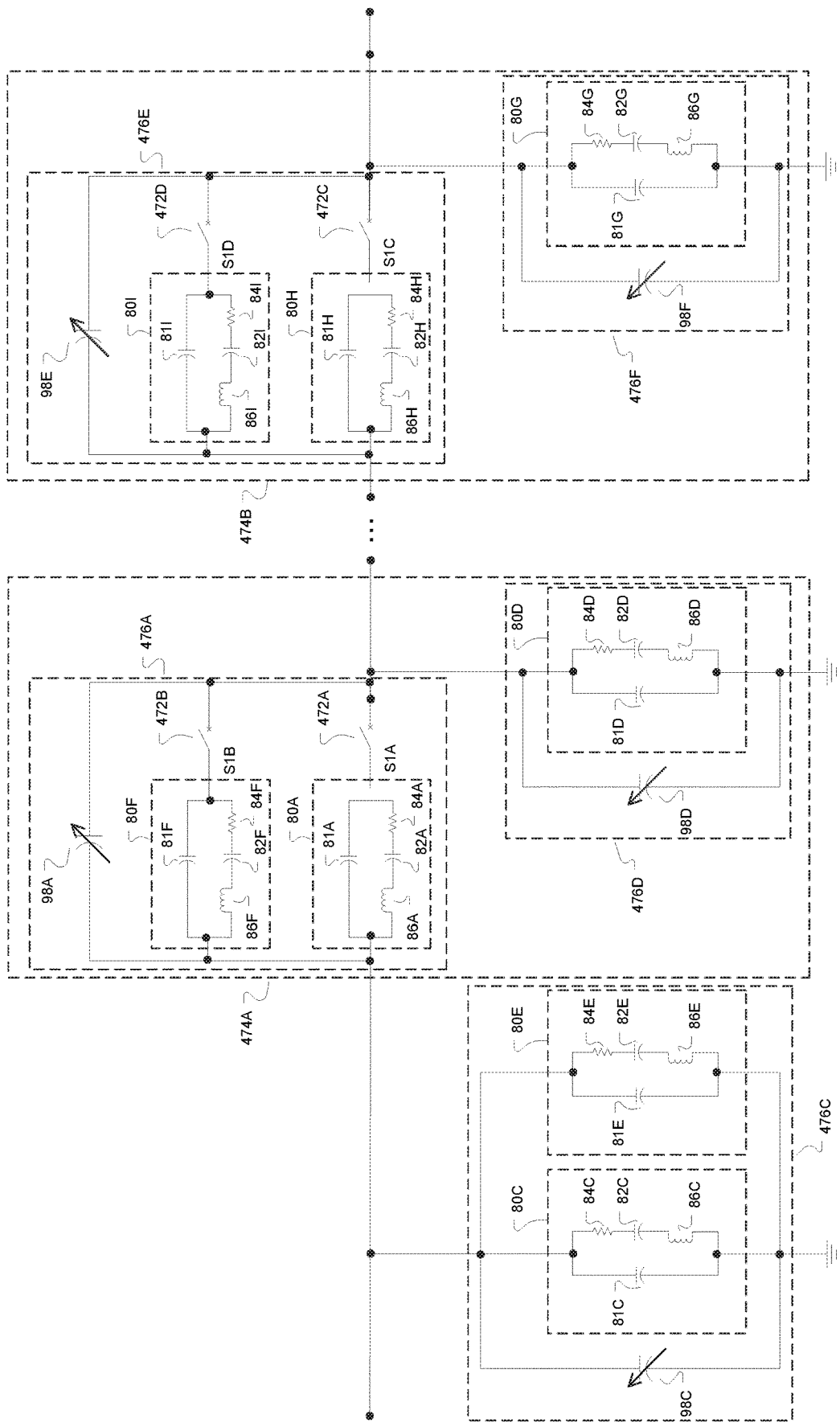
FIG. 28B is a simplified block diagram of a signal filter architecture according to various embodiments.

The inductor 464A may provide the impedance matching function of the impedance matching module 470A. In an embodiment, the inductor may be about a 2 to 3 nH inductor. FIG. 28B is a block diagram of a tunable/switchable signal filter module 462B that may be configured to operate in multiple bands and provide impedance matching with the matching module 470A. In an embodiment, the filter module 462B may be configured to operate in evolved UMTS Terrestrial Radio Access Network e-UTRAN Long Term Evolution (LTE) bands, in particular bands 13 and 17. LTE band 13 may have a transmit band from 776 MHz to 787 MHz and a receive band from 746 MHz to 757 MHz. LTE band 17 may have a transmit band from 704 MHz to 716 MHz and a receive band from 734 MHz to 746 MHz. LTE Bands 13 and 17 are adjacent, tight bands.

As shown in the FIG. 28B tunable/switchable filter module 462B includes multiple tunable AW modules 476C, 476D, 476F and multiple tunable/switchable AW modules 476A, 476E. Tunable AW module 476C may include AW devices 80C and 80E coupled in parallel, the set coupled in parallel to a variable capacitor 98C. The tunable AW module 476C may be coupled to the impedance matching module 470A and ground. Tunable AW module 476D, 476F may include an AW device 80D, 80G coupled in parallel to a variable capacitor 98D, 98F, respectively. One or more sub-filter modules 474A, 474B may be coupled between the tunable AW module 96C and the output load 94B.

Each sub-filter module 474A, 474B may include a first tunable/switchable AW module 476A, 476E and a second tunable AW module 476D, 476F coupled to ground, respectively. Tunable AW module 476A may include AW device 80A in series with a switch 472B coupled in parallel to AW device 80F in series with a switch 472A, the set coupled in parallel to a variable capacitor 98A. Tunable AW module 476E may include AW device 80H in series with a switch 472C coupled in parallel to AW device 80I in series with a switch 472D, the set coupled in parallel to a variable capacitor 98E.

In a first mode the switches 474A to 474D may operate to switch AW module 80A and AW module 80H on (closed) and AW module 80F and AW module 80I off (switch open) for band 13 or 17. In a second mode the switches 474A to 474D may operate to switch AW module 80A and AW module 80H off (switch open) and AW module 80F and AW module 80I on or active (switch closed) for the other of band 13 or 17. The variable capacitors 98A, 98E, 98F, and 98D may be employed to adjust the operation of the AW modules 80F, 80A, 80I, 80H, 80G, and 80D to correct for temperature, output impedance, and manufacturing variants. It is noted that variable capacitor 98A modulates AW module 80A or 80F (is shared) and variable capacitor 98E modulates AW module 80H or 80I (is shared).

Figure 29B:
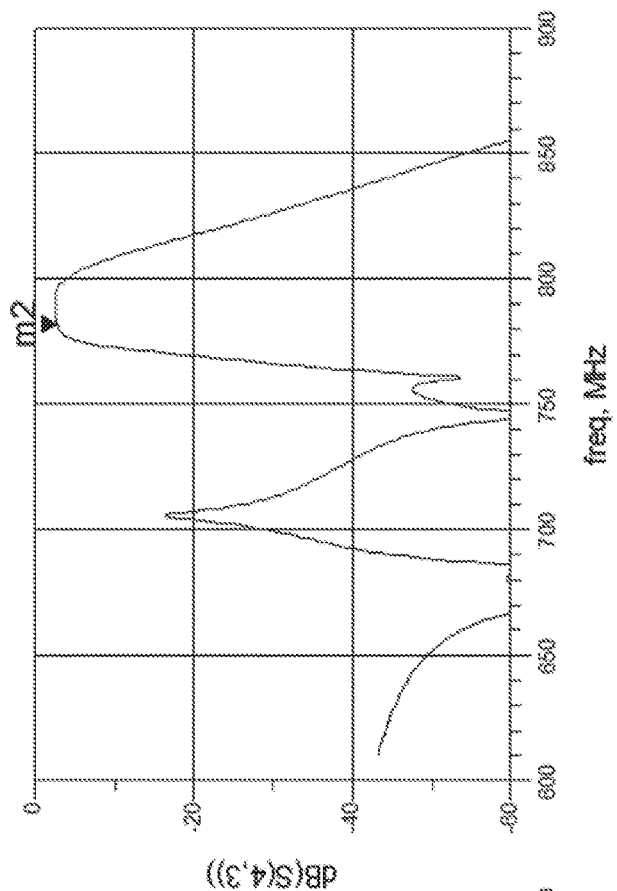
FIGS. 29A and 29B are diagrams of filter frequency responses of a signal filter according to various embodiments.
Figure 29A:
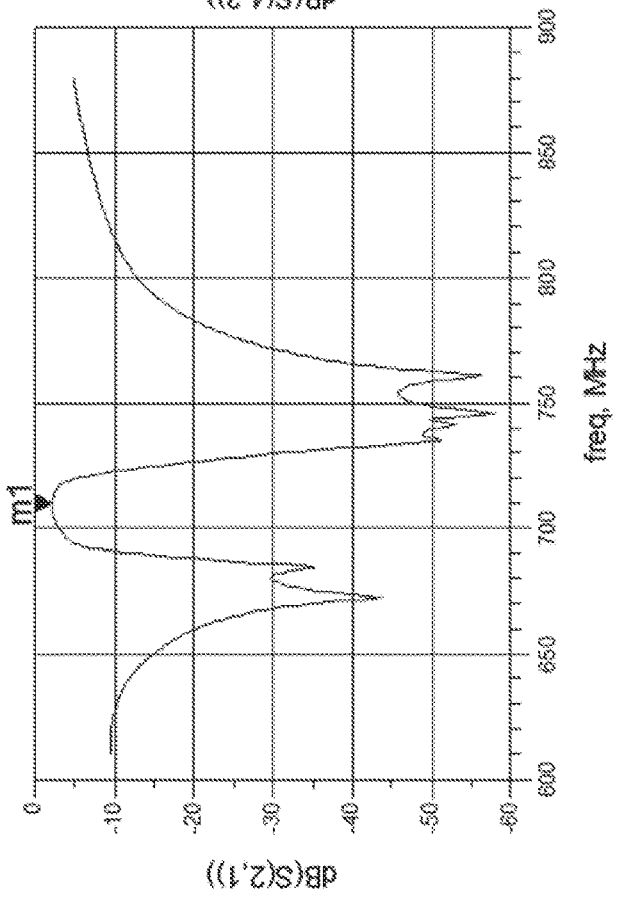

The variable capacitor 98C may be modulated to provide impedance matching between the filter module 462B and the impedance matching module 470A. FIG. 29A is a diagram of the frequency response of the tunable/switchable filter module 462B operating in a first mode to pass signals for LTE band 17 in an embodiment. FIG. 29B is a diagram of the frequency response of the tunable/switchable filter module 462B operating in a second mode to pass signals for LTE band 13 in an embodiment. In an embodiment, the parallel combination of AW modules 80C and 80E are configured to resonate about the LTE band 17 and thereby provide rejection below LTE band 17 and between LTE band 17 and 13. The variable capacitor 98C may also tune the anti-resonant point between LTE band 17 and 13 as a function of the mode of operation (mode 1 or mode 2).

In an embodiment, the switches 472A to 472D may be comprised of stacked CMOS FETs to pass the PA amplified signals. The use of multiple sub-filters 474A, 474B in series may reduce the stack size and power across the switches 474A to 474D as the signal is shared across the sub-filters. In a further embodiment the capacitors 98A and 98E may be fixed. Their capacitance may be preset based on known manufacturing variants, operating temperature variants, and impedance matching (output) corrections that are fixed for the filter module 462B. In another embodiment of all the variable capacitors 98A to 98G described in the application capacitance range and granularity may be varied as function of corrections needed to maintain the associated AW modules 80A to 80G nominal resonant and anti-resonant frequencies within acceptable tolerances. The corrections may be known or calculated based on the AW modules 80A to 80G known manufacturing and operating temperature variants and output impedance compensation conditions.

FIG. 30A is a simplified block diagram of a signal filter architecture according to various embodiments. As shown in FIG. 30A signal filter architecture 480A includes a source 92A, a resistor 94A, a signal processing module 482A, and a resistor 94B. The resistor 94A may represent the input load generated by the signal 92A. The signal processing module 482A may modify or filter the source signal 92A in a desired or predetermined way. The second resistor 94B may represent the load at an output including at an antenna. As noted, a differential between the target/designed load or impedance 94A on the input node or the target/designed load 94B on the output node of a filter module 480A may affect its performance. It is noted that the loads 94A, 94B may have real and imaginary components in an embodiment (x+jy) where x is the real component and y is the imaginary component.

As noted, the ratio between loads or impedance 94A, 94B is related to the Voltage Standing Wave Ratio (VSWR) for the module 480A where a module 480A may be configured for a common VSWR of 1:1 (where the input impedance 94A is about equal to the output impedance 94B). For a filter module 482A configured for a VSWR of 1:1 an input-output mismatch (VSWR other than 1:1) may increase an input signal 92A insertion loss (greater filter passband loss).

FIG. 30B is a simplified block diagram of an impedance matched ("IM") signal filter architecture 480B according to various embodiments. Architecture 480B includes a signal source 92A, a resistor 94A, a signal processing module 482A, a resistor 94B, and an impedance match ("IM") module 484A. In an embodiment, the IM module 484A may include one or more components that are selected or configured to provide a real or imaginary impedance balance, modification, or modulation between input and output impedance for architecture 480A. In an embodiment, the IM module response or modulation may vary by frequency and thus be tuned for a range or ranges of desired frequencies such as when frequency variable components are employed in an IM module 484A such as shown FIG. 30C.

FIG. 30C is a simplified block diagram of an impedance matched ("IM") signal filter architecture 480C including an IM module 484C according to various embodiments. As shown in FIG. 30C, architecture 480C includes a signal source 92A, a resistor 94A, a signal processing module 482A, a resistor 94B, and an impedance match ("IM") module 484C. In an embodiment, a IM module 484C may include one or more frequency variant components that are selected or configured to provide a real or imaginary impedance balance, modification, or modulation between input and output impedance for architecture 480C. In an embodiment, the IM module 484C may include an L-shaped resonator circuit. The module 484C may include an inductor 86J coupled serially between the signal processing module (SPM) 482A and the resistor 94B. The module 484C may further include a capacitor 82J coupled between the inductor 86J and resistor 94B and ground.

The resultant L-C circuit formed by the inductor 86J and the capacitor 82J may provide balancing impedance between the source 94A and output port 94B. As a function of the inductance and capacitance of the inductor 86J and capacitor 82J and loads 94A, 94B, the L-C circuit of module 484C may balance the impedance 94A, 94B at or about predetermined frequenc(ies). When the input impedance 94A is about 50 ohms and the output impedance 94B is about 100 ohms, the VSWR may be about 1:2 causing about a 6 dB insertion loss for an input signal 92A. In an embodiment, the inductance and capacitance of the inductor 86J and capacitor 82J may be about 9.406 µH (micro-Henries) and 1.881 pF (pico-Farads). In such an embodiment, the IMM 484C may provide an impedance of about 50 ohms about a frequency of 846 MHz. In this embodiment, the IMM 484C may balance the source and output impedance so the VSWR is about 1:1 and the input signal insertion loss about 2 dB.

It is noted that the inductor 86J may consume substantial real estate and lower the quality (Q) of architecture 480C due to its substantial inductance. In an embodiment, it may be desirable to balance architecture impedance while not employing a large inductor as in an L-C resonator circuit shown in FIG. 30C or variants thereof including T-networks (484N in FIG. 30T). FIG. 30D is a simplified block diagram of IM signal filter architecture 480D including an IMM 484D. Similar to architecture 480C, architecture 480D includes a signal source 92A, an input load or impedance modeled by resistor 94A, a SPM 482, an IMM 484D, and an output load or impedance represented by resistor 94B (such as an antenna impedance in an embodiment). In an embodiment, the IMM 484D may include an acoustic wave module (AWM) 490A, a pre-impedance match component module (pre-IMCM) 491A, and a post-impedance match component module (post-IMCM) 492A. The AWM 490A may be a single acoustic wave device or a plurality of devices and variable capacitors in various configurations as shown and described above.

Figure 30F:
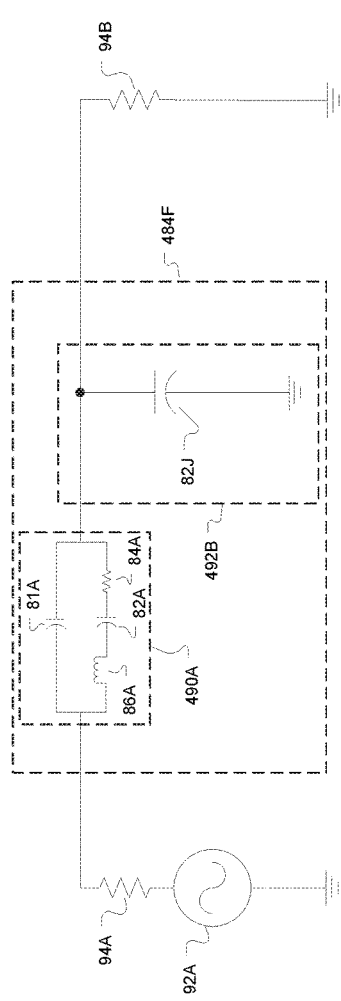
FIG. 30F is a simplified block diagram of IM architecture including an acoustic wave module (AWM) and matching components module (MCM) according to various embodiments.

In an embodiment, a post-IMCM 492A may include one or more components configured along with the AWM 490A to create a balancing impedance between 94A and 94B, such as 492B in FIG. 30F, 492C in FIGS. 30I, and 492D in FIG. 30R. Similarly, a pre-IMCM 491A may include one or more components configured along with the AWM 490A to create a balancing impedance (real and imaginary) between 94A and 94B, such as 492B in FIG. 30L and 492C in FIG. 30O. In an embodiment, one or more components of a post-IMCM 492A may be configured to resonate with an AWM 490A to add impedance to architecture 480D, i.e., when impedance of 94B>94A. In an embodiment, one or more components of a pre-IMCM 491A may be configured to resonate with an AWM 490A to reduce the impedance of architecture 480D, i.e., when impedance of 94A>94B.

In other embodiments, an IMM's 484D pre-IMCM 491A and post-IMCM 492A may both include one or more components configured to interact or resonate with the AWM 490A to affect architecture 480D input/output impedance ratios or VSWR. In an embodiment, the AWM 490A of a IMM 484D may be configured to filter an input signal 92A in addition to resonating with one or more components of a pre-IMCM 491A or post-IMCM 492A to modulate or modify the impedance ratio of architecture 480D for various frequencies. As a function of the pre-IMCM 491A and post-IMCM 492A components the resonate frequency, $f_r$, and the anti-resonance $f_a$ of the AWM 490A may be shifted or modified in a predetermined and configurable manner. In particular, the AWM nominal resonate frequency, $f_r$, and the anti-resonance $f_a$ may be selected based on the known shift of these frequencies due to the interaction with components of a pre-IMCM 491A or post-IMCM 492A.

FIG. 30E is a simplified block diagram of IM architecture 480E including an IMM 484D according to various embodiments. Similar to architecture 480D, architecture 480E includes a signal source 92A, an input load or impedance modeled by resistor 94A, an IMM 484D, and an output load or impedance represented by resistor 94B (such as an antenna impedance in an embodiment). In an embodiment, the IMM may include an acoustic wave module (AWM) 490A, a pre-impedance match component module (pre-IMCM) 491A, and a post-impedance match component module (post-IMCM) 492A. The AWM 490A may be a single acoustic wave device or a plurality of devices and variable capacitors in various configurations as shown and described above. Architecture 480E may not include a SPM 482 as shown in FIG. 30D. It is noted that an IMM 484D of the present invention may be employed in various networks or architecture to modify the architecture impedance ratio in a known or desired way.

FIG. 30F is a simplified block diagram of IM architecture 480F including an IMM 484F according to various embodiments. Similar to architecture 480E, architecture 480F includes a signal source 92A, an input load or impedance modeled by resistor 94A, an IMM 484F, and an output load or impedance modeled by resistor 94B. In an embodiment, the IMM 484F may include an acoustic wave module (AWM) 490A and a post-impedance match component module (post-IMCM) 492B. The AWM 490A may be a single acoustic wave device or a plurality of devices and variable capacitors in various configurations as shown and described above. In FIG. 30F, the AWM 490A is shown as a single AW device with representative electrical components or elements including capacitors 81A, 82A, inductor 86A, and resistor 84A, the capacitors 81A, 82A having capacitance Cr and Cm, respectively, the inductor 86A inductance Lm, and resistor 84 resistance Rm.

In an embodiment, the IMM 484F may be configured to provide a balancing impedance to architecture 480F at a desired or target frequency. The IMM 484F may be configured to add impedance to architecture 480F when output impedance is greater than the input impedance. In IMM 484F, a capacitor 82J is coupled to ground and between the AWM 490A and the output load 94B to form a resonator circuit with the AWM 490A, the resonator circuit having a desired impedance at desired frequency $f_{r'}$. The AWM 490A may be configured to have a nominal frequency $f_r$ that is shifted to resonate at $f_{r'}$ by the capacitor 82J where the capacitor 82J effectively borrows inductance L (represented by inductor 86J in FIGS. 30G and 30H) from the AWM 490A to resonate at the desired frequency $f_{r'}$ and provide the desired impedance at that the desired frequency $f_{r'}$.

Figure 30G:
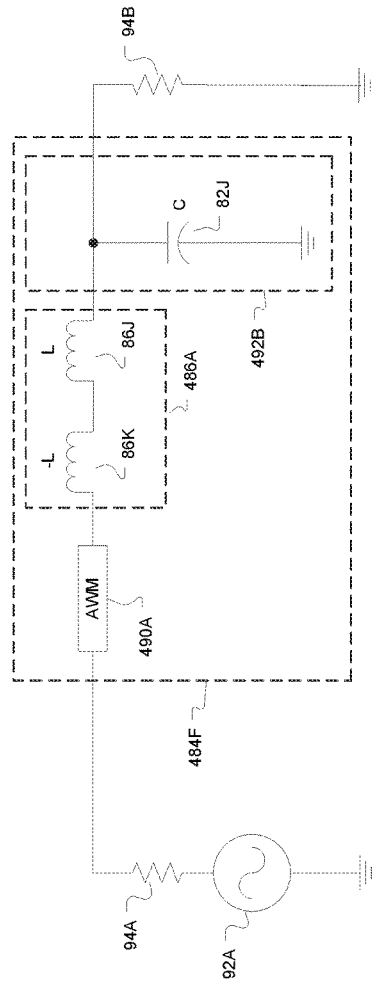
FIG. 30G is a simplified block diagram of IM architecture including an acoustic wave module (AWM) and matching components module (MCM) showing effective components according to various embodiments.
Figure 30H:
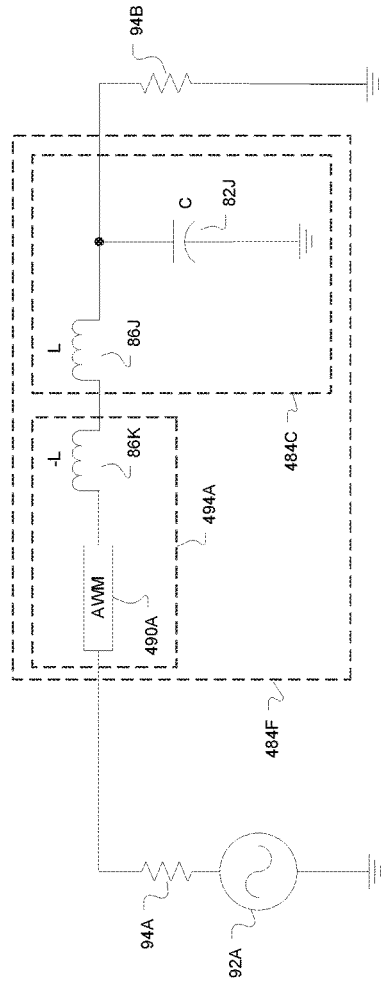
FIG. 30H is a simplified block diagram of IM architecture including an acoustic wave module (AWM) and matching components module (MCM) showing redistributed effective components according to various embodiments.

As shown in FIG. 30H, the AWM 490A provides an inductor 86J having inductance L to the L-C module 484C. The AWM 490A is then effectively coupled to an inductor 86K with inductance -L forming the modified AWM 494A (balanced inductance as shown by module 486A in FIG. 30G). In FIG. 30G, the balanced inductor pair module 486A includes an inductor 86K having inductance -L and an inductor 86J having inductance L. The module 486A represents the effect of the AWM 490A losing inductance L (inductor 86K) to the capacitor 82J so the capacitor 82J and effective inductor 86J having inductance L form a desired resonator module 484C. The balanced inductor pair module 486A represents the net effect of capacitor 82J resonating with AWM 490A: the AWM 490A providing inductance L to resonate with the capacitor 82J (L-C module 484C of FIG. 30H), while the AWM 490A losses inductance L. The AWM 490A resonance may be adjusted accordingly (based on modified AWM 494A of FIG. 30H).

Using the values Cr, Cm, Lm, and Rm for first capacitor 82A, inductor 86A, second capacitor 82B, and resistor 84A, a AWM's 490A nominal resonance frequency $f_r$ may be defined by the following equation:

$$f_r \equiv \frac{1}{2\pi\sqrt{L_m C_m}}.$$

In an embodiment, the capacitance of Cr is modified so the modified resonator 494A (with -L) resonates at $f_{r'}$. Cr may be determined when $$w_r'^2 > \frac{Lm}{L}(w_r'^2 - w_r^2) \text{ and } f_{r'} > f_r, \text{ then } Cr = \frac{L \cdot w_r'^2 + Lm \cdot (w_r'^2 - w_r^2)}{L \cdot Lm \cdot w_r'^2 \cdot (w_r'^2 - w_r^2)}.$$

Accordingly based on desired effective L-R module 484C having impedance at $f_{r'}$, a AWM 490A may be configured to provide inductance L and resonate at $f_{r'}$.

In an embodiment, IMM 484F may be configured to balance an input impedance 94A of about 50 ohms with an output impedance 94B about 100 ohms for a frequency $f_{r'}$ of 846 MHz. Similar to the capacitor 82J of L-C module 484C of FIG. 30C, capacitor 82J may have a capacitance of about 1.881 pF (pico-Farads). In the L-C module 484C of FIG. 30C, the inductor 86J had an inductance of about 9.406 nH (nano-Henries) where the L-C module 484C provided the desired impedance at 846 MHz. Accordingly the AWM 490A may be provide an effective inductance of 9.406 nH (nano-Henries) to the L-C module 484C shown in FIG. 30H and lose the same inductance to form the modified AWM 494A shown in FIG. 30H. In an embodiment, Lm may be about 100 nH (nano-Henries) and Cm may be about 0.3713 pF (pico-Farads). Using the equation for Cr above, Cr may be about 3.813 pF (pico-Farads) where the AWM 490A has a nominal frequency of 826 MHz.

Figure 31A:
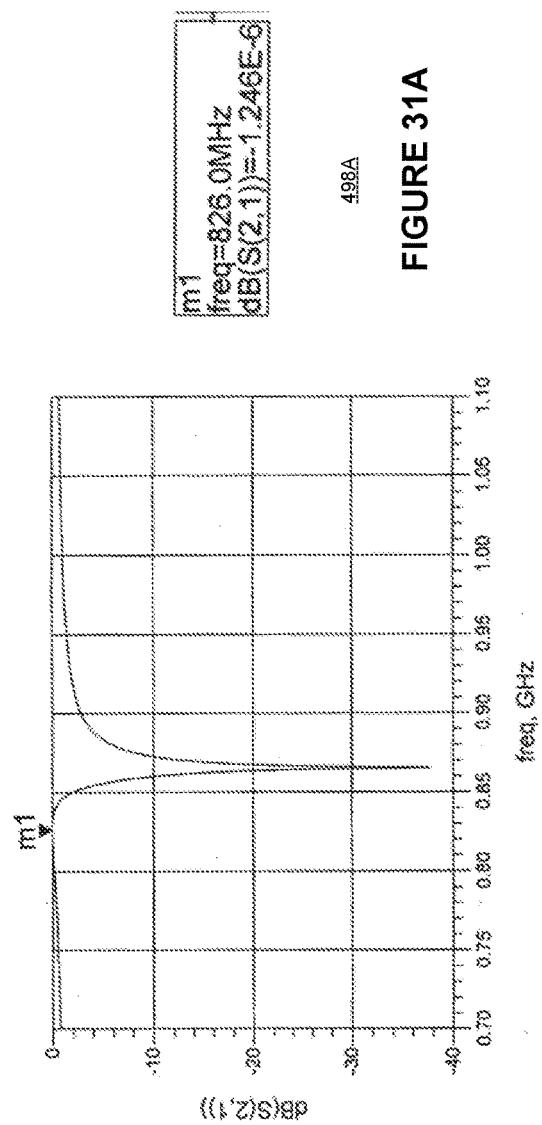
FIG. 31A-C are diagrams of frequency responses for various modules according to various embodiments.
Figure 31B:
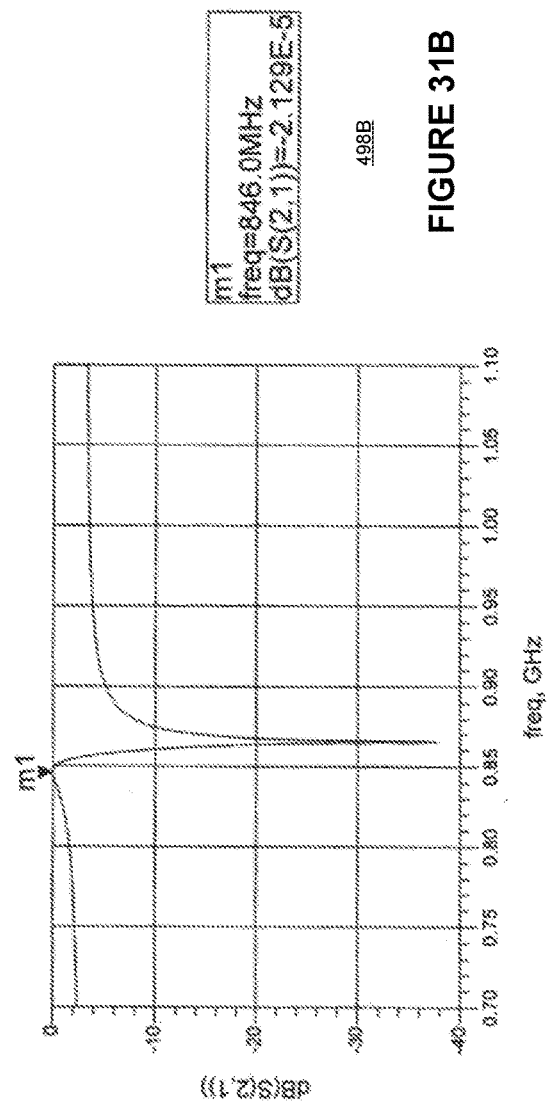

The IMM 484F may provide an impedance of about 50 ohms about a frequency of 846 MHz. In this embodiment, the IMM 484F may balance the source and output impedance so the VSWR is about 1:1 and the input signal insertion loss is nominal as shown in the frequency response graph 498B in FIG. 31B. FIG. 31B is a frequency response graph 498A of the AWM 490A alone with a balanced load applied to the AWM 490A. As shown in FIG. 31A, the AWM 490A has a nominal resonate frequency $f_r$ of about 826 MHz. When the AWM 490A is coupled with the capacitor 82J in architecture 480F having an unbalanced input-output impedance, (1:2), the IMM 484F (AWM 490A and capacitor 82J) may combine to have a resonate frequency $f_{r'}$ of about 846 MHz as shown in FIG. 31B. As shown in Table 1 different AWM and capacitances for capacitor 82J may be employed to achieve a resonate frequency of about 836 MHz and various impedances (resistance from about 82 ohms to 413 ohms.)

TABLE 1

| Fr MHz | Fa MHz | F'r MHz | Lm n-H | Cm p-F | Cr p-F | L n-H | C p-F | R Ohms | Q |
|---|---|---|---|---|---|---|---|---|---|
| 750 | 800 | 836 | 30 | 1.501 | 10.89 | 7.704 | 1.862 | 82.75 | 0.8 |
| 750 | 800 | 836 | 60 | 0.7501 | 5.447 | 15.41 | 1.702 | 181.01 | 1.6 |
| 750 | 800 | 836 | 100 | 0.4503 | 3.268 | 25.68 | 1.241 | 413.93 | 2.4 |

Other components may be coupled with an AWM in an embodiment for various desired impedance matches at various desired resonate frequencies. FIG. 30I is a simplified block diagram of IM architecture 480I including an IMM 484G according to various embodiments. Similar to architecture 480F, architecture 480I includes a signal source 92A, an input load or impedance modeled by resistor 94A, an IMM 484G, and an output load or impedance modeled by resistor 94B. In an embodiment, the IMM 484G may include an acoustic wave module (AWM) 490B and a post-impedance match component module (post-IMCM) 492C. The AWM 490B may be a single acoustic wave device or a plurality of devices and variable capacitors in various configurations as shown and described above. As shown in FIG. 30F, the AWM 490B may be described with representative electrical components or elements including capacitors 81A, 82A, inductor 86A, and resistor 84A, the capacitors 81A, 82A having capacitance Cr and Cm, respectively, the inductor 86A inductance Lm, and resistor 84 resistance Rm.

In an embodiment, the IMM 484G may be configured to provide a balancing impedance to architecture 480I at a desired or target frequency. The IMM 484G may be configured to add impedance to architecture 480G when output impedance is greater than the input impedance. In IMM 484G, an inductor 86L is coupled to ground and between the AWM 490B and the output load 94B to form a resonator circuit with the AWM 490B, the resonator circuit having a desired impedance at desired frequency $f_{r'}$. The AWM 490B may be configured to have a nominal frequency $f_r$ that is shifted to resonate at $f_{r'}$ by the inductor 86L where the inductor 86L effectively borrows capacitance C (represented by capacitor 82K in FIGS. 30J and 30K) from the AWM 490B to resonate at the desired frequency $f_r$, and provide the desired impedance at that the desired frequency $f_r$.

As shown in FIG. 30I, the AWM 490B provides a capacitor 82K having capacitance C to the L-C module 484H. The AWM 490B is then effectively coupled to a capacitor 82L with capacitance −C forming the modified AWM 494B (balanced capacitance is shown by module 486B in FIG. 30J). In FIG. 30J, the balanced capacitor pair module 486B includes a capacitor 82K having capacitance −C and a capacitor 82L having capacitance −C. The module 486B represents the effect of the AWM 490B losing capacitance C (capacitor 82K) to the inductor 86L so the inductor 86L and effective capacitor 82K having capacitance C form a desired resonator module 484G. The balanced capacitor pair module 486B represents the net effect of inductor 86L resonating with AWM 490B: the AWM 490B providing capacitance C to resonate with the inductor 86L (L-C module 484H of FIG. 30K), while the AWM 490B losses capacitance C. The AWM 490B resonance may be adjusted accordingly (based on modified AWM 494B of FIG. 30K).

In an embodiment, IMM 484G may be configured to balance an input impedance 94A of about 50 ohms with an output impedance 94B about 414 ohms for a frequency $f_r$, of 846 MHz. The inductor 89L may have an inductance of about 29.21 nH. The capacitor 82K may have an effective capacitance of about 1.411 pF and the capacitor 82L may have an effective capacitance of about −1.411 pF. Accordingly, the AWM 490A may provide an effective capacitance of about 1.411 pF to the L-C module 484H shown in FIG. 30K and lose the same capacitance to form the modified AWM 494B shown in FIG. 30K. In an embodiment, Lm may be about 100 nH (nano-Henries), Cm may be about 0.4503 pF (pico-Farads), and Cr may be about 3.268 pF (pico-Farads).

Figure 31C:
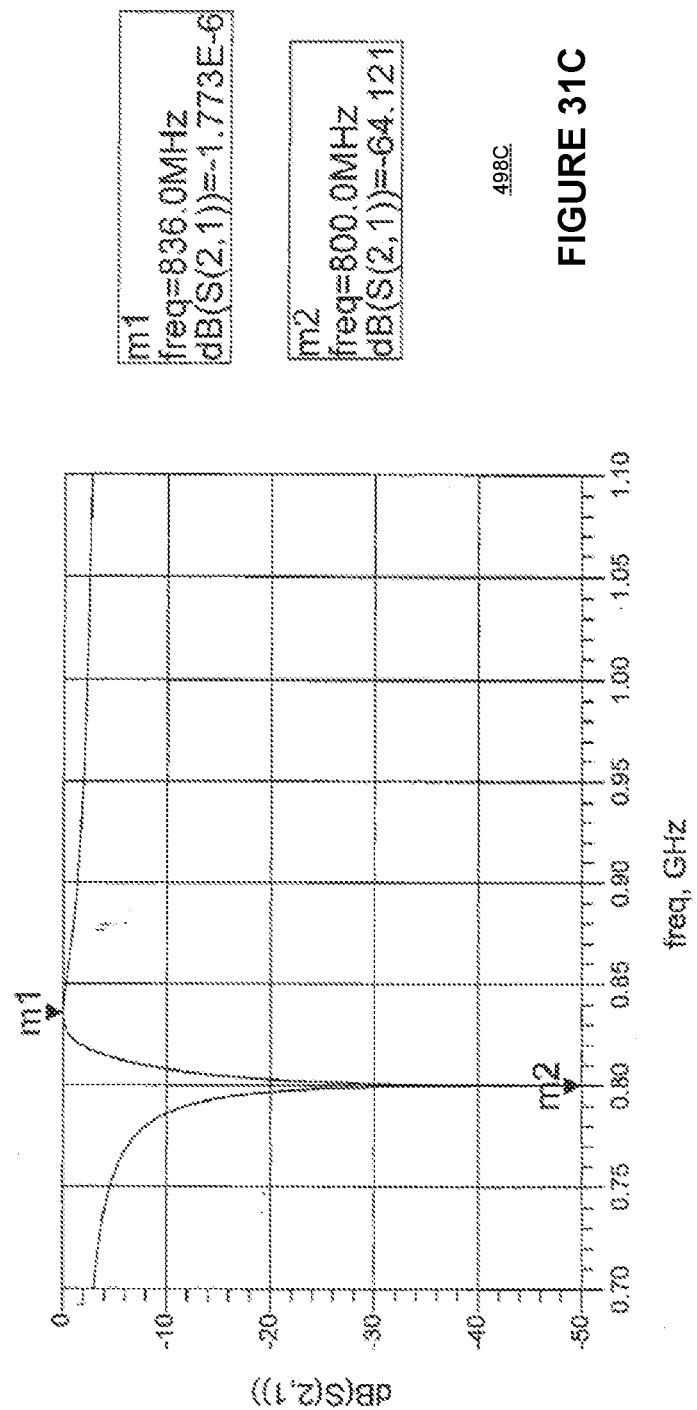

The IMM 484G may provide an impedance of about 364 ohms about a frequency of 836 MHz. In this embodiment, the IMM 484G may balance the source and output impedance so the VSWR is about 1:1 and the input signal insertion loss is nominal as shown in the frequency response graph 498C in FIG. 31C. When the AWM 490B is coupled with the inductor 86L in architecture 480I, the IMM 484G (AWM 490B and inductor 86L) combine to have a resonate frequency $f_r$, of about 836 MHz as shown in FIG. 31C.

FIGS. 30L to 30N are simplified diagrams of another embodiment 480L that includes an IMM 484I. Similar to architecture 480F, architecture 480L includes a signal source 92A, an input load or impedance modeled by resistor 94A, an IMM 484I, and an output load or impedance modeled by resistor 94B. In an embodiment, the IMM 484I may include an acoustic wave module (AWM) 490A and a pre-impedance match component module (pre-IMCM) 491B. The AWM 490A may be a single acoustic wave device or a plurality of devices and variable capacitors in various configurations as shown and described above. In FIGS. 30L-30N, the AWM 490A is shown as a single AW device but may be represented by electrical components or elements including capacitors 81A, 82A, inductor 86A, and resistor 84A, the capacitors 81A, 82A having capacitance Cr and Cm, respectively, the inductor 86A inductance Lm, and resistor 84 resistance Rm.

In an embodiment, the IMM 484I may be configured to provide a balancing impedance to architecture 480L at a desired or target frequency. The IMM 484I may be configured to remove impedance from architecture 480L when output impedance is less than the input impedance. In IMM 484I, a capacitor 82J is coupled to ground and between the AWM 490A and the input load 94A to form a resonator circuit with the AWM 490A, the resonator circuit having a desired impedance at desired frequency $f_r$. The AWM 490A may be configured to have a nominal frequency $f_r$, that is shifted to resonate at $f_r$, by the capacitor 82J where the capacitor 82J effectively borrows inductance L (represented by inductor 86J in FIGS. 30M and 30N) from the AWM 490A to resonate at the desired frequency $f_r$, and provide the desired impedance at that the desired frequency $f_r$. As shown in FIG. 30N, the AWM 490A provides an inductor 86J having inductance L to the L-C module 484J. The AWM 490A is then effectively coupled to an inductor 86K with inductance −L forming the modified AWM 494C (balanced inductance as shown by module 486C in FIG. 30M).

Figure 30O:
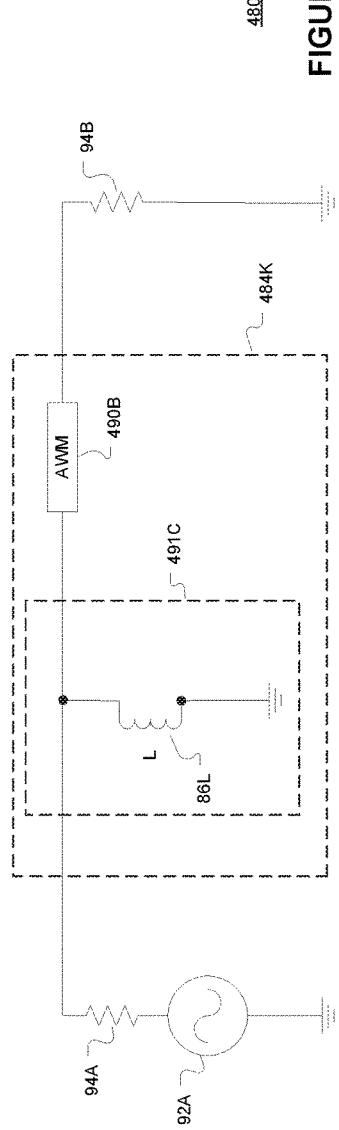
FIG. 30O is a simplified block diagram of IM architecture including an acoustic wave module (AWM) and matching components module (MCM) according to various embodiments.
Figure 30P:
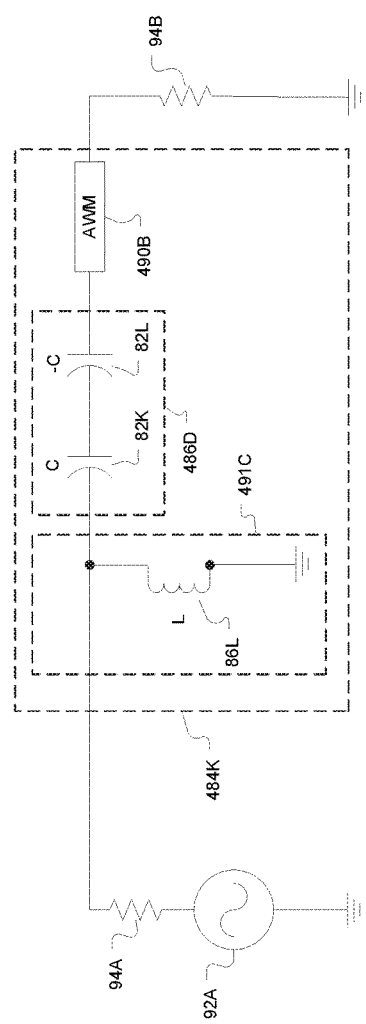
FIG. 30P is a simplified block diagram of IM architecture including an acoustic wave module (AWM) and matching components module (MCM) showing effective components according to various embodiments.
Figure 30Q:
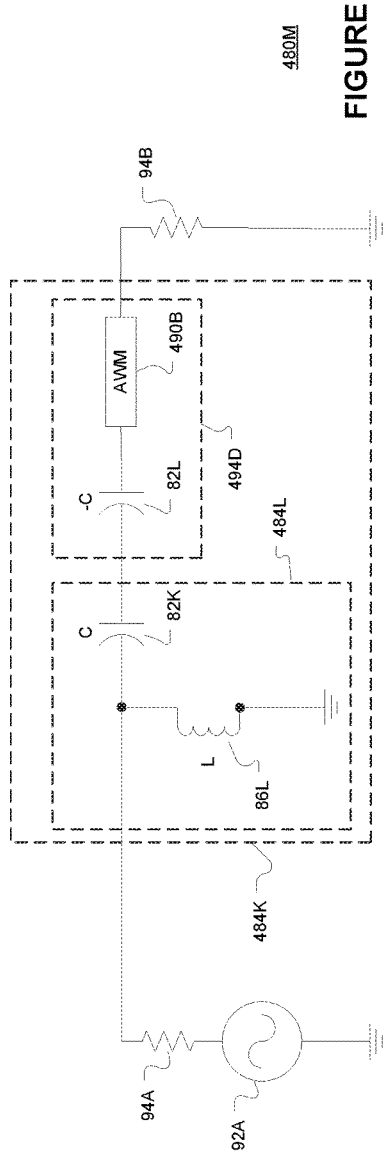
FIG. 30Q is a simplified block diagram of IM architecture including an acoustic wave module (AWM) and matching components module (MCM) showing redistributed effective components according to various embodiments.

FIGS. 30O to 30Q are simplified diagrams of another embodiment 480M that includes an IMM 484K. Similar to architecture 480L, architecture 480M includes a signal source 92A, an input load or impedance modeled by resistor 94A, an IMM 484K, and an output load or impedance modeled by resistor 94B. In an embodiment, the IMM 484K may include an acoustic wave module (AWM) 490B and a pre-impedance match component module (pre-IMCM) 491C. The AWM 490B may be a single acoustic wave device or a plurality of devices and variable capacitors in various configurations as shown and described above. In FIGS. 30O-30Q, the AWM 490B is shown as a single AW device but may be represented by electrical components or elements including capacitors 81A, 82A, inductor 86A, and resistor 84A, the capacitors 81A, 82A having capacitance Cr and Cm, respectively, the inductor 86A inductance Lm, and resistor 84 resistance Rm.

In an embodiment, the IMM 484K may be configured to provide a balancing impedance to architecture 480M at a desired or target frequency. The IMM 484K may be configured to remove impedance from architecture 480M when output impedance is less than the input impedance. In IMM 484K, an inductor 86L is coupled to ground and between the AWM 490B and the input load 94A to form a resonator circuit with the AWM 490B, the resonator circuit having a desired impedance at desired frequency $f_r$. The AWM 490B may be configured to have a nominal frequency $f_r$, that is shifted to resonate at $f_r$, by the inductor 86L where the inductor 86L effectively borrows capacitance C (represented by capacitor 82K in FIGS. 30M and 30N) from the AWM 490B to resonate at the desired frequency $f_r$, and provide the desired impedance at that the desired frequency $f_r$. As shown in FIG. 30Q, the AWM 490B may provide a capacitor 82K having capacitance C to the L-C module 484L. The AWM 490B is then effectively coupled to a capacitor 82L with capacitance −C forming the modified AWM 494D (balanced capacitance as shown by module 486D in FIG. 30P).

FIGS. 30R to 30T are simplified diagrams of another embodiment 480N that includes an IMM 484M. Similar to architecture 480F, architecture 480N includes a signal source 92A, an input load or impedance modeled by resistor 94A, an IMM 484M, and an output load or impedance modeled by resistor 94B. In an embodiment, the IMM 484M may include an acoustic wave module (AWM) 490A and a post-impedance match component module (post-IMCM) 492D. The AWM 490A may be a single acoustic wave device or a plurality of devices and variable capacitors in various configurations as shown and described above. In FIGS. 30R-30T, the AWM 490A is shown as a single AW device but may be represented by electrical components or elements including capacitors 81A, 82A, inductor 86A, and resistor 84A, the capacitors 81A, 82A having capacitance Cr and Cm, respectively, the inductor 86A inductance Lm, and resistor 84 resistance Rm.

In an embodiment, the IMM 484M may be configured to provide a balancing impedance to architecture 480N at a desired or target frequency. The IMM 484M may be configured to add impedance to architecture 480N when output impedance is greater than the input impedance. In IMM 484M, the post-IMCM 492D includes a capacitor 82J and inductor 86N. The capacitor 82J is coupled to ground and between the AWM 490A and the inductor 86N. The inductor 86N is coupled between the AWM 490A and the output load 94B. The post-IMCM 492D forms a T-shaped resonator circuit with the AWM 490A, the resonator circuit having a desired impedance at desired frequency $f_{r'}$. The AWM 490A may be configured to have a nominal frequency $f_r$ that is shifted to resonate at $f_{r'}$ by the capacitor 82J where the capacitor 82J effectively borrows inductance L (represented by inductor 86J in FIGS. 30S and 30T) from the AWM 490A to resonate at the desired frequency $f_{r'}$ and provides the desired impedance at that the desired frequency $f_{r'}$. As shown in FIG. 30T, the AWM 490A provides an inductor 86J having inductance L to the L-C-L T-shaped resonator module 484N. The AWM 490A is then effectively coupled to an inductor 86K with inductance −L forming the modified AWM 494A (balanced inductance as shown by module 486A in FIG. 30S).

FIG. 30U is a simplified diagram of another embodiment 480O that includes an IMM 484N. Similar to architecture 480F, architecture 480O includes a signal source 92A, an input load or impedance modeled by resistor 94A, an IMM 484N, and an output load or impedance modeled by resistor 94B. In an embodiment, the IMM 484N may include an acoustic wave module (AWM) 490A coupled in parallel with a variable capacitor 98A, and a post-impedance match component module (post-IMCM) 492D. The variable capacitor 98A may modify the capacitance of Cr and may be used to modify the impedance or resonate or anti-resonate of the AWM 490A and thus the IMM 484N.

FIG. 30V is a simplified diagram of another embodiment 480P that includes an IMM 484O. Similar to architecture 480F, architecture 480P includes a signal source 92A, an input load or impedance modeled by resistor 94A, an IMM 484N, and an output load or impedance modeled by resistor 94B. In an embodiment, the IMM 484N may include an acoustic wave module (AWM) 490A and a post-impedance match component module (post-IMCM) 492D. The IMM 484O may be configured to add impedance to architecture 480P when output impedance is greater than the input impedance. In IMM 484O, the post-IMCM 492D may include a variable capacitor 98C. The variable capacitor 98C is coupled to ground and between the AWM 490A and the output load 94B. By varying the capacitor 98C capacitance, the borrowed inductance from the AWM 490A may also vary. Similarly the resonant frequency $f_{r'}$ and impedance may also vary. The variable capacitor 98C may be used to tune the IMM 484O resonant frequency and impedance in an embodiment.

FIG. 30W is a simplified diagram of another embodiment 480Q that includes an IMM 484P. Similar to architecture 480N, architecture 480O includes a signal source 92A, an input load or impedance modeled by resistor 94A, an IMM 484P, and an output load or impedance modeled by resistor 94B. As noted, the input load and output load 94A, 94B may include real and imaginary components. In an embodiment, the IMM 484M may include a first acoustic wave module (AWM) 490A coupled between the loads 94A, 94B and a second acoustic wave module (AWM) 490B coupled between the first AWM 490A and load 94B at one end and ground at the other.

The AWM 490A and AWM 490B may be single acoustic wave devices or a plurality of devices and variable capacitors in various configurations as shown and described above. In an embodiment, the IMM 484P may be configured to provide a balancing impedance to architecture 480N at a desired or target frequency. The IMM 484P may be configured to add impedance to architecture 480Q when output impedance is not equal to the input impedance. As noted, input and output impedance 94A, 94B may include a real and imaginary imbalance. As shown in FIG. 30W, the first AWM 490A may provide an effective inductor 86J with inductance L. The inductance L may balance a real load difference between the input and output loads 94A, 94B and may balance an imaginary load differential. The borrowed inductance L via inductor 86J may shift the effective inductance of the AWM 490A by −L (86K) as represented by the block 486A.

Similarly, the second AWM 490B may provide an effective capacitor 82J with capacitance C. The capacitance C may balance a real load difference between the input and output loads 94A, 94B and may balance an imaginary load differential. The borrowed capacitance C from capacitor 82J may shift the effective capacitance of the AWM 490A by −C (82K) as represented by the block 487A. In an embodiment, the AWM 490A and AWM 490B may be selected to have a desired frequency response based on the borrowed or shifted inductance (AWM 490A) or capacitance (AWM 490B), the effect on a resonant or anti-resonant frequency of the AWM 490A, 490B due to the borrowed inductance or capacitance. For example, the AWM 490A be configured to have a nominal frequency $f_r$ that is shifted to resonate at $f_{r'}$ by the inductor 86J.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A filter module, including:
    a first switchable pass-band and tunable rejection band filter module, comprising:
        a first acoustic wave resonator (AWR);
        a first switch coupled serially to the first AWR wherein the first AWR is inoperative when the first switch is opened and active when the first switch is closed, the first AWR having a resonant frequency (RFA1) and an anti-resonant frequency (AFA1);
        a second AWR;
        a second switch coupled serially to the second AWR, wherein:
            (a) the second AWR is inoperative when the second switch is opened and active when the second switch is closed;
            (b) a combination of the first switch and first AWR is coupled in parallel to a combination of the second switch and second AWR;
            (c) the second AWR has a resonate frequency (RFA2) and an anti-resonate frequency (AFA2), wherein the RFA1 and RFA2 are offset in frequency; and
        a first variable capacitor coupled in parallel with the combination of the first switch and the first AWR, the first variable capacitor configured to vary at least one of the AFA1 and the AFA2 thereby configuring the first switchable pass-band and tunable rejection band filter module; and
    a tunable filter module, comprising:
        a third AWR, the third AWR coupled to the first AWR and the second AWR, the third AWR configured to filter electrical signals and having a resonate frequency (RFA3) and an anti-resonate frequency (AFA3); and
        a second variable capacitor configured to vary the AFA3 thereby configuring the tunable filter module.

2. The filter module of claim 1, wherein the RFA1 has a frequency shift greater than 5% of the RFA1 frequency magnitude.

3. The filter module of claim 1, the combination of the first AWR and the third AWR forming a first filter when the first switch is closed and the second switch is open and the combination of the second AWR and the third AWR forming a second filter when the first switch is open and the second switch is closed.

4. The filter module of claim 1, further comprising an inversion module coupled to the first switchable pass-band and tunable rejection band filter module.

5. The filter module of claim 4, wherein the inversion module comprises a K-filter.

6. The filter module of claim 5, wherein the K-filter comprises two capacitor in series and third capacitor in parallel.

7. The filter module of claim 4, further comprising a second switchable pass-band and tunable rejection band filter module connected to the first switchable pass-band and tunable rejection band filter module via the inversion module.

8. The filter module of claim 7, wherein the second switchable pass-band and tunable rejection band filter module comprises:
    a fourth acoustic wave resonator (AWR);
    a third switch coupled serially to the fourth AWR wherein the fourth AWR is inoperative when the third switch is opened and active when the third switch is closed, the fourth AWR having a resonant frequency (RFA4) and an anti-resonant frequency (AFA4);
    a fifth AWR;
    a fourth switch coupled serially to the fifth AWR;
    wherein:
        (a) the fifth AWR is inoperative when the fourth switch is opened and active when the fourth switch is closed;
        (b) a combination of the third switch and fourth AWR is coupled in parallel to a combination of the fourth switch and fifth AWR; and
        (c) the fifth AWR has a resonate frequency (RFA5) and an anti-resonate frequency (AFA5), wherein the RFA5 and RFA5 are offset in frequency.

9. The filter module of claim 8, further comprising a second variable capacitor coupled in parallel with the combination of the third switch and the fourth AWR, the second variable capacitor configured to vary at least one of the AFA4 and the AFA5 thereby configuring the second switchable pass-band and tunable rejection band filter module.

10. The filter module of claim 9, wherein each of the fourth and the fifth AWRs comprise two AWRs connected in parallel.

\* \* \* \* \*